(12) United States Patent  
Yoneda

(10) Patent No.: US 11,177,262 B2  
(45) Date of Patent: Nov. 16, 2021

(54) SEMICONDUCTOR DEVICE OR MEMORY DEVICE

(71) Applicant: Semiconductor Energy Laboratory Co., Ltd., Atsugi (JP)

(72) Inventor: Seiichi Yoneda, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/609,907

(22) PCT Filed: May 11, 2018

(86) PCT No.: PCT/IB2018/053278  
§ 371 (c)(1),  
(2) Date: Oct. 31, 2019

(87) PCT Pub. No.: WO2018/211378  
PCT Pub. Date: Nov. 22, 2018

(65) Prior Publication Data  
US 2020/0111790 A1    Apr. 9, 2020

(30) Foreign Application Priority Data

May 19, 2017    (JP) .............................. JP2017-099788

(51) Int. Cl.  
*H01L 27/1156*    (2017.01)  
*H01L 27/105*    (2006.01)  
(Continued)

(52) U.S. Cl.  
CPC ........ *H01L 27/1052* (2013.01); *H01L 27/124* (2013.01); *H01L 27/1207* (2013.01);  
(Continued)

(58) Field of Classification Search  
CPC ............. H01L 27/1052; H01L 27/1255; H01L 29/78648; H01L 27/1156  
See application file for complete search history.

(56) References Cited

U.S. PATENT DOCUMENTS

| 8,144,102 B2 | 3/2012 | Takatoku |
| 8,289,753 B2 | 10/2012 | Yamazaki et al. |

(Continued)

FOREIGN PATENT DOCUMENTS

| CN | 101414436 A | 4/2009 |
| CN | 103081092 A | 5/2013 |

(Continued)

OTHER PUBLICATIONS

International Search Report (Application No. PCT/IB2018/053278) dated Jul. 24, 2018.

(Continued)

*Primary Examiner* — Michele Fan  
(74) *Attorney, Agent, or Firm* — Robinson Intellectual Property Law Office; Eric J. Robinson

(57) ABSTRACT

A novel semiconductor device is provided. Alternatively a memory device which can retain more multi-level data is provided. One of a source or a drain of a write transistor is electrically connected to a bit line, and the other of the source or the drain of the write transistor is electrically connected to a data retaining portion. Data written to the data retaining portion is provided to the data retaining portion through a write bit line and the write transistor. Rising of a threshold voltage which is caused in a write operation can be inhibited and more multi-level data can be retained(stored) through electrically connecting a back gate of the write transistor to the write bit line.

10 Claims, 31 Drawing Sheets

(51) Int. Cl.
    *H01L 27/12*    (2006.01)
    *H01L 49/02*    (2006.01)
    *H01L 29/786*   (2006.01)
(52) U.S. Cl.
    CPC ...... *H01L 27/1225* (2013.01); *H01L 27/1255* (2013.01); *H01L 28/40* (2013.01); *H01L 29/7869* (2013.01)

(56) References Cited

U.S. PATENT DOCUMENTS

| | | | |
|---|---|---|---|
| 8,339,828 | B2 | 12/2012 | Yamazaki et al. |
| 8,363,452 | B2 | 1/2013 | Yamazaki et al. |
| 8,559,220 | B2 | 10/2013 | Yamazaki et al. |
| 8,588,000 | B2 | 11/2013 | Kamata |
| 8,614,916 | B2 | 12/2013 | Nagatsuka et al. |
| 8,737,109 | B2 | 5/2014 | Yamazaki et al. |
| 9,024,317 | B2 | 5/2015 | Endo et al. |
| 9,449,706 | B2 | 9/2016 | Yamazaki et al. |
| 9,472,293 | B2 | 10/2016 | Nagatsuka et al. |
| 9,734,914 | B2 | 8/2017 | Kamata |
| 9,735,179 | B2 | 8/2017 | Endo et al. |
| 9,847,406 | B2 | 12/2017 | Miyairi et al. |
| 9,990,997 | B2 | 6/2018 | Matsuzaki et al. |
| 10,037,808 | B2 | 7/2018 | Kamata |
| 10,115,741 | B2 * | 10/2018 | Matsuda ........... H01L 29/78648 |
| 10,204,925 | B2 | 2/2019 | Yoneda |
| 10,297,322 | B2 | 5/2019 | Yamazaki et al. |
| 2009/0102751 | A1 | 4/2009 | Takatoku |
| 2011/0128777 | A1 | 6/2011 | Yamazaki et al. |
| 2011/0286256 | A1 | 11/2011 | Kamata |
| 2012/0051118 | A1 | 3/2012 | Yamazaki et al. |
| 2012/0161139 | A1 | 6/2012 | Endo et al. |
| 2015/0054571 | A1 * | 2/2015 | Watanabe ............. H02M 3/073 327/536 |
| 2015/0084946 | A1 * | 3/2015 | Shim .................... G09G 3/3258 345/212 |
| 2017/0117283 | A1 * | 4/2017 | Matsuzaki ............ H01L 29/792 |
| 2018/0018918 | A1 * | 1/2018 | Miyake ................ G09G 3/3266 |
| 2018/0040274 | A1 * | 2/2018 | Kurokawa ........... G09G 3/3275 |
| 2018/0113564 | A1 * | 4/2018 | Takahashi ........... G09G 3/3225 |

FOREIGN PATENT DOCUMENTS

| | | |
|---|---|---|
| JP | 2009-099778 A | 5/2009 |
| JP | 2011-135065 A | 7/2011 |
| JP | 2012-004556 A | 1/2012 |
| JP | 2012-069932 A | 4/2012 |
| JP | 2012-146965 A | 8/2012 |
| JP | 2012-256400 A | 12/2012 |
| JP | 2014-199707 A | 10/2014 |
| KR | 2009-0039611 A | 4/2009 |
| KR | 2012-0073127 A | 7/2012 |
| KR | 2012-0094067 A | 8/2012 |
| KR | 2013-0107285 A | 10/2013 |
| WO | WO-2011/065258 | 6/2011 |
| WO | WO-2011/145738 | 11/2011 |
| WO | WO-2012/026503 | 3/2012 |

OTHER PUBLICATIONS

Written Opinion (Application No. PCT/IB2018/053278) dated Jul. 24, 2018.

* cited by examiner

SEMICONDUCTOR DEVICE OR MEMORY DEVICE

TECHNICAL FIELD

One embodiment of the present invention relates to a semiconductor device or a memory device.

Note that one embodiment of the present invention is not limited to the above technical field. One embodiment of the invention disclosed in this specification and the like relates to an object, a method, or a manufacturing method. Alternatively, one embodiment of the present invention disclosed in this specification and the like relates to a process, a machine, manufacture, or a composition of matter.

Note that in this specification and the like, a semiconductor device refers to a device that can function by utilizing semiconductor characteristics in general. In some cases, it can be said that a display device (a liquid crystal display device, a light-emitting display device, and the like), a projection device, a lighting device, an electro-optical device, a power storage device, a memory device, a semiconductor circuit, an imaging device, an electronic device, and the like are semiconductor devices. Alternatively, it can be said that they include a semiconductor device in some cases.

BACKGROUND ART

In recent years, electronic components such as central processing units (CPUs), memory devices, and sensors have been used in various electronic devices such as personal computers, smartphones, and digital cameras; the performance of the electronic components have been improved to achieve miniaturization, low power consumption, and other various objectives.

In particular, a recent increase in the amount of data manipulated requires a memory device having large storage capacity. Patent Document 1 and patent document 2 each disclose a semiconductor device that allows writing and reading of multi-level data.

PRIOR ART DOCUMENT

Patent Document

[Patent Document 1] Japanese Published Patent Application No. 2012-256400

[Patent Document 2] Japanese Published Patent Application No. 2014-199707

SUMMARY OF THE INVENTION

Problems to be Solved by the Invention

An object of one embodiment of the present invention is to provide a semiconductor device or a memory device that can retain multi-level data. Another object is to provide a semiconductor device or a memory device with large data retention capacity. Another object is to provide a semiconductor device or a memory device with favorable reliability. Another object is to provide a semiconductor device or a memory device with low power consumption. Another object is to provide a novel semiconductor device or a memory device. Another object is to provide an electronic device including the above-described semiconductor device or the above-described memory device.

Note that the descriptions of these objects do not preclude the existence of other objects. Note that one embodiment of the present invention does not necessarily achieve all the objects. Objects other than these will be apparent from and can be derived from the descriptions of the specification, the drawings, the claims, and the like.

Means for Solving the Problems

One of a source and a drain of a write transistor is electrically connected to a write bit line and the other is electrically connected to a data retaining portion. Data written to the data retaining portion is supplied to the data retaining portion through the write bit line and the write transistor. By electrically connecting a back gate of the write transistor with the write bit line, an increase in the threshold voltage caused in a write operation can be suppressed, and more multi-level data can be retained (stored).

One embodiment of the present invention is a semiconductor device comprising a first to a third transistor and a capacitor; the semiconductor device is characterized in that a gate of the first transistor is electrically connected to a first wiring, a back gate of the first transistor is electrically connected to a second wiring, one of a source or a drain of the first transistor is electrically connected to the second wiring, the other of the source or the drain of the first transistor is electrically connected to one electrode of the capacitor, the other electrode of the capacitor is electrically connected to a third wiring, a gate of the second transistor is electrically connected to the one electrode of the capacitor, a back gate of the second transistor is electrically connected to a fourth wiring, one of a source or a drain of the second transistor is electrically connected to the fourth wiring, the other of the source or the drain of the second transistor is electrically connected to one of a source or a drain of the third transistor, the other of the source or the drain of the third transistor is electrically connected to a fifth wiring, and a gate of the third transistor is electrically connected to a sixth wiring.

The gate of the third transistor may be electrically connected to a back gate of the third transistor. In the first to the third transistor, at least a semiconductor layer of the first transistor preferably includes oxide semiconductor.

The above semiconductor device can function as a memory element. The memory element and a driver circuit can constitute the memory device.

Effect of the Invention

According to one embodiment of the present invention, a semiconductor device or a memory device that can retain multi-level data can be provided. Alternatively, a semiconductor device or a memory device with large data retention capacity can be provided. Alternatively, a semiconductor device or a memory device with favorable reliability can be provided. Alternatively, a semiconductor device or a memory device with low power consumption can be provided. Alternatively, a novel semiconductor device or a memory device can be provided. Alternatively, an electronic device including the above-described semiconductor device or the above-described memory device can be provided.

Note that the descriptions of these effects do not preclude the existence of other effects. Note that one embodiment of the present invention does not necessarily have all of these effects. Effects other than these will be apparent from and can be derived from the descriptions of the specification, the drawings, the claims, and the like.

MODE FOR CARRYING OUT THE INVENTION

Figure 1A:
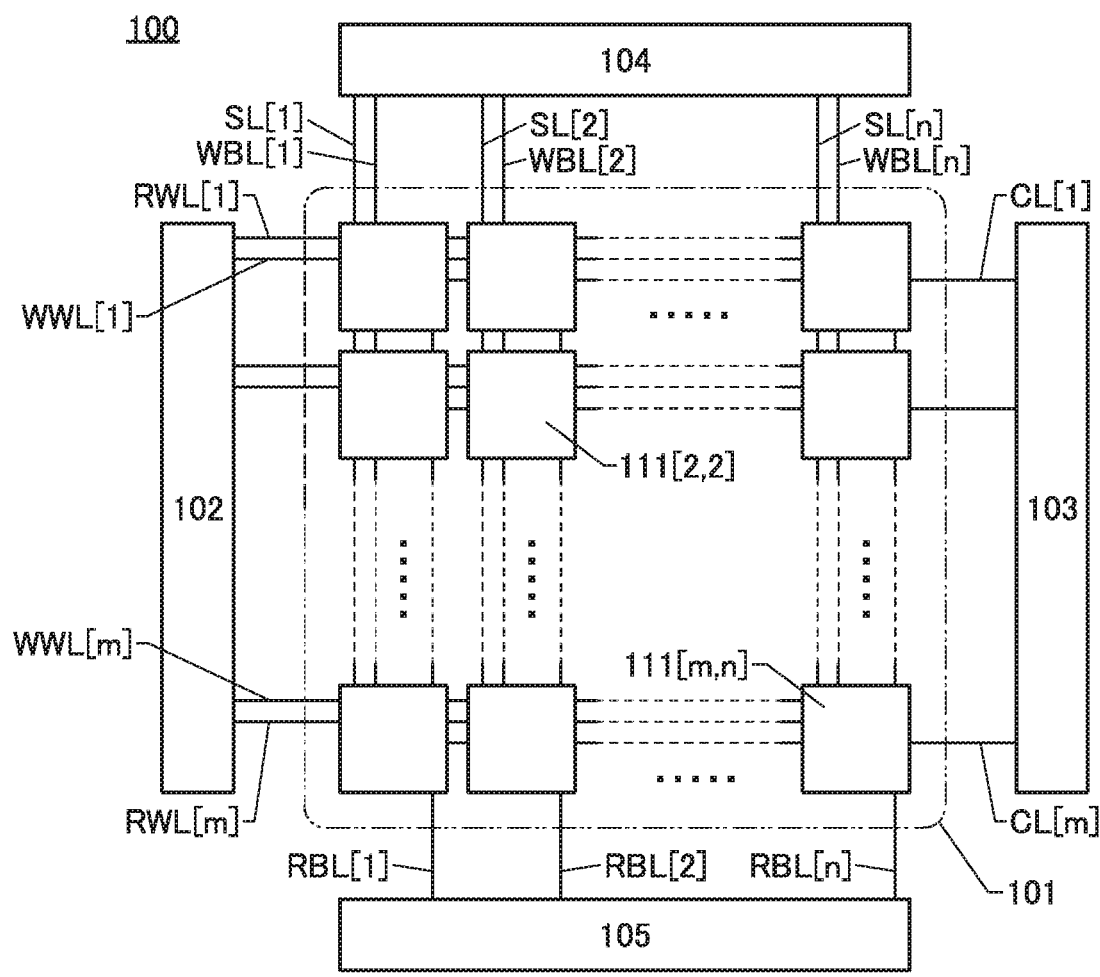
FIG. 1 Drawings illustrating a memory device.

Embodiments will be described in detail with reference to the drawings. Note that the present invention is not limited to the following descriptions, and it will be readily appreciated by those skilled in the art that the modes and details can be modified in various ways without departing from the spirit and the scope of the present invention. Thus, the present invention should not be construed as being limited to the descriptions in the following embodiments. Note that in the structures of the invention described below, the same portions or portions having similar functions are denoted by the same reference numerals in different drawings, and description thereof may be not repeated.

Furthermore, the position, size, range, and the like of each component illustrated in the drawings and the like do not represent the actual position, size, range, and the like in some cases for easy understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching; the unintentional reduction is not illustrated in some cases for easy understanding of the invention.

In particular, in a top view (also referred to as a "plan view"), a perspective view, or the like, illustration of some components may be omitted for easy understanding of the invention. Furthermore, some hidden lines and the like may not be shown.

Ordinal numbers such as "first" and "second" in this specification and the like are used in order to avoid confusion among components and do not denote the priority or the order such as the order of steps or the stacking order. Furthermore, a term that is not provided with an ordinal number in this specification and the like may be provided with an ordinal number in the scope of claims in order to avoid confusion among components. Furthermore, an ordinal number used in this specification and the like may be different from an ordinal number used in the scope of claims. Furthermore, even when a term is provided with an ordinal number in this specification and the like, the ordinal number may be omitted in the scope of claims and the like.

In this specification and the like, the term such as "electrode" or "wiring" does not limit a function of the component. For example, an "electrode" is used as part of a "wiring" in some cases, and vice versa. Furthermore, the term "electrode" or "wiring" also includes the case where a plurality of "electrodes" or "wirings" are formed in an integrated manner.

Note that the terms "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

Unless otherwise specified, in this specification and the like, a transistor is an element having at least three terminals including a gate (a gate terminal or a gate electrode), a source (a source terminal, a source region, or a source electrode), and a drain (a drain terminal, a drain region, or a drain electrode), or an element having at least four terminals including a back gate in addition to them (a back gate terminal or a back gate electrode). The transistor includes a channel formation region between a source and a drain, and can allow current to flow between the source and the drain through the channel formation region. Note that in this specification and the like, the channel formation region refers to a region through which current mainly flows.

Unless otherwise specified, transistors described in this specification and the like are enhancement mode (normally-off) field-effect transistors. Furthermore, unless otherwise specified, transistors described in this specification and the like are n-channel transistors. Thus, unless otherwise specified, the threshold voltage (also referred to as "$V_{th}$") is higher than 0 V.

Note that unless otherwise specified, $V_{th}$ of a transistor including a back gate in this specification and the like refers to $V_{th}$ obtained when the potential of the back gate is set equal to the potential of a source or a gate.

Unless otherwise specified, off-state current in this specification and the like refers to drain current (also referred to as "$I_d$") of a transistor in an off state (also referred to as a non-conducting state or a cutoff state). Unless otherwise specified, the off state of an n-channel transistor means that the potential difference (also referred to as a "gate voltage" or "$V_g$") between its gate and source is lower than the threshold voltage when the potential of the source is regarded as a reference potential, and the off state of a p-channel transistor means that $V_g$ is higher than the threshold voltage. For example, the off-state current of an n-channel transistor sometimes refers to drain current that flows when $V_g$ is lower than $V_{th}$.

The off-state current of a transistor sometimes depends on $V_g$. Thus, the description "the off-state current of a transistor is lower than or equal to I" sometimes means that there is a value of $V_g$ with which the off-state current of the transistor becomes lower than or equal to I. The off-state current of a transistor sometimes means the off-state current in an off state at predetermined $V_g$, the off-state current in an off state at $V_g$ within a predetermined range, the off-state current in an off state at $V_g$ with which sufficiently reduced off-state current can be obtained, or the like.

As an example, the assumption is made of an n-channel transistor where $V_{th}$ is 0.5 V, and the drain current is $1 \times 10^{-9}$ A at $V_g$ of 0.5 V, the drain current is $1 \times 10^{-13}$ A at $V_g$ of 0.1 V, the drain current is $1 \times 10^{-19}$ A at $V_g$ of −0.5 V, and the drain current is $1 \times 10^{-22}$ A at $V_g$ of −0.8 V. The drain current of the transistor is $1 \times 10^{-19}$ A or lower at $V_g$ of −0.5 V or at $V_g$ in the range of −0.8 V to −0.5 V; therefore, the off-state current of the transistor is sometimes described as $1 \times 10^{-19}$ A or lower. Since there is $V_g$ at which the drain current of the transistor is $1 \times 10^{-22}$ A or lower, the off-state current of the transistor is sometimes described as $1 \times 10^{-22}$ A or lower.

The off-state current of a transistor sometimes depends on temperature. Unless otherwise specified, the off-state current in this specification sometimes means off-state current at room temperature (RT), 60° C., 85° C., 95° C., or 125° C. Alternatively, the off-state current is sometimes off-state current at a temperature at which the reliability of a semiconductor device or the like including the transistor is ensured or a temperature at which the semiconductor device or the like including the transistor is used (e.g., any one of the temperatures in the range of 5° C. to 35° C.). The description "the off-state current of a transistor is lower than or equal to I" sometimes mean that there is $V_g$ at which the off-state current of a transistor is lower than or equal to I at RT, 60° C., 85° C., 95° C., 125° C., a temperature at which the reliability of a semiconductor device including the transistor is ensured, or a temperature at which the semiconductor device or the like including the transistor is used (e.g., any one of the temperatures in the range of 5° C. to 35° C.).

The off-state current of a transistor sometimes depends on a voltage between its drain and source when the potential of the source is regarded as a reference potential (hereinafter also referred to as "$V_d$"). Unless otherwise specified, the off-state current in this specification is sometimes off-state current at $V_d$ of 0.1 V, 0.8 V, 1 V, 1.2 V, 1.8 V, 2.5 V, 3 V, 3.3 V, 10 V, 12 V, 16 V, or 20 V. Alternatively, the off-state current is sometimes off-state current at $V_d$ at which the reliability of a semiconductor device or the like including the transistor is ensured or $V_d$ at which the semiconductor device or the like including the transistor is used. The description "the off-state current of a transistor is lower than or equal to I" sometimes means that there is $V_g$ at which the off-state current of the transistor is lower than or equal to I at $V_d$ of 0.1 V, 0.8 V, 1 V, 1.2 V, 1.8 V, 2.5 V, 3 V, 3.3 V, 10 V, 12 V, 16 V, 20 V, $V_d$ at which the reliability of a semiconductor device including the transistor is ensured, or $V_d$ at which the semiconductor device or the like including the transistor is used.

In the above description of off-state current, a drain may be replaced with a source. That is, the off-state current sometimes refers to current that flows through a source of a transistor in an off state.

Furthermore, in this specification and the like, leakage current sometimes expresses the same meaning as off-state current. In addition, in this specification and the like, the off-state current sometimes refers to current that flows between a source and a drain of a transistor in the off state, for example.

In this specification and the like, a high power supply potential $V_{DD}$ (hereinafter also simply referred to as "$V_{DD}$" or a "potential H") is a power supply potential higher than a low power supply potential $V_{SS}$. The low power supply potential $V_{SS}$ (hereinafter also simply referred to as "$V_{SS}$" or a "potential L") is a power supply potential lower than the high power supply potential $V_{DD}$. In addition, a ground potential can be used as $V_{DD}$ or $V_{SS}$. For example, in the case where $V_{DD}$ is a ground potential, $V_{SS}$ is a potential lower than the ground potential, and in the case where $V_{SS}$ is a ground potential, $V_{DD}$ is a potential higher than the ground potential.

"A voltage" usually refers to a potential difference between a given potential and a reference potential (e.g., a ground potential (GND) or a source potential). "A potential" is a relative value, and a potential supplied to a wiring or the like changes depending on the reference potential in some cases. Therefore, the terms "voltage" and "potential" can be replaced with each other in some cases. Note that in this specification and the like, $V_{SS}$ is the reference voltage unless otherwise specified.

Note that the term "over" or "under" in this specification and the like does not necessarily mean directly over or directly under and directly in contact in a positional relationship between components. For example, the expression "an electrode B over an insulating layer A" does not necessarily mean that the electrode B is provided over and directly in contact with the insulating layer A and does not exclude the case where another component is included between the insulating layer A and the electrode B.

In this specification, the term "parallel" indicates a state where two straight lines are placed at an angle of greater than or equal to −10° and less than or equal to 10° unless otherwise specified. Accordingly, the case where the angle is greater than or equal to −5° and less than or equal to 5° is also included. Furthermore, the term "substantially parallel" indicates a state where two straight lines are placed at an angle of greater than or equal to −30° and less than or equal to 30° unless otherwise specified. Furthermore, the terms "perpendicular" and "orthogonal" indicate a state where two straight lines are placed at an angle of greater than or equal to 80° and less than or equal to 100° unless otherwise specified. Accordingly, the case where the angle is greater than or equal to 85° and less than or equal to 95° is also included. In addition, "substantially perpendicular" indicates a state where two straight lines are placed at an angle of greater than or equal to 60° and less than or equal to 120° unless otherwise specified.

Note that in this specification and the like, the terms "identical", "the same", "equal", "uniform", and the like (including synonyms thereof) used in describing calculation values and measurement values contain an error of ±20% unless otherwise specified.

Embodiment 1

In this embodiment, a memory device 100 of one embodiment of the present invention will be described with reference to drawings.
<Structure Example of Memory Device>
FIG. 1(A) is a block diagram illustrating a structure example of the memory device 100. The memory device 100 includes a memory portion 101 and a driver circuit portion 102 to a driver circuit portion 105.

The memory device 100 includes m (m is an integer greater than or equal to 2) wirings RWL, m wirings WWL, m wirings CL, n (n is an integer greater than or equal to 2) wirings SL, n wirings WBL, and n wirings RBL. The m wirings RWL and the m wirings WWL each are arranged substantially parallel to each other and the potentials thereof are controlled by the driver circuit portion 102. The m wirings CL are arranged substantially parallel to each other, and the potentials thereof are controlled by the driver circuit portion 103. The n wirings SL and the n wirings WBL are arranged substantially parallel to each other and the potentials thereof are controlled by the driver circuit portion 104. The n wirings RBL are arranged substantially parallel to each other, and the potentials thereof are controlled by the driver circuit portion 105.

Note that the terms "driver circuit", "peripheral circuit", or "peripheral driver circuit" is sometimes used as the general term of the driver circuit portion 102 to the driver circuit portion 105. It is not necessary to provide all of the driver circuit portion 102 to the driver circuit portion 105. For example, the driver circuit portion 103 can be omitted when the driver circuit portion 102 is provided with the function of the driver circuit portion 103. Alternatively, circuits other than the driver circuit portion 102 to the driver circuit portion 105 may be provided.

Figure 2:
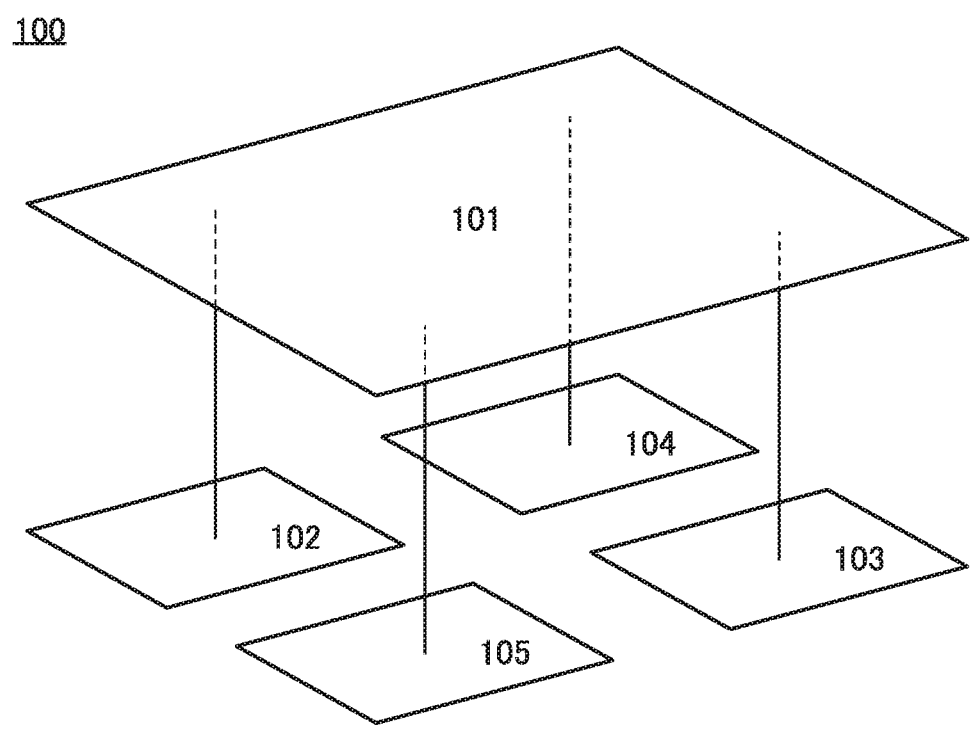
FIG. 2 A drawing illustrating a memory device.

Alternatively, as illustrated in the perspective block diagram of FIG. 2, the peripheral driver circuits may be provided to overlap with the memory portion 101. When the peripheral driver circuits overlap with the memory portion 101, the area occupied by the memory device 100 can be reduced and the size of the memory device 100 can be reduced.

<<Memory Portion 101>>

The memory portion 101 includes a plurality of memory elements 111 arranged in a matrix of m rows and n columns. The memory element 111 includes a transistor 112 to a transistor 114 and a capacitor 115. The memory element 111 also includes a data retaining portion FN.

The memory element 111 can hold any one of three or more different states of the amount of charge at the data retaining portion FN. In other words, the memory element 111 is an MLC (multi-level cell) which can hold any one of three or more different states (also referred to as multi-levels in some cases). For example, when the data retaining portion FN of the memory element 111 can hold any one of four different states of the amount of charge, the memory element 111 is regarded as being capable of storing 4-level (2-bit), that is, capable of handling four pieces of data "00", "01", "10", and "11" expressed by the binary notation.

[Memory Element 111]

Figure 1B:
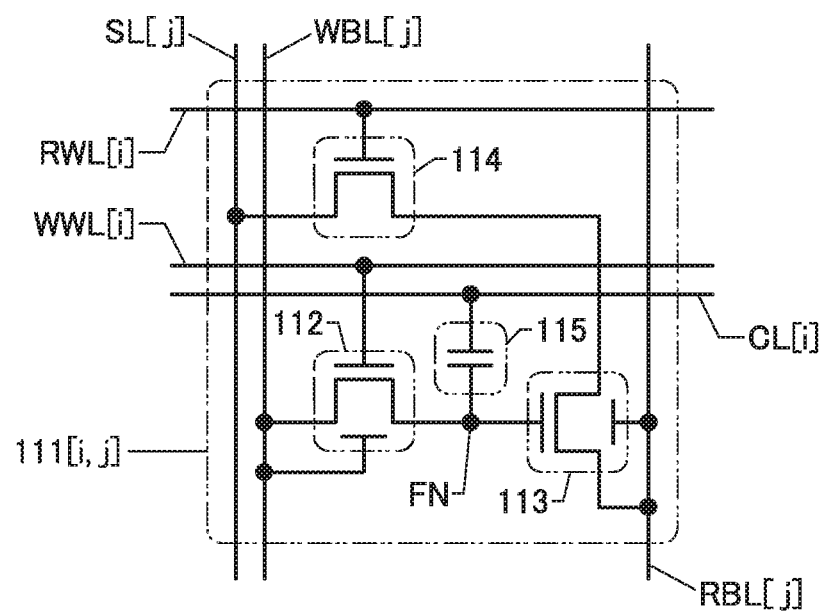

FIG. 1(B) is a circuit drawing of the memory element 111 at the i-th row and the j-th column (i is an integer greater than or equal to 1 and less than or equal to m, and j is an integer greater than or equal to 1 and less than or equal to n). The memory element 111 at the i-th row and the j-th column is electrically connected to the i-th wiring RWL, the i-th wiring WWL, and the i-th wiring CL. The memory element 111 at the i-th row and the j-th column is electrically connected to the j-th wiring SL, the j-th wiring WBL, and the j-th wiring RBL.

The wiring RWL functions as a read word line. The wiring WWL functions as a write word line. The wiring RBL functions as a read bit line. The wiring WBL functions as a write bit line. The wiring CL functions as a capacitor line. The wiring SL functions as a read power potential supply line. The transistor 112 functions as a write transistor. The transistor 113 functions as a read transistor. The transistor 114 functions as a selection transistor.

Note that in this specification and the like, the i-th wiring RWL is denoted by a wiring RWL[i], the i-th wiring WWL is denoted by a wiring WWL[i], and the i-th wiring CL is denoted by a wiring CL[i]. In this specification and the like, the j-th wiring SL is denoted by a wiring SL[j], the j-th wiring WBL is denoted by a wiring WBL[j], and the j-th wiring RBL is denoted by a wiring RBL[j].

In this specification and the like, the memory element 111 at the i-th row and the j-th column is denoted by a memory element 111[i,j]. The transistor 112 to the transistor 114, the capacitor 115, and the data retaining portion FN are each denoted with "i" and "j" as in the memory element 111 in some cases.

In the memory element 111[i,j], it is preferable to use a transistor having a back gate as the transistor 112 and the transistor 113.

In general, a back gate is formed using a conductive layer and positioned so that a channel formation region of a semiconductor layer is sandwiched between a gate and a back gate. Thus, a back gate can function in a manner similar to that of the gate. Providing a back gate makes an electric field generated outside the transistor not affect the semiconductor layer where a channel is formed. Therefore, variations in electrical characteristics among a plurality of transistors can be reduced.

As a semiconductor material used for a semiconductor layer of a transistor included in the memory device 100, either an amorphous semiconductor or a semiconductor having crystallinity (a microcrystalline semiconductor, a polycrystalline semiconductor, a single crystal semiconductor, or a semiconductor partly including crystal regions) may be used.

For example, silicon or germanium can be used as the semiconductor material used for the semiconductor layer of the transistor. Furthermore, a compound semiconductor such as a silicon carbide, a gallium arsenide, a metal oxide, or a nitride semiconductor, an organic semiconductor, or the like can be used.

For example, amorphous silicon can be used as a semiconductor material used for the transistor. In particular, amorphous silicon has high mass productivity and can be easily provided over a large-sized substrate. Note that the amorphous silicon used in the transistor contains a large amount of hydrogen in general. Thus, the amorphous silicon containing a large amount of hydrogen may be called "hydrogenated amorphous silicon" or "a-Si: H". Amorphous silicon can be formed at a temperature lower than a temperature at which polycrystalline silicon is formed; thus, the highest temperature in a manufacturing process can be lowered. Therefore, low heat-resistance materials can be used for a substrate, a conductive layer, an insulating layer, and the like.

Alternatively, silicon having crystallinity, such as microcrystalline silicon, polycrystalline silicon, or single crystal silicon, can be used as the semiconductor material used for the transistor. In particular, polycrystalline silicon can be formed at a lower temperature than a temperature at which single crystal silicon is formed and has higher field-effect mobility and higher reliability than amorphous silicon.

Furthermore, an oxide semiconductor, which is a kind of a metal oxide, can be used as a semiconductor material used for the transistor. Typically, an oxide semiconductor containing indium, or the like can be used. An oxide semiconductor can achieve higher field-effect mobility and higher reliability than amorphous silicon. Moreover, an oxide semiconductor has high mass productivity and can be easily provided over a large-sized substrate.

An oxide semiconductor, which is a kind of a metal oxide, has a wider bandgap and lower carrier density than silicon; and thus is preferably used for the semiconductor layer of the transistor. The use of an oxide semiconductor for the semiconductor layer of the transistor is preferable because current flowing between a source and a drain of the transistor in an off state can be reduced.

An oxide semiconductor, which is a kind of a metal oxide, preferably has an energy gap of 2 eV or more, further preferably 2.5 eV or more, still further preferably 3 eV or more. The use of such an oxide semiconductor having a wide energy gap can reduce the off-state current of the transistor.

The oxide semiconductor, which is a kind of a metal oxide, preferably includes, for example, a material represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor using the oxide semiconductor, a stabilizer is preferably contained in addition to them.

Examples of the stabilizer, including the metals that are described above as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide forming the semiconductor layer, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used, for example.

Note that here, an In—Ga—Zn-based oxide means an oxide containing In, Ga, and Zn as its main components and there is no limitation on the ratio of In to Ga and Zn. Furthermore, a metal element other than In, Ga, and Zn may be contained.

Note that a metal oxide that can be used for the semiconductor layer of the transistor is described in detail in other embodiments.

The transistor 112 is preferably a transistor including an oxide semiconductor, which is a kind of a metal oxide, in a semiconductor layer where a channel is formed (also referred to as an "OS transistor"). The OS transistor can have extremely low off-state current. Specifically, the off-state current per micrometer of channel width at room temperature (25° C.) and at a voltage between a source and a drain of 3.5 V can be lower than $1 \times 10^{-20}$ A, lower than $1 \times 10^{-22}$ A, or lower than $1 \times 10^{-24}$ A. The data written to the data retaining portion FN can be retained for a long time with the use of the OS transistor as the transistor 112. Therefore, it becomes unnecessary to refresh a potential of the data retaining portion FN and the power consumption of the memory element 111 can be reduced. Thus, the power consumption of the memory device 100 can be reduced.

Furthermore, using the OS transistor as the transistor 112 can reduce the capacitance of the capacitor 115. Therefore, the area occupied by the memory element 111 can be reduced. Thus, the area occupied by the memory device 100 can be reduced.

Furthermore, the OS transistor is preferably used as the transistor 114. With the use of the OS transistor as the transistor 114, the leakage current between the wiring SL and the wiring RBL which is generated while the memory element 111 is not selected can be reduced and reading accuracy can be improved. Note that the OS transistor may be used as the transistor 113.

In addition, the OS transistor has a higher withstand voltage than a transistor whose channel formation region includes silicon (also referred to as a Si transistor). Therefore, when the transistor 112 is the OS transistor, the range of potentials retained at the data retaining portion FN can be widened. Thus, the amount of data held in the retaining portion 21 can be increased.

When the OS transistors are used as the transistor 113 and the transistor 114, the range of potentials in a read operation can be widened. Thus, reading accuracy of multi-level data can be improved.

In the memory element 111[i,j], a gate of the transistor 112 is electrically connected to the wiring WWL[i], and a back gate thereof is electrically connected to the wiring WBL[j]. One of a source or a drain of the transistor 112 is electrically connected to the wiring WBL[j], and the other thereof is electrically connected to one electrode of the capacitor 115 and a gate of the transistor 113.

In the memory element 111[i,j], the back gate of the transistor 113 is electrically connected to the wiring RBL[j]. One of a source or a drain of the transistor 113 is electrically connected to the wiring RBL[j], and the other thereof is electrically connected to one of a source or a drain of the transistor 114. The other of the source or the drain of the transistor 114 is electrically connected to the wiring SL[j], and a gate thereof is electrically connected to the wiring RWL[i].

The other electrode of the capacitor 115 is electrically connected to the wiring CL[i].

The node at which the other of the source or the drain of the transistor 112, one electrode of the capacitor 115, and the gate of the transistor 113 are electrically connected to each other functions as the data retaining portion FN that stores data.

The wiring WWL[i] is supplied with a signal that determines an on state and off state of the transistor 112 included in the memory element 111[i,j]. The wiring WBL[j] is supplied with data to be stored in the data retaining portion FN. The data is supplied to the data retaining portion FN when the transistor 112 is in an on state, and is stored when the transistor 112 is in an off state.

Figure 3:
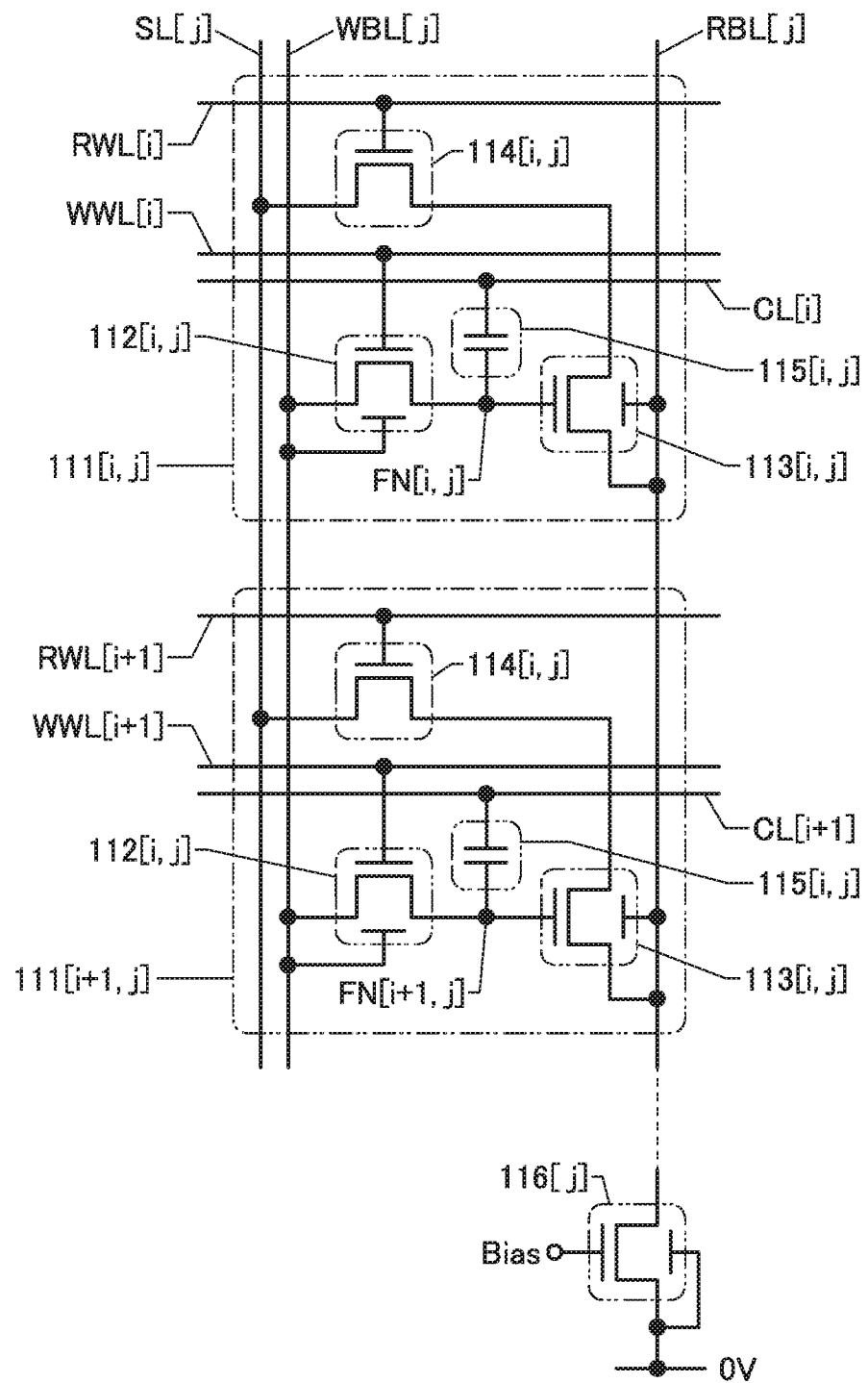
FIG. 3 A drawing illustrating memory elements.

FIG. 3 is a circuit diagram of the memory element 111 [i,j] and a memory element 111 [i+1, j]. In the memory device 100, the j-th wiring RBL is electrically connected to the j-th transistor 116. Specifically, one of a source or a drain of the transistor 116 is electrically connected to the wiring RBL, and the other thereof is electrically connected to the back gate. The other of the source or the drain of the transistor 116 are supplied with 0 V. A gate of the transistor 116 is supplied with a bias potential (e.g. $V_{DD}$) which brings the transistor 116 into an on state at the time of a read operation. The transistor 116 is included in the driver circuit portion 105, for example. The transistor 113 and the transistor 116 form a source follower.

[Effect of Connecting the Back Gate of the Transistor 112 to the Wiring WBL]

Here, an effect of connecting the back gate of the transistor 112 to the wiring WBL will be described. In the circuit diagram of the memory element 111 [i,j] illustrated in FIG. 4(A), 0 V or $V_{SS}$ is supplied to the back gate of the transistor 112.

Figure 4A:
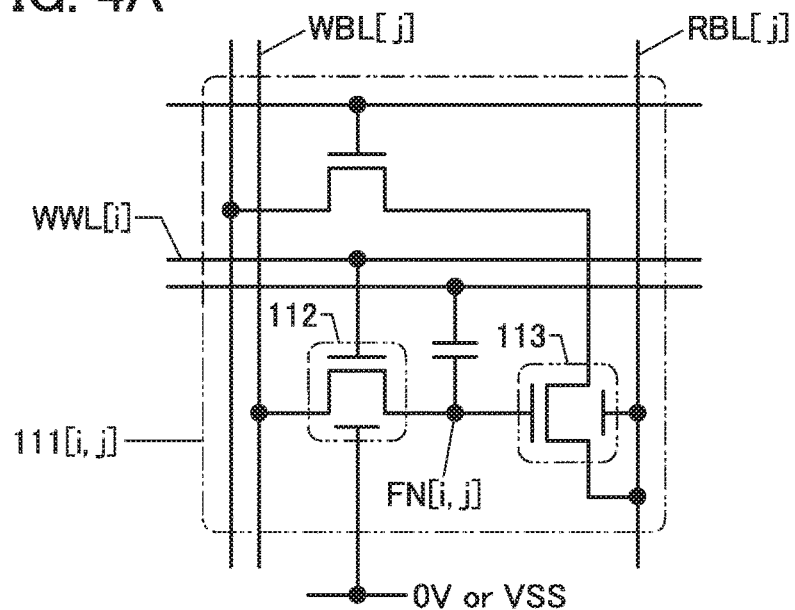
FIG. 4 Drawings illustrating a memory element.
Figure 4A:
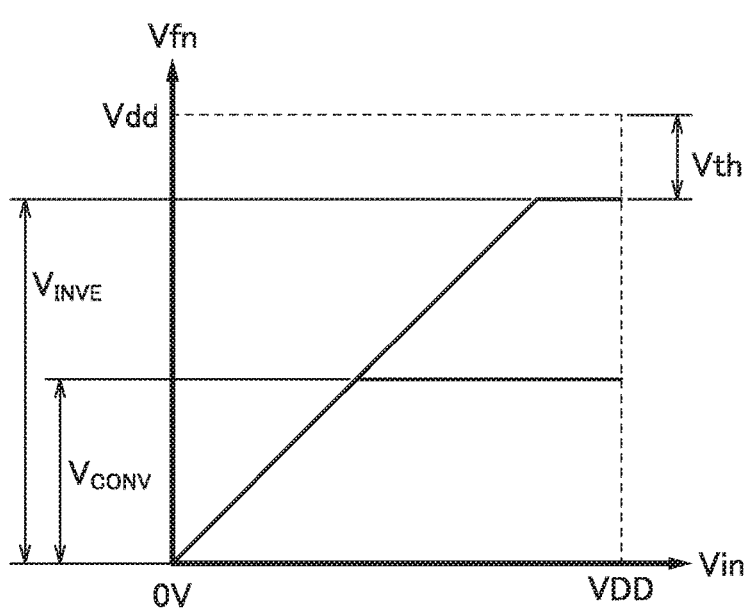
Figure 4A:
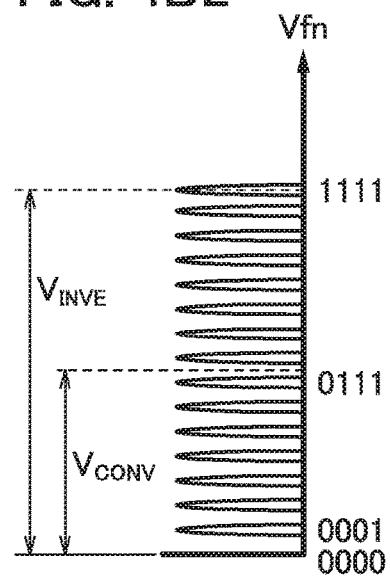

FIG. 4(B1) is a graph showing the relation between a potential $V_{in}$ supplied to the wiring WBL [j] and a potential $V_{fn}$ written to the data retaining portion FN. A change of the potential $V_{fn}$ when the potential yin changes from 0 V to $V_{DD}$ is shown.

In the case of the circuit configuration illustrated in FIG. 4(A), when the transistor 112 is brought into an on state and the potential $V_{in}$ is written to the data retaining portion FN, the potential of the back gate is relatively negative with respect to the increased potential of the data retaining portion FN. Thus, $V_{th}$ of the transistor 112 apparently increases and maximum writing voltage decreases (referring to "potential $V_{CONV}$" in FIG. 4(B1)). The value of the $V_{CONV}$ is determined by, for example, the ratio of the gate capacitance to the back gate capacitance.

As the memory element 111 [i,j] illustrated in FIG. 1(B), in the case where the back gate of the transistor 112 is connected to the wiring WBL, the back gate potential of the transistor 112 is equal to the potential $V_{in}$. That is, even when the transistor 112 is brought into an on state and the potential $V_{in}$ is written to the data retaining portion FN, the back gate potential is not relatively negative. Thus, the maximum voltage that can be written to the potential $V_{fn}$ can be increased by $V_{DD}$-$V_{th}$ (referring to "potential $V_{INVE}$" in FIG. 4(B2)).

FIG. 4(B2) shows a potential distribution in the case where 16-level data is written to the data retaining portion FN. Each distribution corresponds to the 4 bit data from 0000 to 1111. FIG. 4(B1) and FIG. 4(B2) show that 8-level (3-bit) data can be written to the data retaining portion FN in the case where the maximum potential that can be written thereto is the potential $V_{CONV}$, and 16-level (4-bit) data can be written to the data retaining portion FN in the case where the maximum potential that can be written thereto is the potential $V_{INVE}$.

According to one embodiment of the present invention, a memory element which can store more multi-level data can be provided. According to one embodiment of the present invention, a memory device which can store more multi-level data can be provided.

Data written to the data retaining portion FN can be read accurately by providing a back gate in the transistor 113 and electrically connecting the back gate to the wiring RBL.

Modification Example 1

Figure 5A:
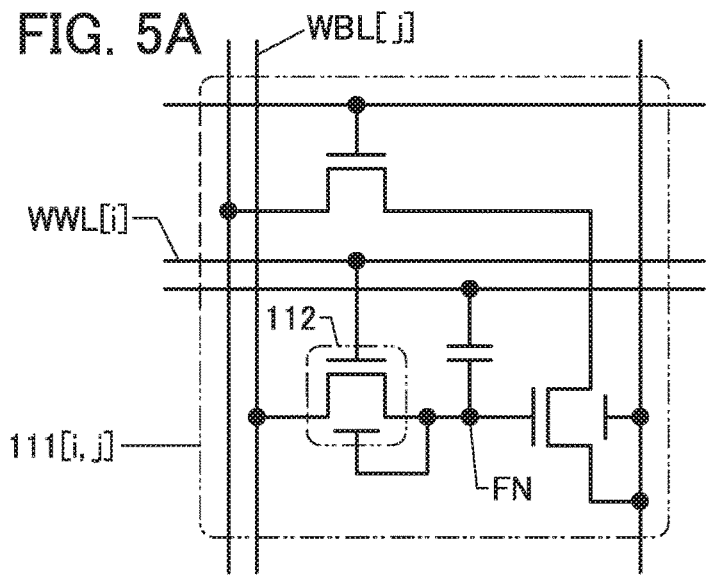
FIG. 5 Drawings each illustrating a memory element.

As illustrated in FIG. 5(A), the back gate of the transistor 112 may be electrically connected to the data retaining portion FN. In this case, although the reliability of the back gate might be slightly decreased since the potential $V_{fn}$ is constantly applied to the back gate of the transistor 112 during the data holding period, the maximum potential that can be written to the data retaining portion FN can be increased.

Modification Example 2

Figure 5B:
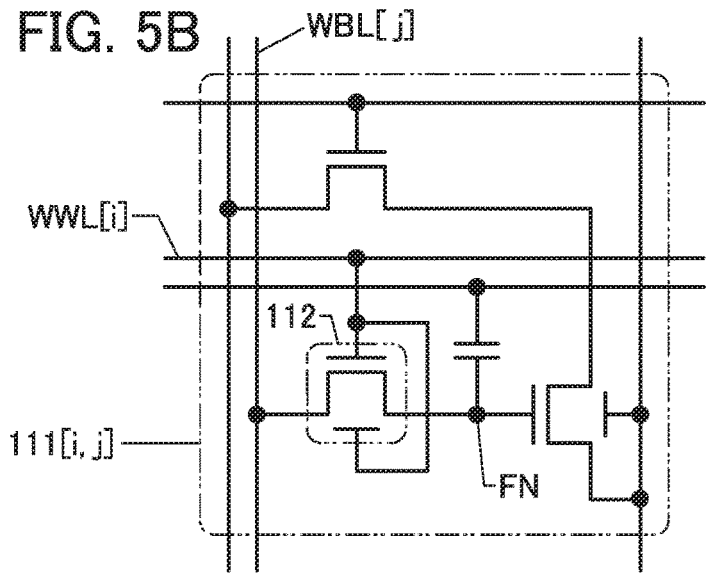

As illustrated in FIG. 5(B), the gate and the back gate of the transistor 112 may be electrically connected to each other. In this case, the potential $V_{fn}$ may be slightly decreased when the transistor 112 is brought into an off state since the apparent gate capacitance of the transistor 112 increases; however, the speed of writing data to the data retaining portion FN can be increased.

Modification Example 3

Figure 5C:
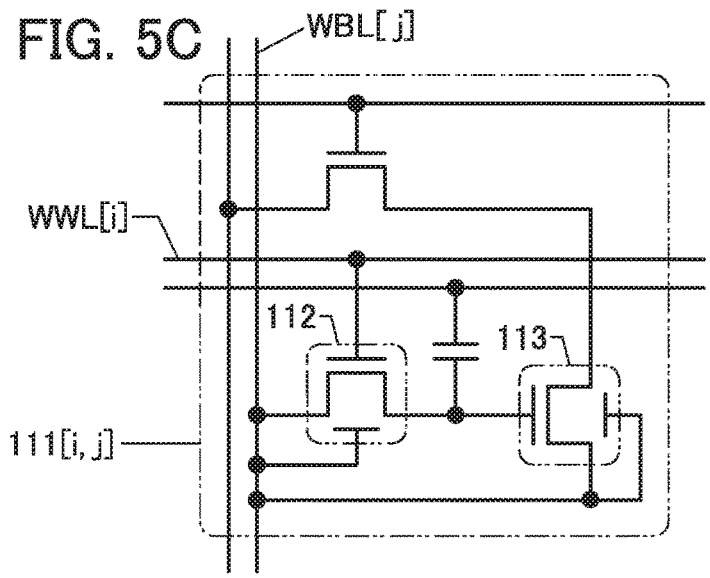

As illustrated in FIG. 5(C), the back gate of the transistor 113 may be electrically connected to the wiring WBL [j]. Both data writing and data reading can be performed through the wiring WBL [j]. Since the wiring RBL is not necessarily provided, thus, the area occupied by the memory element 111 can be reduced. Accordingly, the size of the memory device 100 can be reduced.

Modification Example 4

Figure 6A:
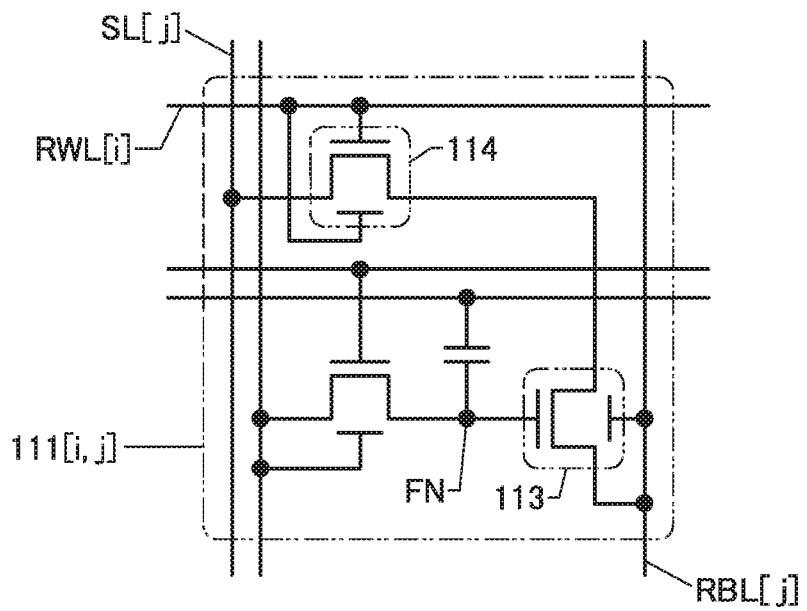
FIG. 6 Drawings each illustrating a memory element.

As illustrated in FIG. 6(A), the transistor 114 may be provided with a back gate, and the gate and back gate of the transistor 114 may be electrically connected to each other. With such a structure, the speed of reading stored data can be increased. In addition, reading accuracy of stored data can be improved.

Modification Example 5

Figure 6B:
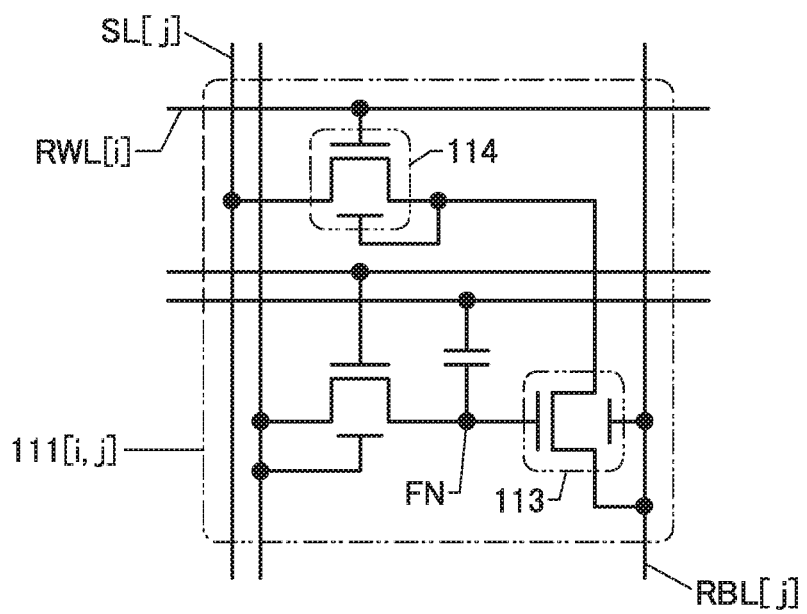

As illustrated in FIG. 6(B), the transistor 114 may be provided with a back gate, and the back gate of the transistor 114 may be electrically connected to the other of the source and drain of the transistor 113. With such a structure, reading accuracy of stored data can be improved.

Modification Example 6

Figure 7:
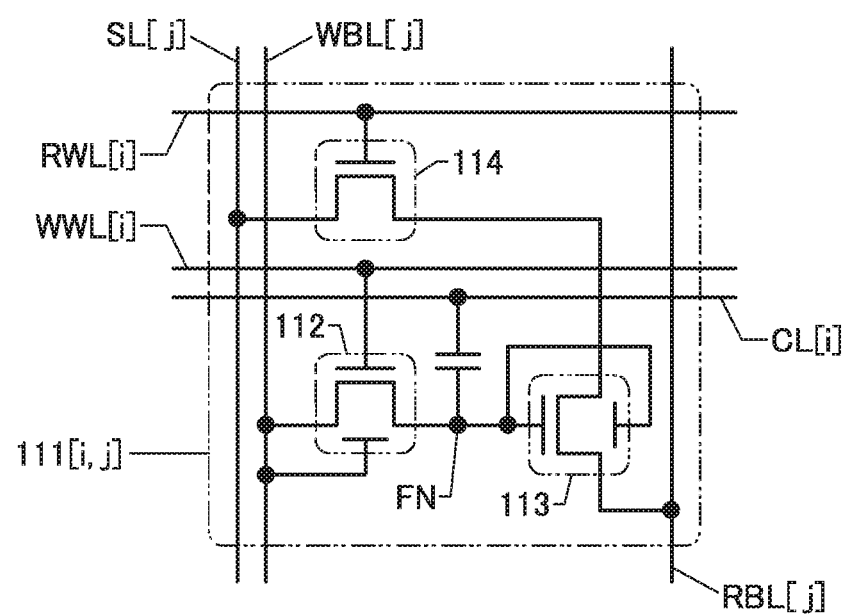
FIG. 7 A drawing illustrating a memory element.

As illustrated in FIG. 7, the back gate of the transistor 113 may be electrically connected to the data retaining portion FN. With such a structure, reading accuracy of stored data can be improved. In this case, since the apparent gate capacitance of the transistor 113 increases, writing period may be extended; however, the maximum potential of the wiring RBL at a read operation can be increased.

This embodiment can be implemented in an appropriate combination with any of the configurations described in the other embodiments.

Embodiment 2

In this embodiment, an operation example of the memory device 100 described with reference to FIG. 1 and FIG. 3 will be described with reference to drawings.

<Operation Example of Memory Device>

Write Operation: Example 1

Figure 8:
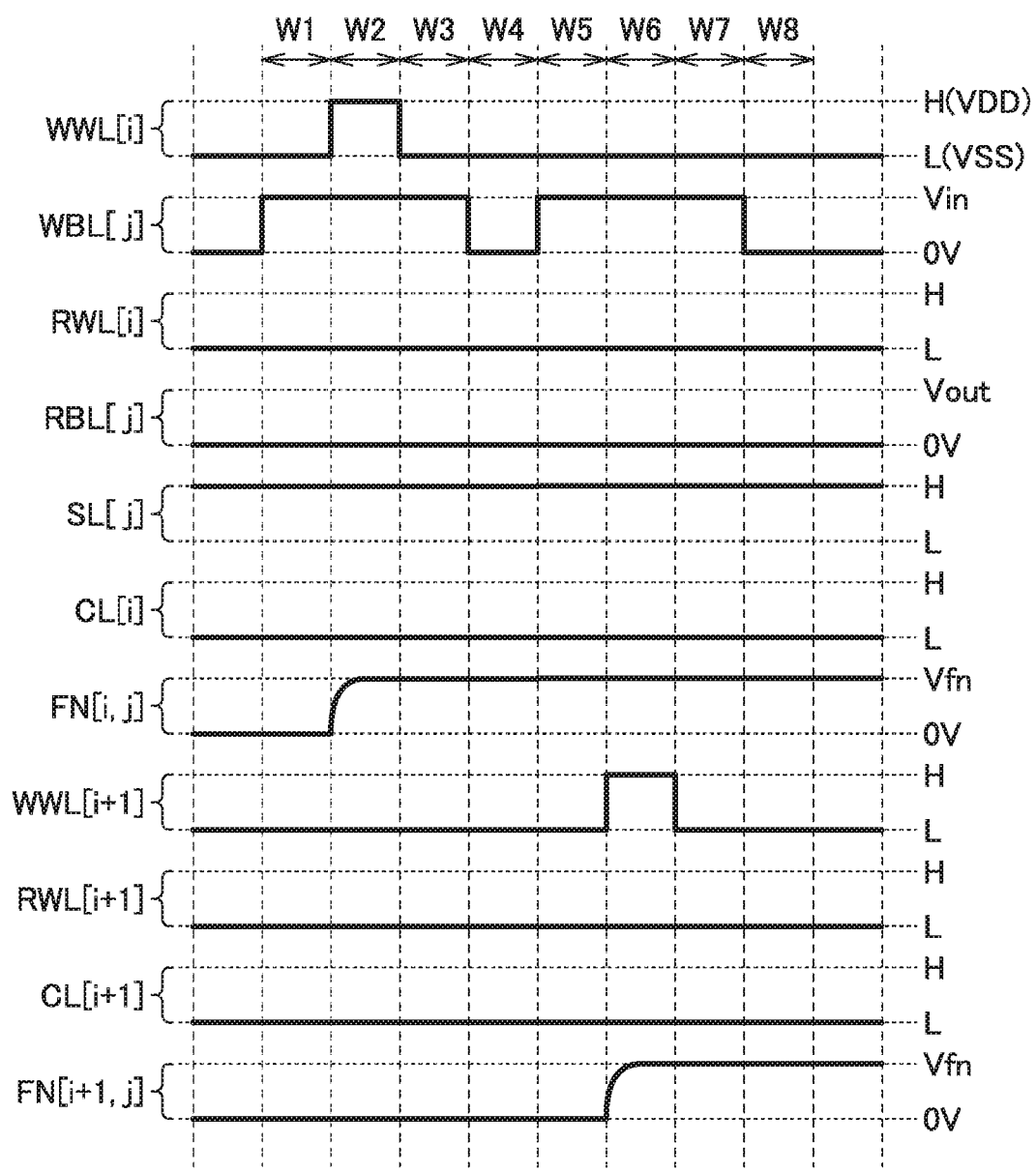
FIG. 8 A timing chart illustrating a write operation.

FIG. 8 is a timing chart showing a write operation of the memory element 111 [i,j] and the memory element 111 [i+1, j]. FIG. 8 shows a change in potential of each wiring and the data retaining portion FN. Note that the potential H ($V_{DD}$) is a potential higher than 0 V and the potential L ($V_{SS}$) is a potential lower than 0 V.

[Initial State]

Figure 9:
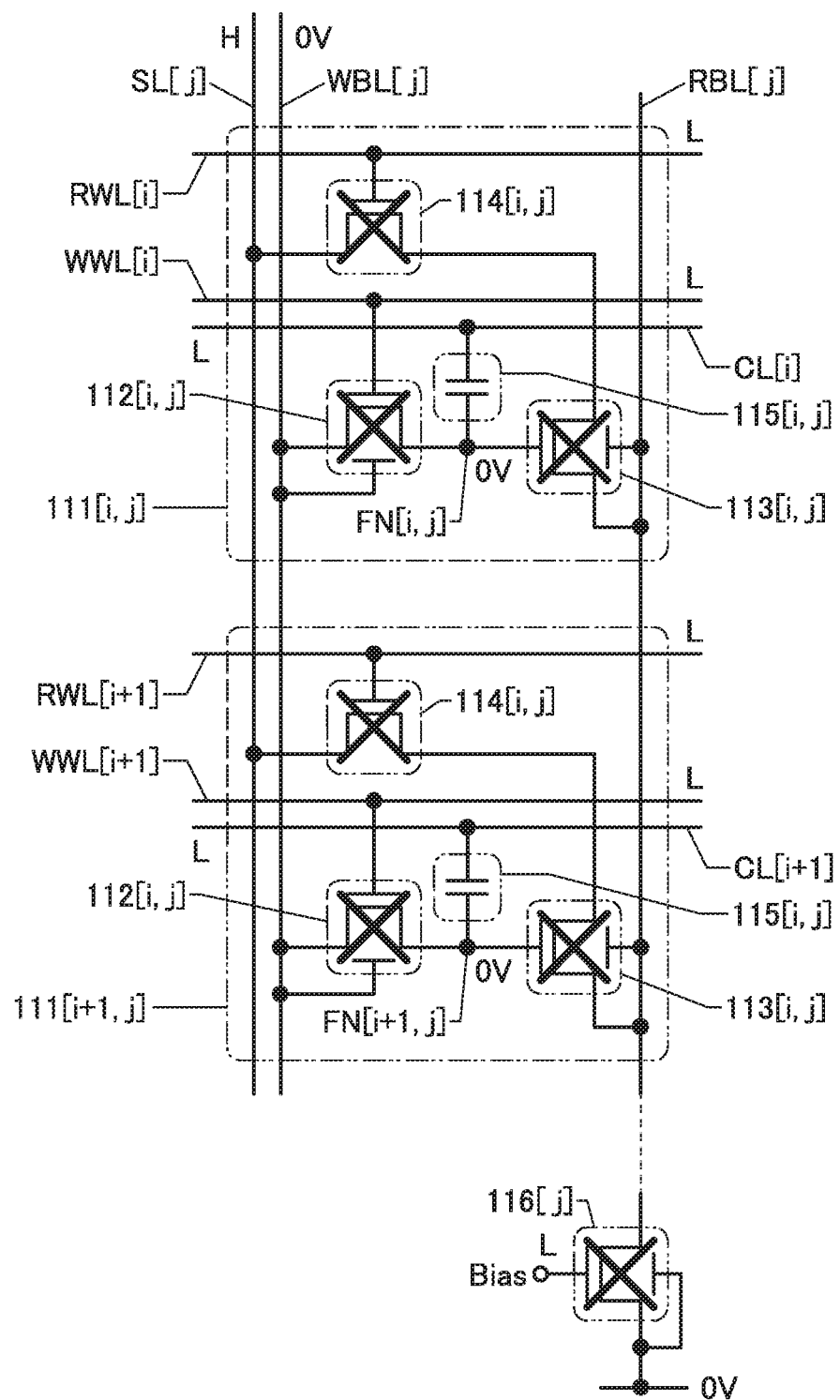
FIG. 9 A drawing illustrating a write operation.

FIG. 9 illustrates the initial states of the memory element 111 [i,j] and the memory element 111 [i+1, j]. The potential L is supplied to the wiring WWL[i], the wiring RWL[i], the wiring CL[i], the wiring WWL [i+1], the wiring RWL[i+1], and the wiring CL[i+1], the potential H is supplied to the wiring SL [i], 0 V is supplied to the wiring WBL[j], and 0

V is retained in the data retaining portion FN[i,j] and the data retaining portion FN [i+1,j]. The potential L is supplied to the gate of the transistor 116, so that the transistor 116 [j] is in an off state.

Figure 10:
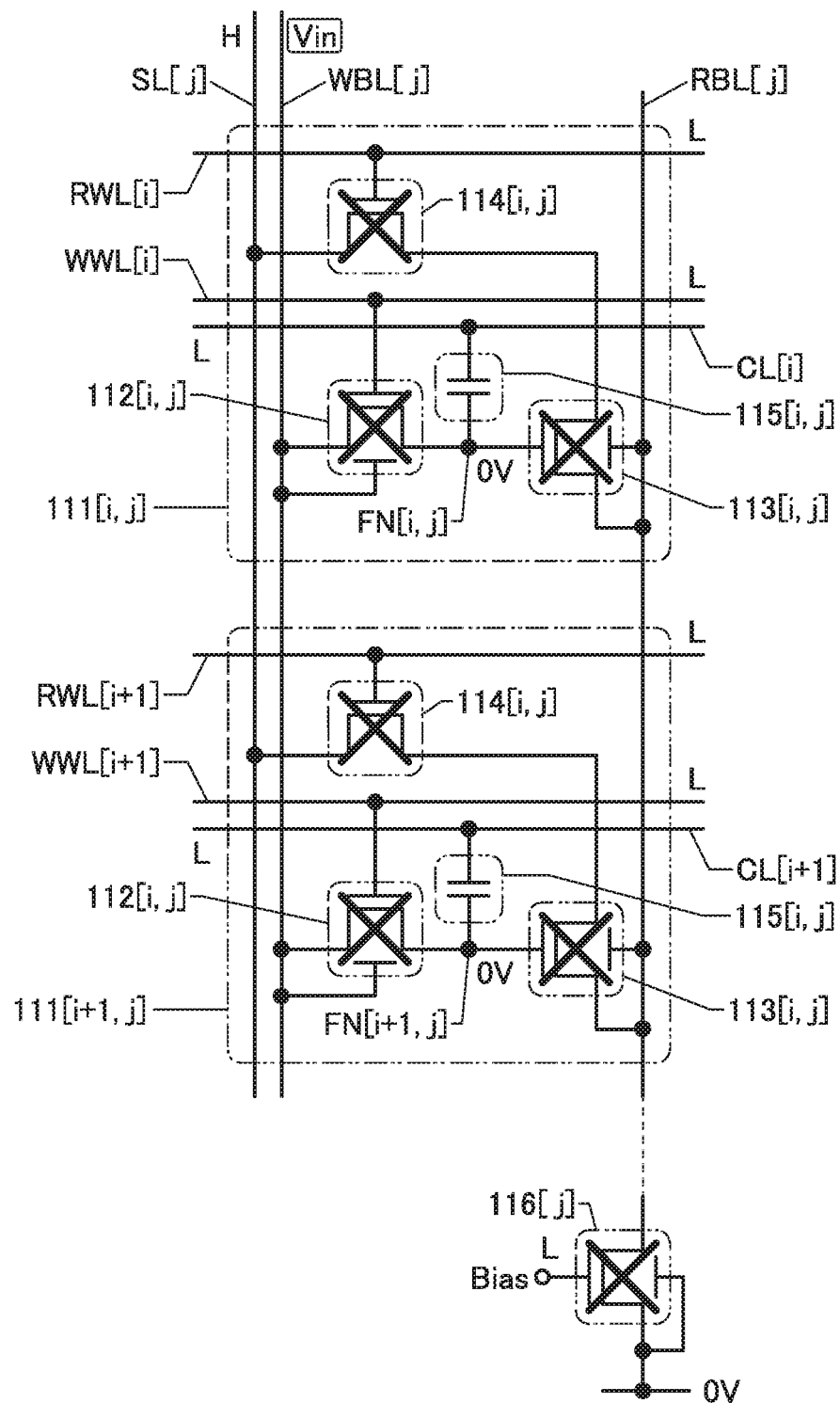
FIG. 10 A drawing illustrating a write operation.

[Period W1 (See FIG. 10)]

In a period W1, the potential $V_{in}$ is supplied to the wiring WBL[j].

Figure 11:
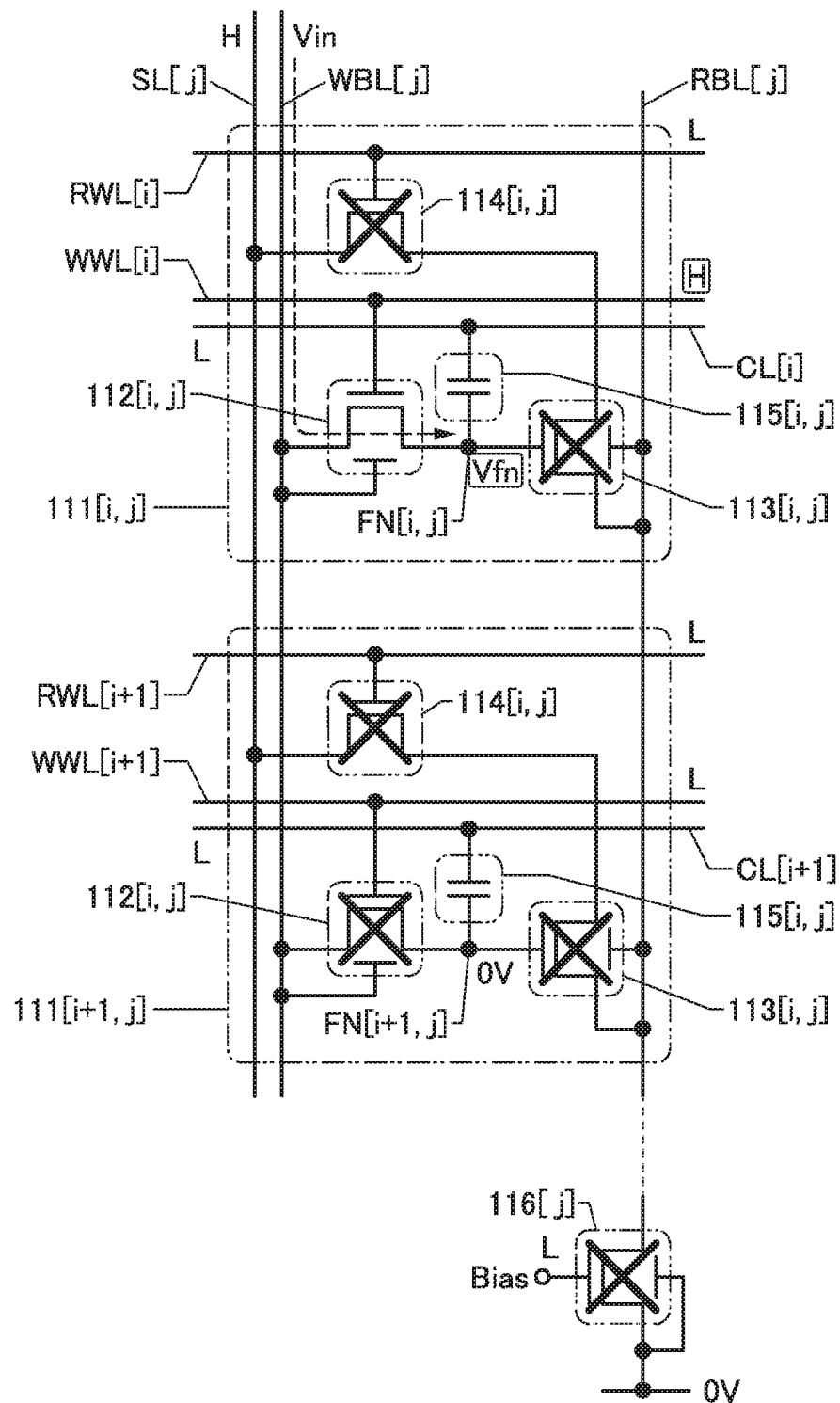
FIG. 11 A drawing illustrating a write operation.

[Period W2 (Referring to FIG. 11)]

In a period W2, the potential H is supplied to the wiring WWL [i]. Thus, the transistor 112 [i,j] is brought into an on state, and the potential of the data retaining portion FN [i,j] increases, so that the potential $V_{fn}$ is written to the data retaining portion FN [i,j].

Figure 12:
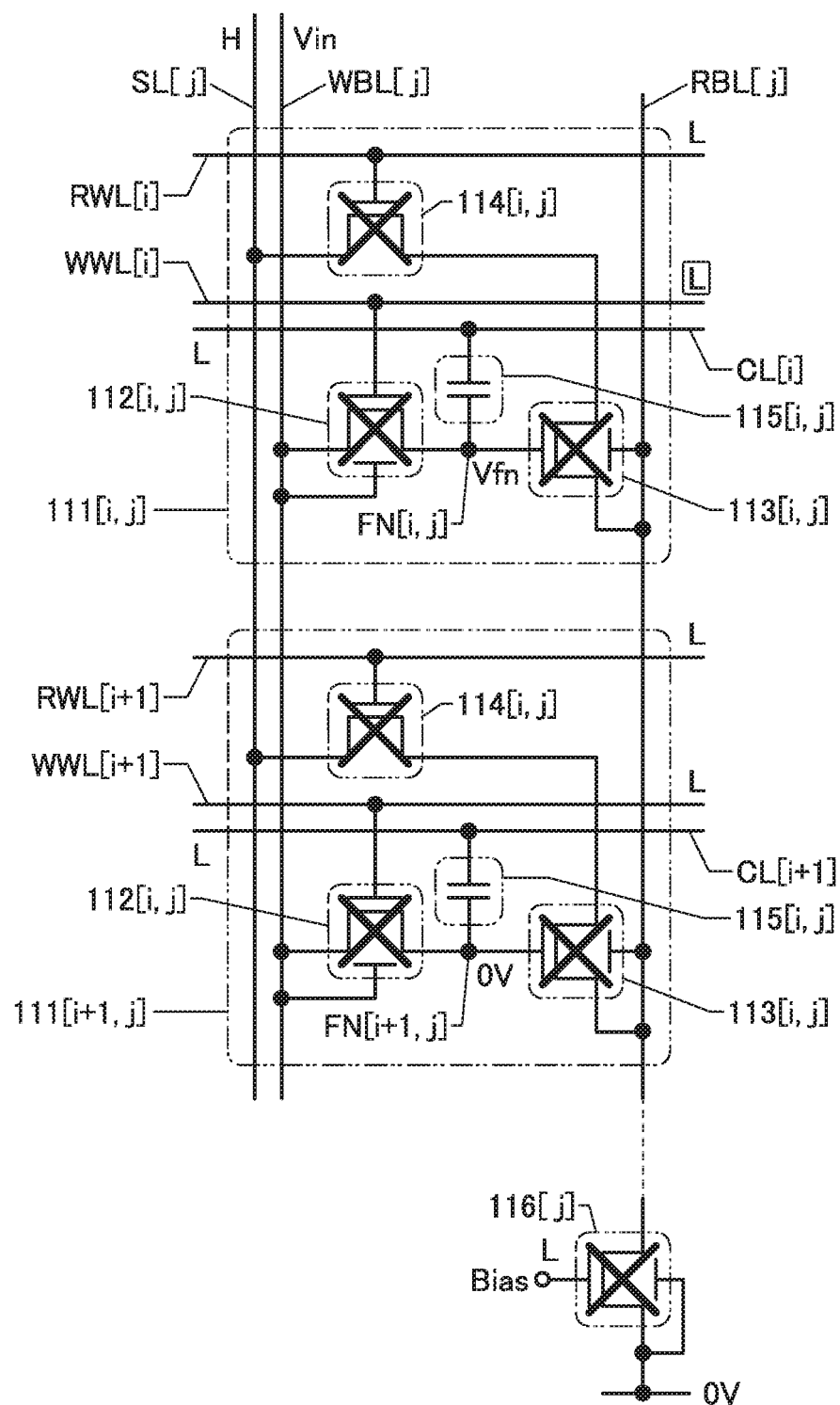
FIG. 12 A drawing illustrating a write operation.

[Period W3 (See the FIG. 12)]

In a period W3, the potential L is supplied to the wiring WWL[i]. Thus, the transistor 112[i,j] is brought into an off state and the potential $V_{fn}$ written to the data retaining portion FN[i, j] is retained. In this manner, data can be written to the memory element 111 [i,j].

Figure 13:
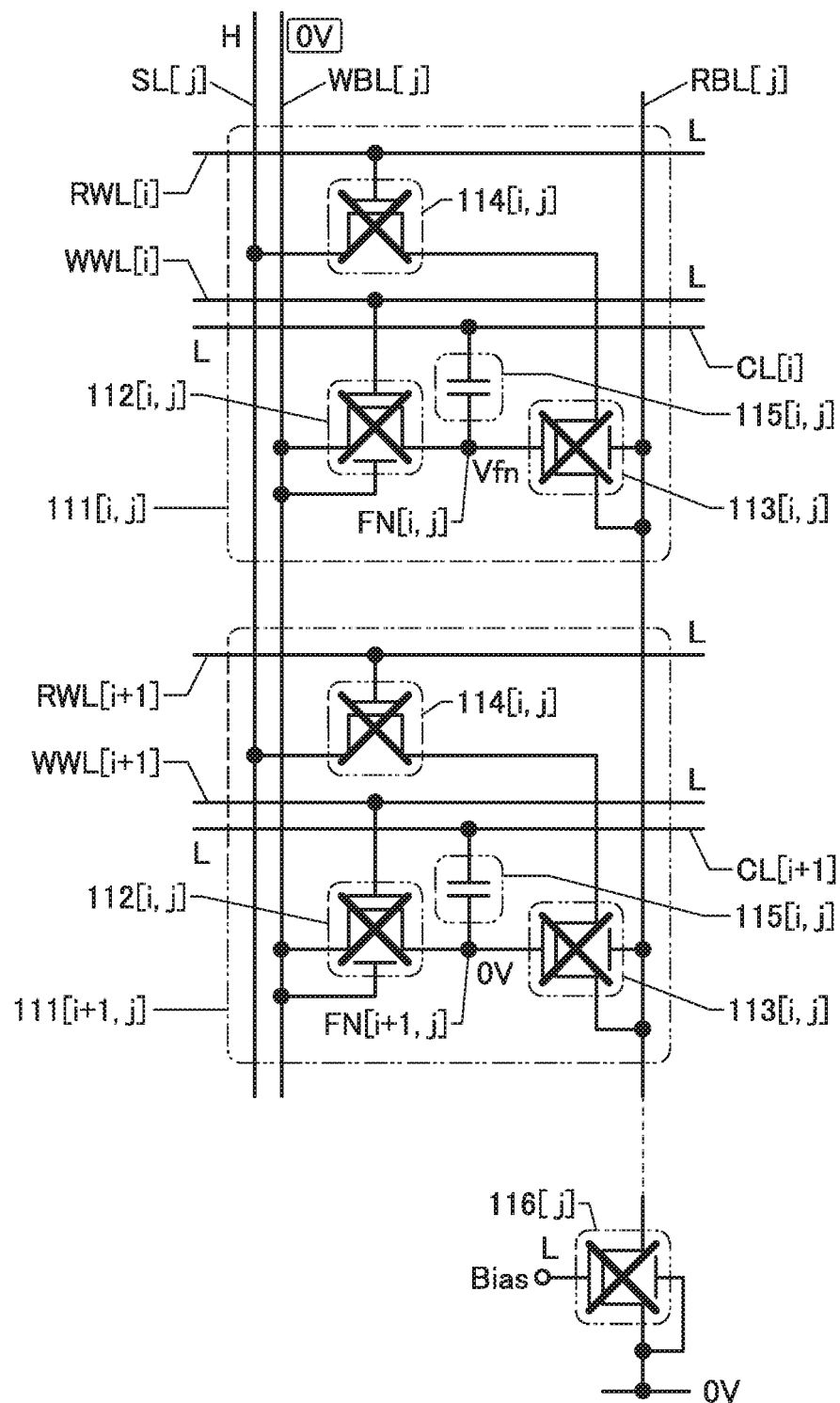
FIG. 13 A drawing illustrating a write operation.

[Period W4 (See the FIG. 13)]

In a period W4, 0 V is supplied to the wiring WBL [j].

[Period W5 to Period W8]

A period W5 to a period W8 is a period during which data is written to the memory element 111 [i+1, j]. For data writing to the memory element 111 [i+1, j], "i" in the description of the period W1 to the period W4 can be replaced with "i+1".

Note that in [Write operation: example 1], the potential of the wiring CL is a fixed potential. Thus, the potential of the wiring CL may be 0 V, $V_{DD}$, or a given potential.

Write Operation: Example 2

Figure 14:
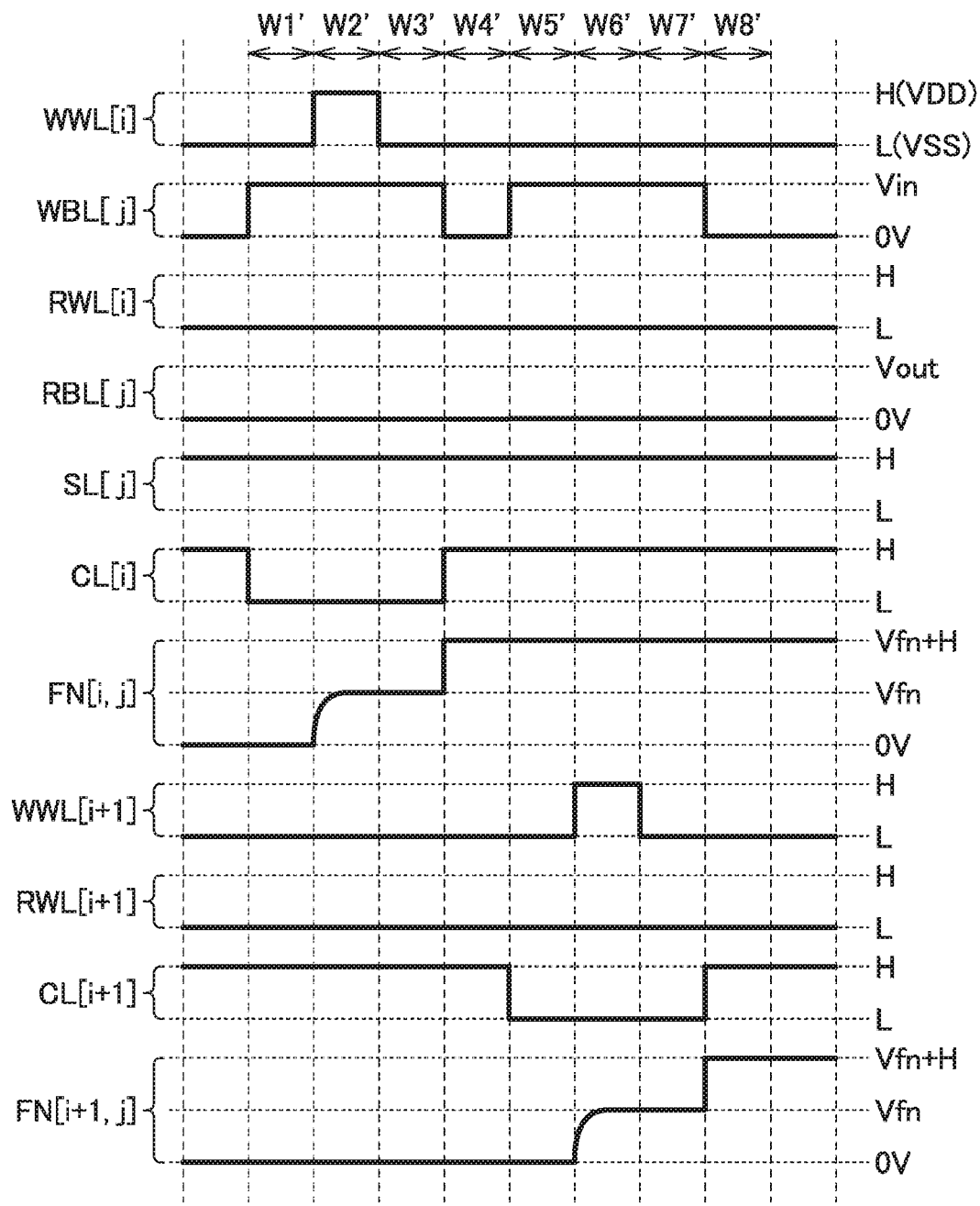
FIG. 14 A timing chart illustrating a write operation.

A write operation which is different from [Write operation: example 1] will be described. FIG. 14 is a timing chart illustrating a write operation of the memory element 111 [i,j] and the memory element 111 [i+1,j]. FIG. 14 shows a potential change of each wiring and the data retaining portion FN.

[Initial State]

Figure 15:
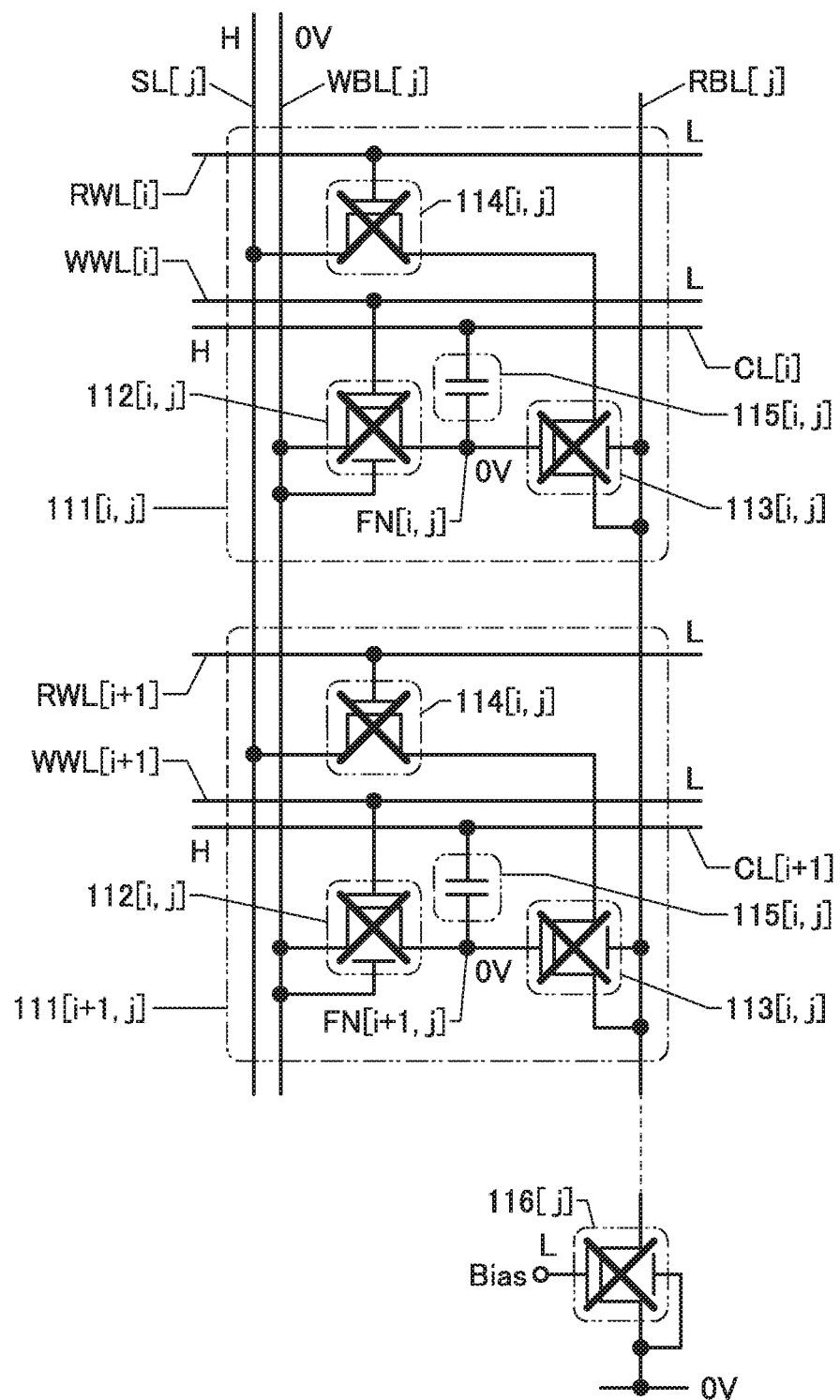
FIG. 15 A drawing illustrating a write operation.

FIG. 15 illustrates the initial states of the memory element 111[i,j] and the memory element 111 [i+1, j]. The potential supplied to the wiring CL[i] and the wiring CL[i+1] is different between the initial state of [Write operation: example 1] and the initial state of [Write operation: example 2]. Specifically, the potential L is supplied to the wiring CL[i] and the wiring CL [i+1] in [Write operation: example 1], and the potential H is supplied to the wiring CL[i] and the wiring CL[i+1] in [Write operation: example 2].

Figure 16:
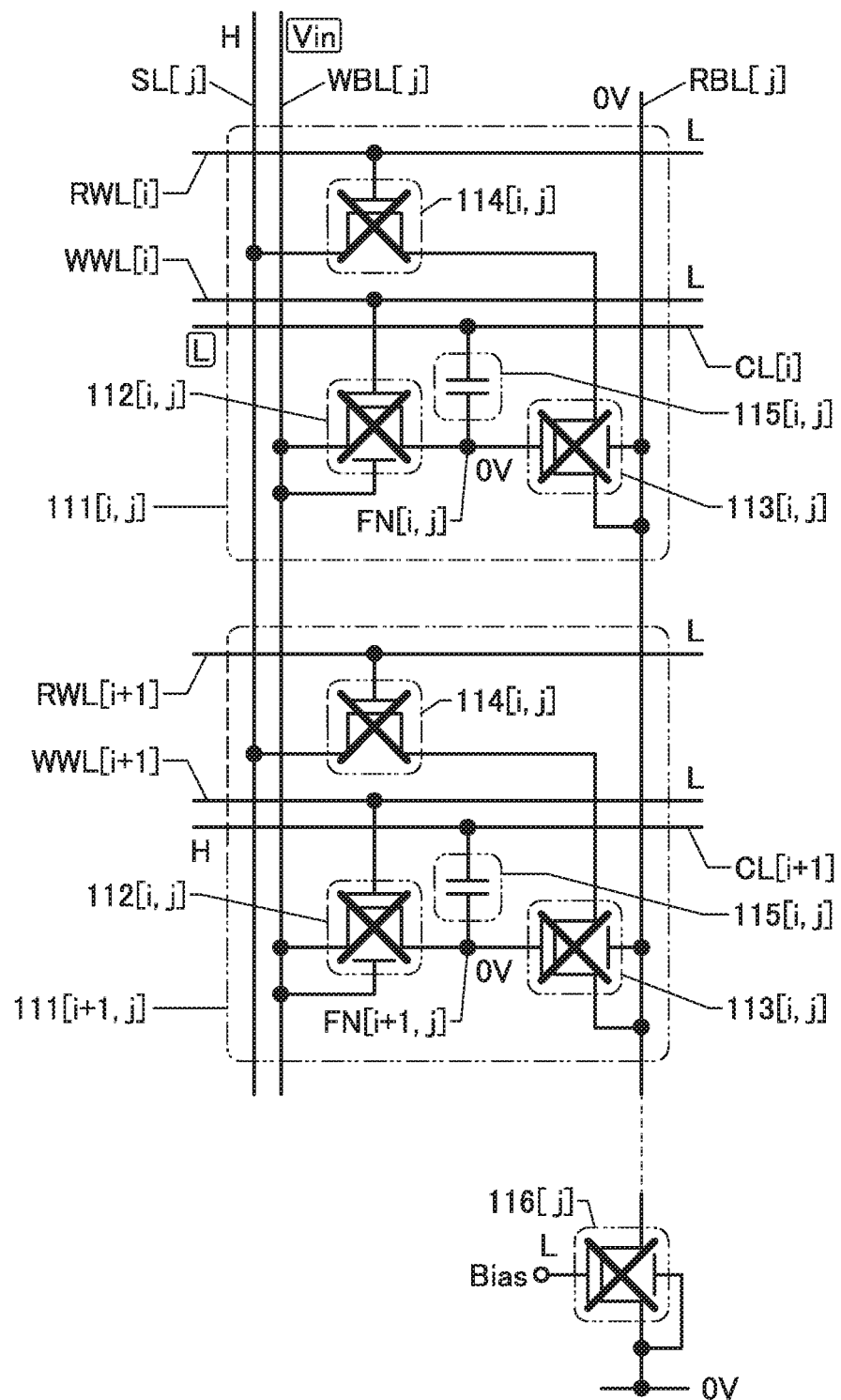
FIG. 16 A drawing illustrating a write operation.

[Period W1' (See FIG. 16)]

In a period W1', the potential $V_{in}$ is supplied to the wiring WBL[j]. The potential L is supplied to the wiring CL[i]. In this period, the potential of the wiring CL of the memory element 111 which is not selected (the memory element 111 in a non-selection period, i.e., the memory elements other than in the i-th row here) is kept at the potential H.

Figure 17:
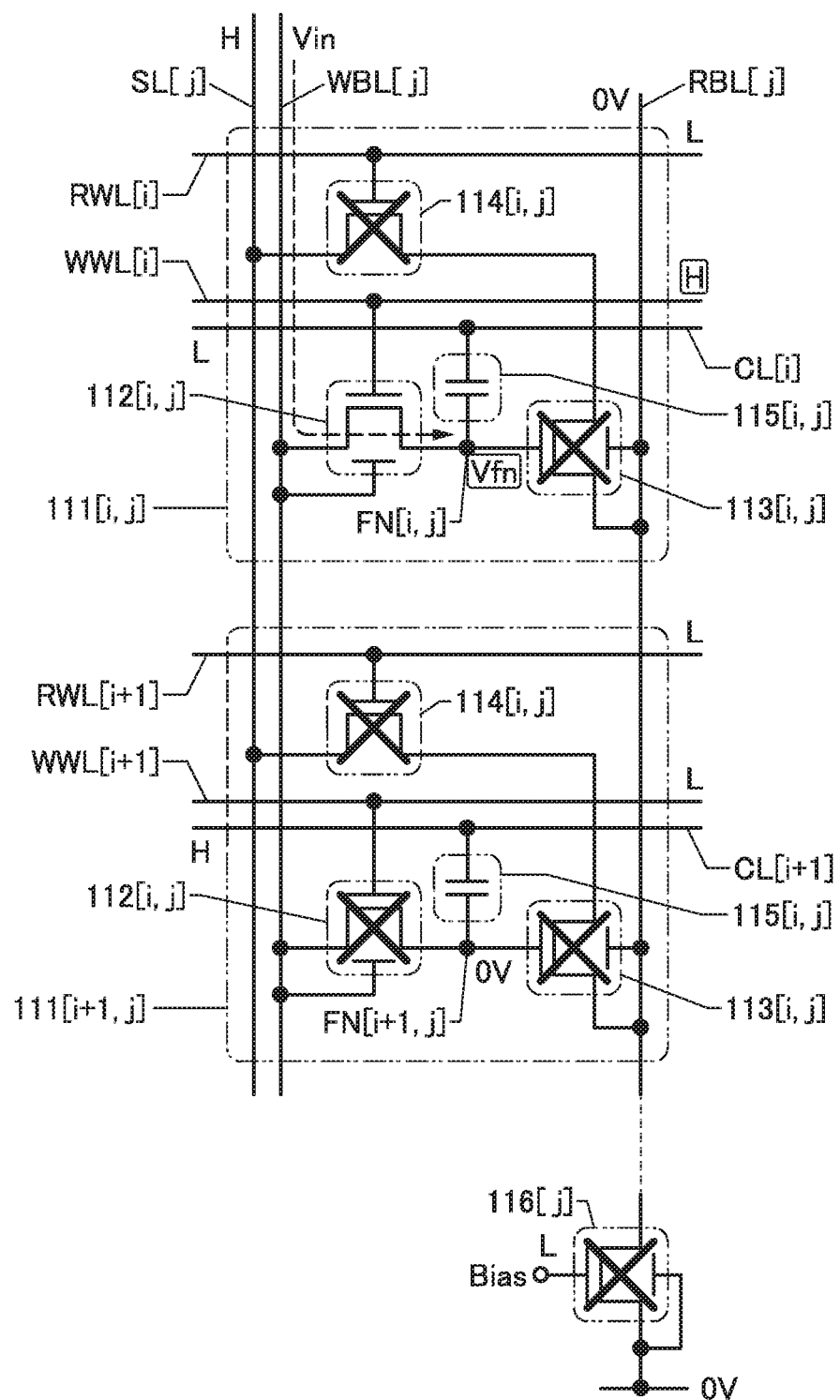
FIG. 17 A drawing illustrating a write operation.

[Period W2' (see FIG. 17)]

In a period W2', the potential H is supplied to the wiring WWL[i]. Thus, the transistor 112 [i,j] is brought into an on state, and the potential of the data retaining portion FN [i,j] is increased, so that the potential $V_{fn}$ is written to the data retaining portion FN [i,j].

Figure 18:
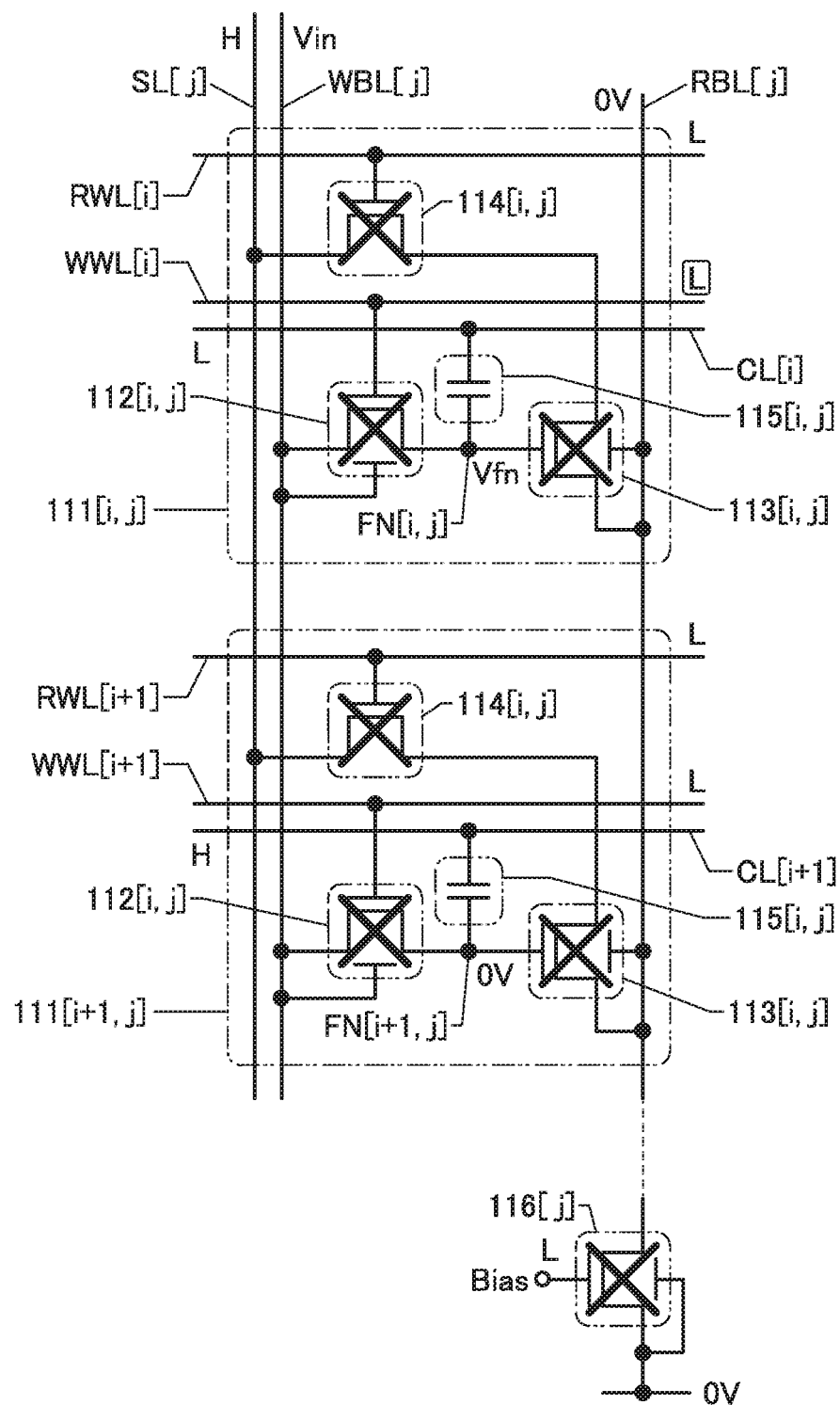
FIG. 18 A drawing illustrating a write operation.

[Period W3' (see FIG. 18)]

In a period W3', the potential L is supplied to the wiring WWL [i]. Then, the transistor 112 [i,j] is brought into an off state and the potential $V_{fn}$ written to the data retaining portion FN [i,j] is retained.

Figure 19:
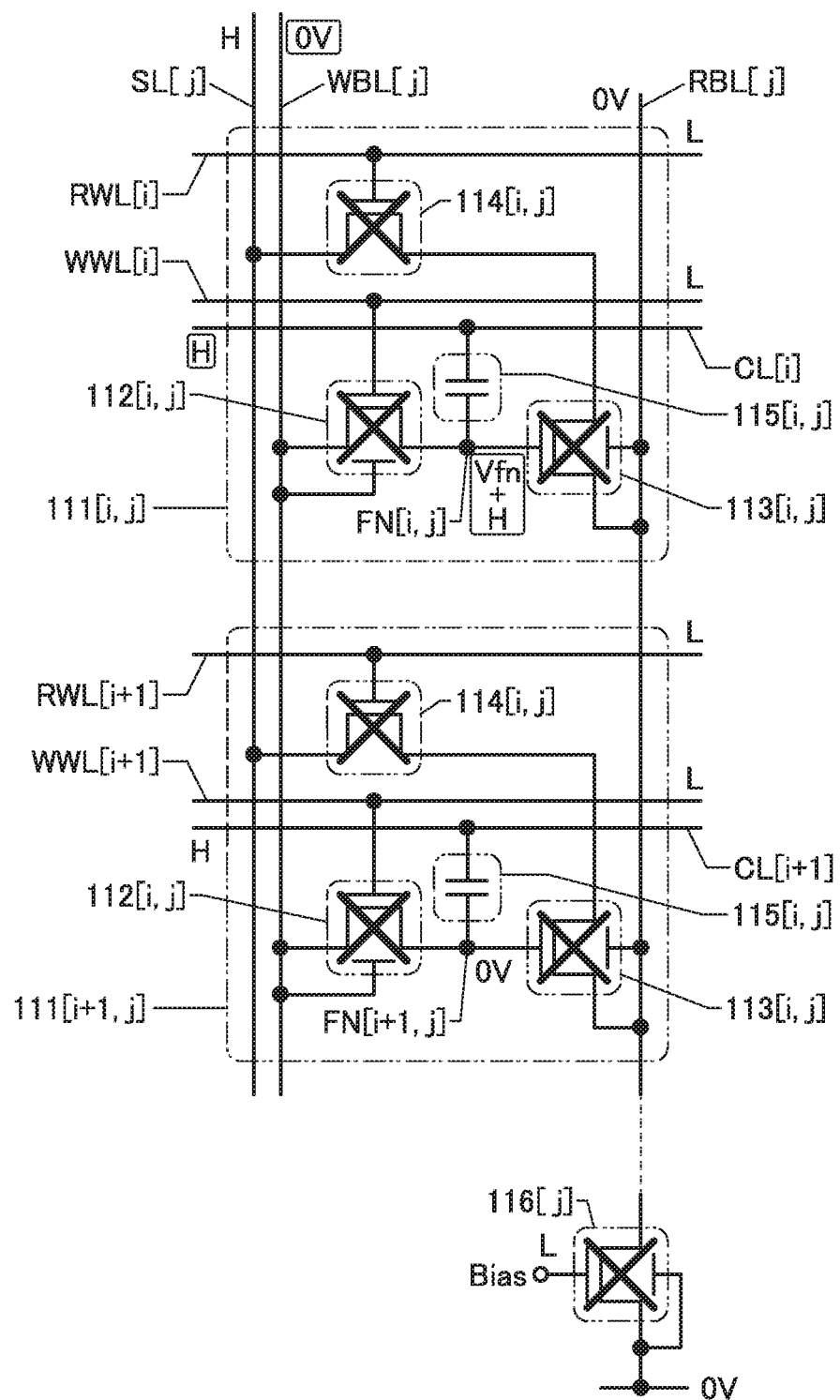
FIG. 19 A drawing illustrating a write operation.

[Period W4' (see FIG. 19)]

In a period W4', 0 V is supplied to the wiring WBL[j]. The potential H is supplied to the wiring CL[i]. After the transistor 112[i,j] is brought into an off state, the potential of the wiring CL[i] is changed from the potential L to the potential H, so that the potential of the data retaining portion FN[i,j] becomes the potential $V_{fn}$+the potential H. Consequently, the back gate potential of the transistor 112[i,j] is relatively negative, so that the potential written to the data retaining portion FN[i,j] can be retained more reliably.

In other words, the potential written to the data retaining portion FN can be retained more reliably and possibility of data loss can be further decreased when the potential of the wiring CL of the memory element 111 in the selection period is the potential L and the potential of the wiring CL of the memory element 111 in the non-selection period is the potential H.

[Period W5' to Period W8']

A period W5' to a period W8' is a period during which data is written to the memory element 111[i+1, j]. For data writing to the memory element 111[i+1,j], "i" in the description of the period W1' to the period W4' can be replaced with "i+1".

Note that the potential of the wiring CLs is set to the potential L or the potential H in [Write operation: example 2]. However, the potential of the wiring CL is higher when the wiring CL is not selected as a target for writing than the potential of the wiring CL when the wiring CL is selected as a target for writing in [Write operation: example 2]. For example, the potential of the wiring CL may be 0 V or the potential H. The smaller the potential change of the wiring CL is, the smaller the power consumption of the memory device 100 becomes.

Read Operation: Example 1

Figure 20:
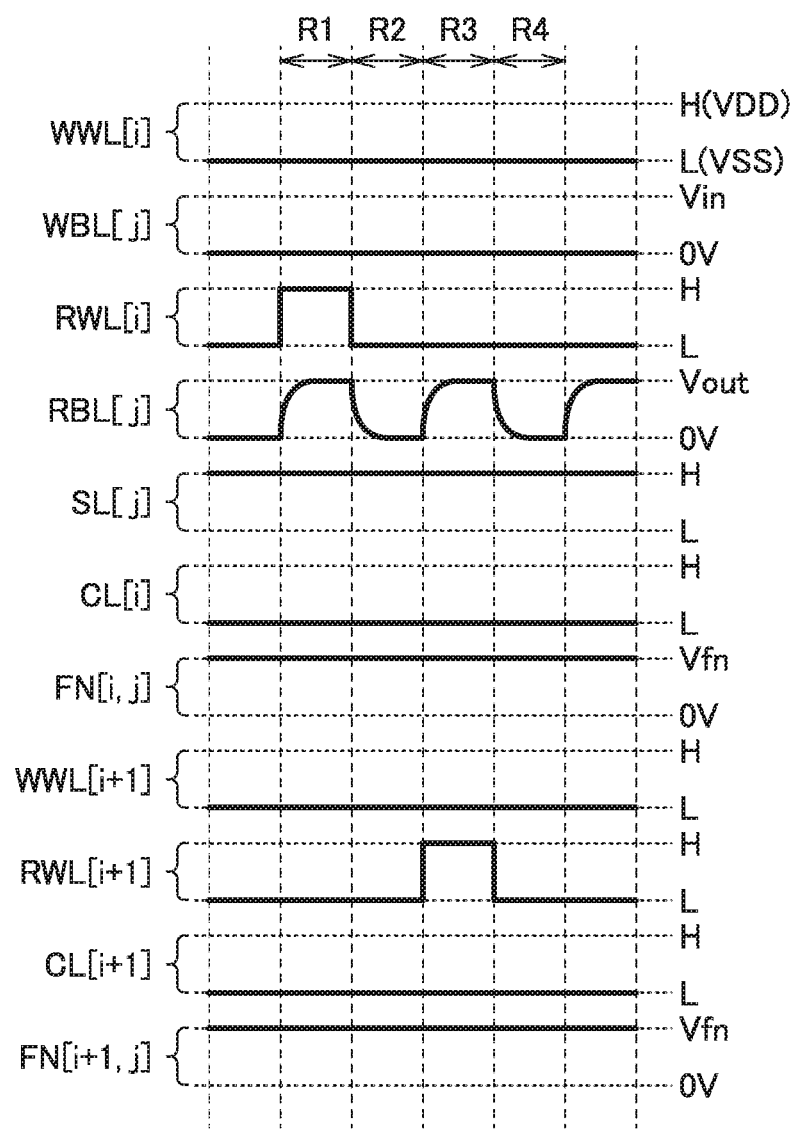
FIG. 20 A timing chart illustrating a read operation.

Next, read operation of data written in [Write operation: example 1] will be described. FIG. 20 is a timing chart illustrating a read operation of the memory element 111[i,j] and the memory element 111[i+1, j]. FIG. 20 shows potential changes of each wiring and the data retaining portion FN.

[Initial State]

Figure 21:
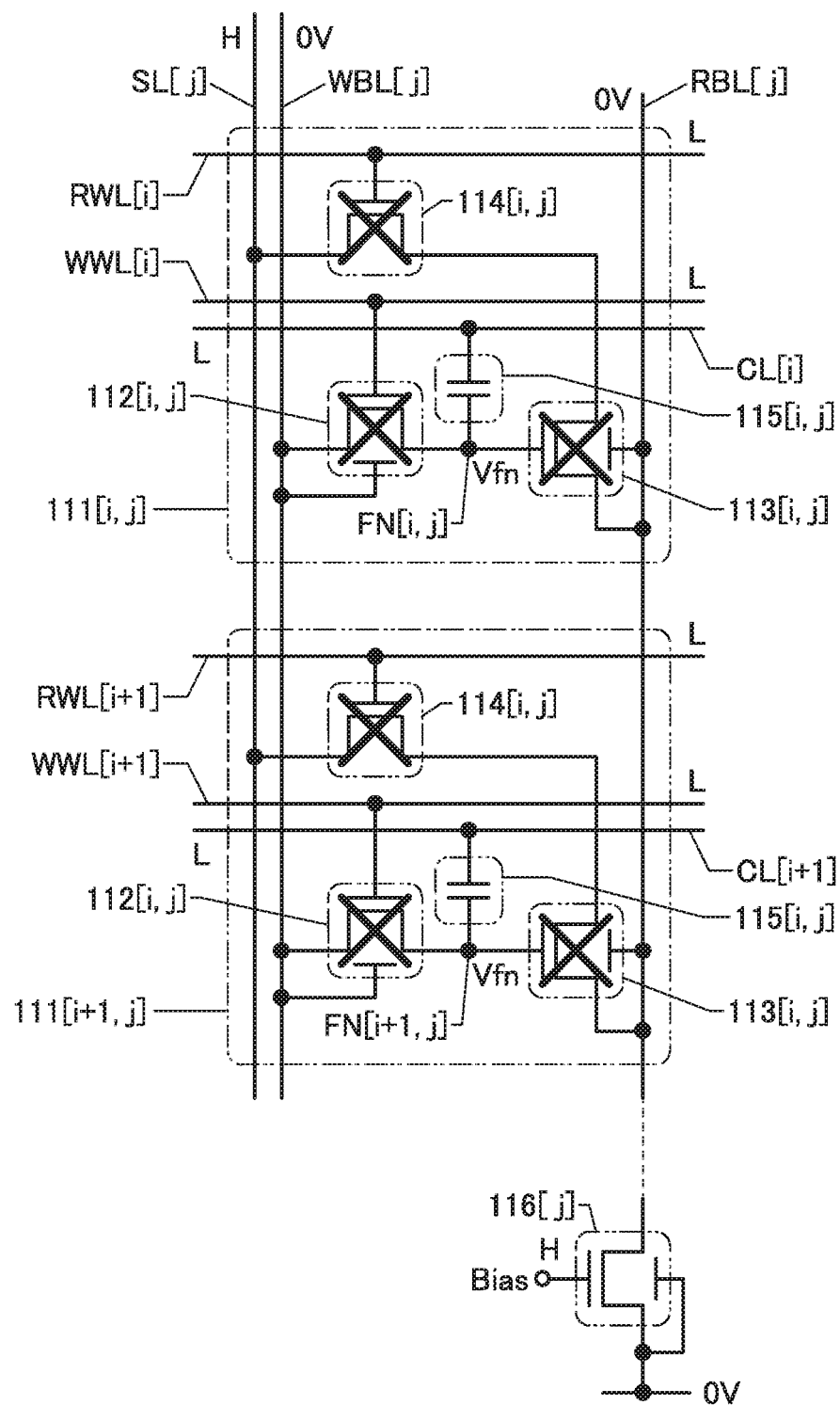
FIG. 21 A drawing illustrating a read operation.

FIG. 21 illustrates the initial states of the memory element 111 [i,j] and the memory element 111[i+1,j]. The potential L is supplied to the wiring WWL[i], the wiring RWL[i], the wiring CL[i], the wiring WWL[i+1], the wiring RWL[i+1], and the wiring CL[i+1], 0 V is supplied to the wiring WBL[j], the potential H is supplied to the wiring SL[j], and $V_{fn}$ is retained in the data retaining portion FN[i,j] and the data retaining portion FN[i+1, j]. The potential H is supplied to the gate of the transistor 116[j], so that the transistor 116[j] is in an on state.

Figure 22:
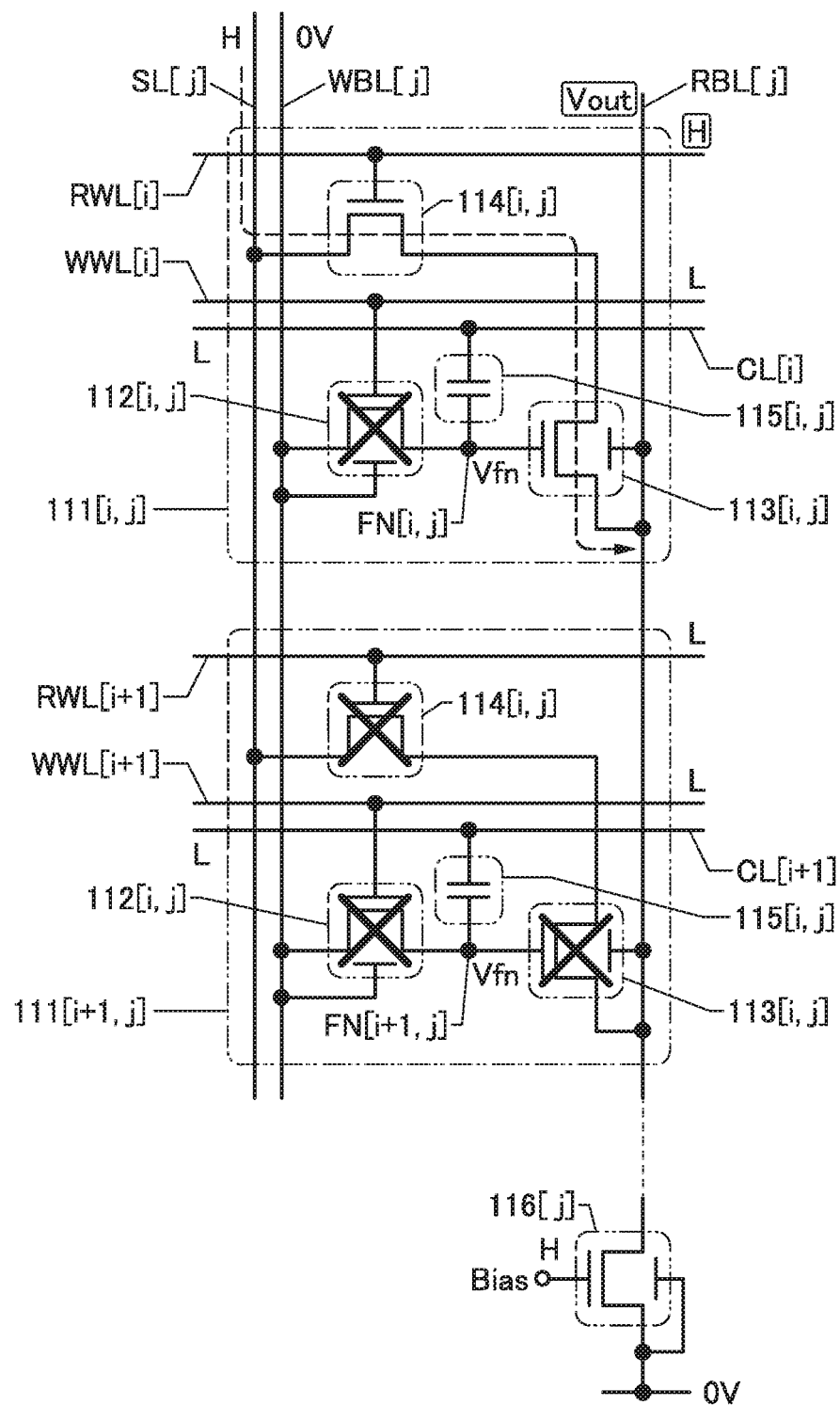
FIG. 22 A drawing illustrating a read operation.

[Period R1 (see FIG. 22)]

In a period R1, the potential H is supplied to the wiring RWL[i]. Then, the transistor 114[i,j] of the memory element 111[i,j] is brought into an on state, and current flows from the wiring SL[j] to the wiring RBL[j] through the transistor 114[i,j] and the transistor 113[i,j].

At this time, since the transistor 113[i,j] and the transistor 116[j] form a source follower, a potential $V_{out}$ of the wiring RBL[j] is set to a potential corresponding to the potential of the data retaining portion FN[i,j]. The data stored (retained) in the memory element 111[i,j] can be known (read) through measuring the potential $V_{out}$.

Figure 23:
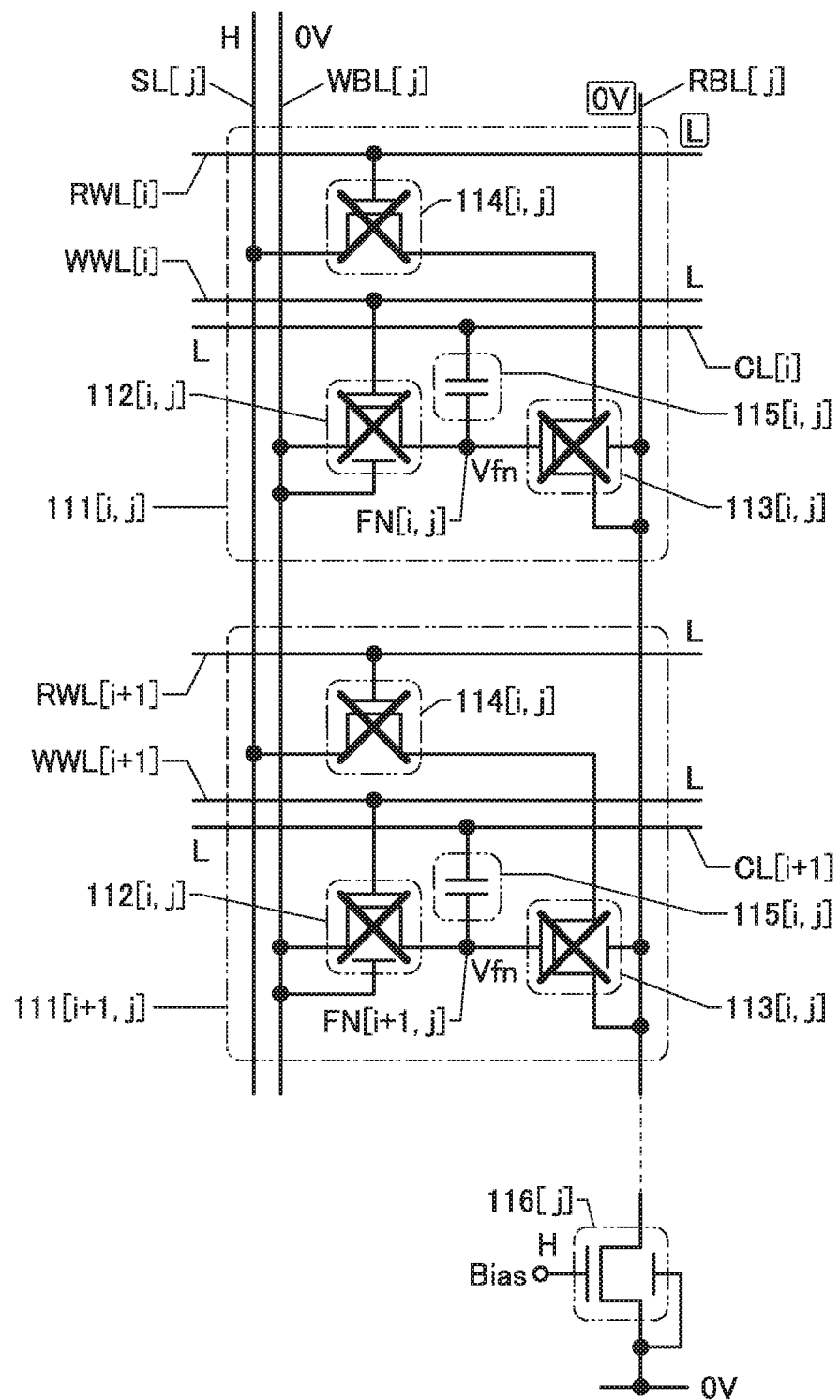
FIG. 23 A drawing illustrating a read operation.

[Period R2 (see FIG. 23)]

In a period R2, the potential L is supplied to the wiring RWL[i]. Then, the transistor 114[i,j] in the memory element 111 [i,j] is brought into an off state, and supply of current from the wiring SL[j] to the wiring RBL[j] is stopped. The potential of the wiring RBL[j] becomes 0 V since the transistor 116[j] is in an on state.

[Period R3, Period R4]

A period R3 to a period R4 is a period during which data is read from the memory element 111[i+1,j]. For data reading from the memory element 111[i+1,j], "i" in the description of the period R1 and the period R2 can be replaced with "i+1".

Read Operation: Example 2

Figure 24:
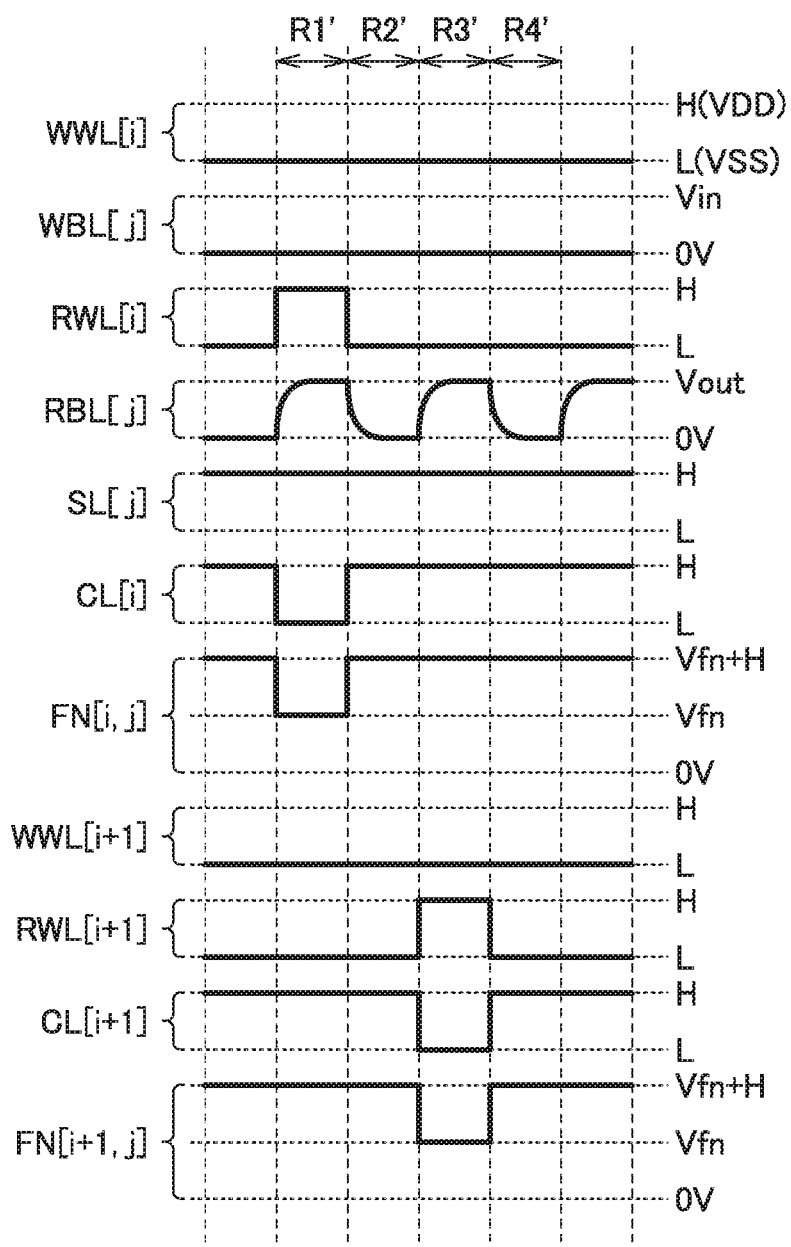
FIG. 24 A timing chart illustrating a read operation.

Next, a read operation of data written in [Write operation: example 2] will be described. FIG. 24 is a timing chart showing a read operation of the memory element 111 [i,j] and the memory element 111 [i+1, j]. FIG. 24 shows a change in potential of each wiring and the data retaining portion FN.

[Initial State]

Figure 25:
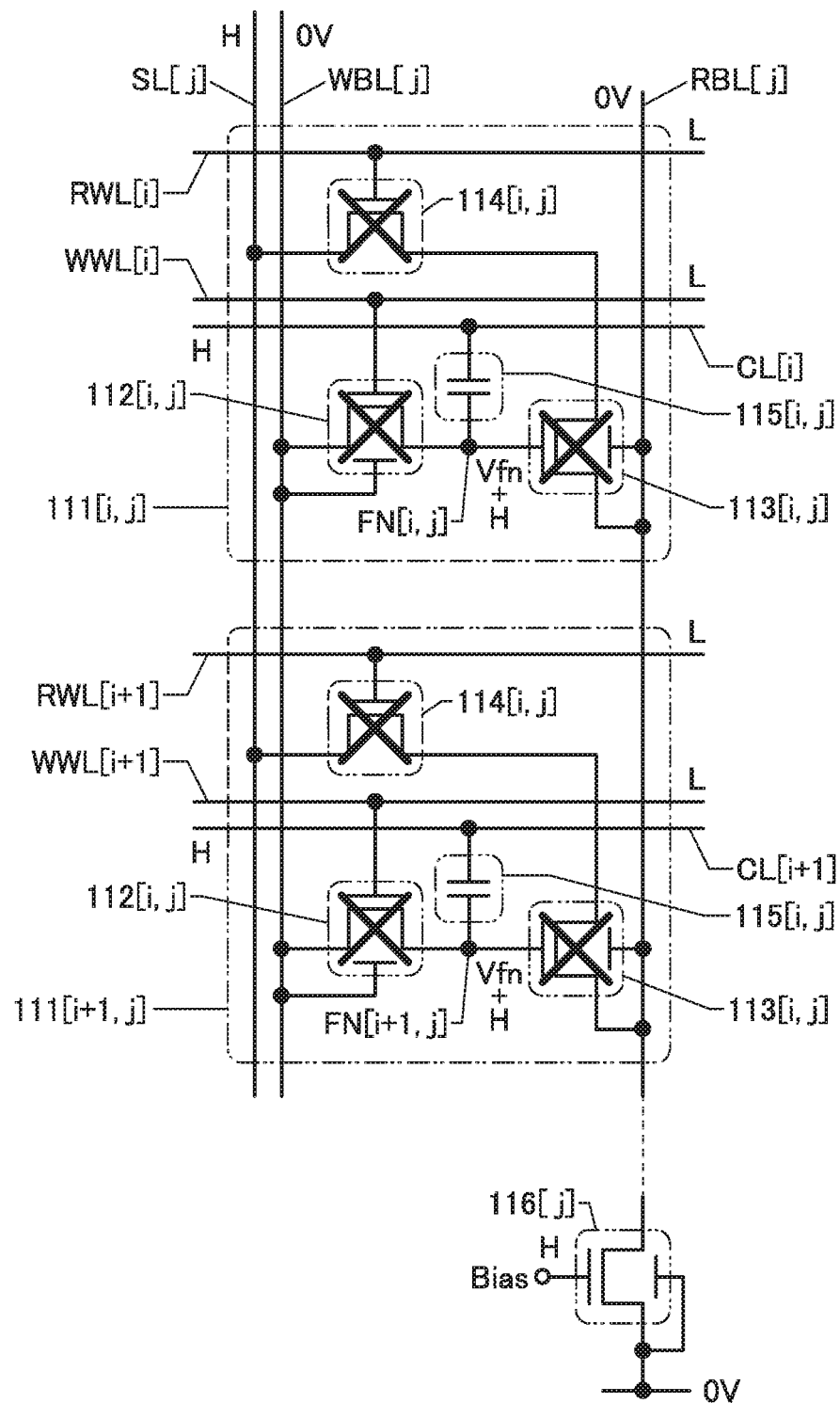
FIG. 25 A drawing illustrating a read operation.

FIG. 25 illustrates the initial states of the memory element 111[i,j] and the memory element 111[i+1,j]. The potential supplied to the wiring CL[i] and the wiring CL[i+1] is different between the initial state of [Read operation: example 1] and the initial state of [Read operation: example 2]. The potentials of the data retaining portions FN[i,j] and FN[i+1, j] are different. Specifically, in [Read operation: example 1], the potential L is supplied to the wiring CL[i] and the wiring CL[i+1], and the potential H is supplied to the wiring CL[i] and the wiring CL[i+1] in [Read operation: example 2]. The potentials of the data retaining portion FN[i,j] and the data retaining portion FN[i+1, j] are the potential $V_{fn}$+the potential H.

Figure 26:
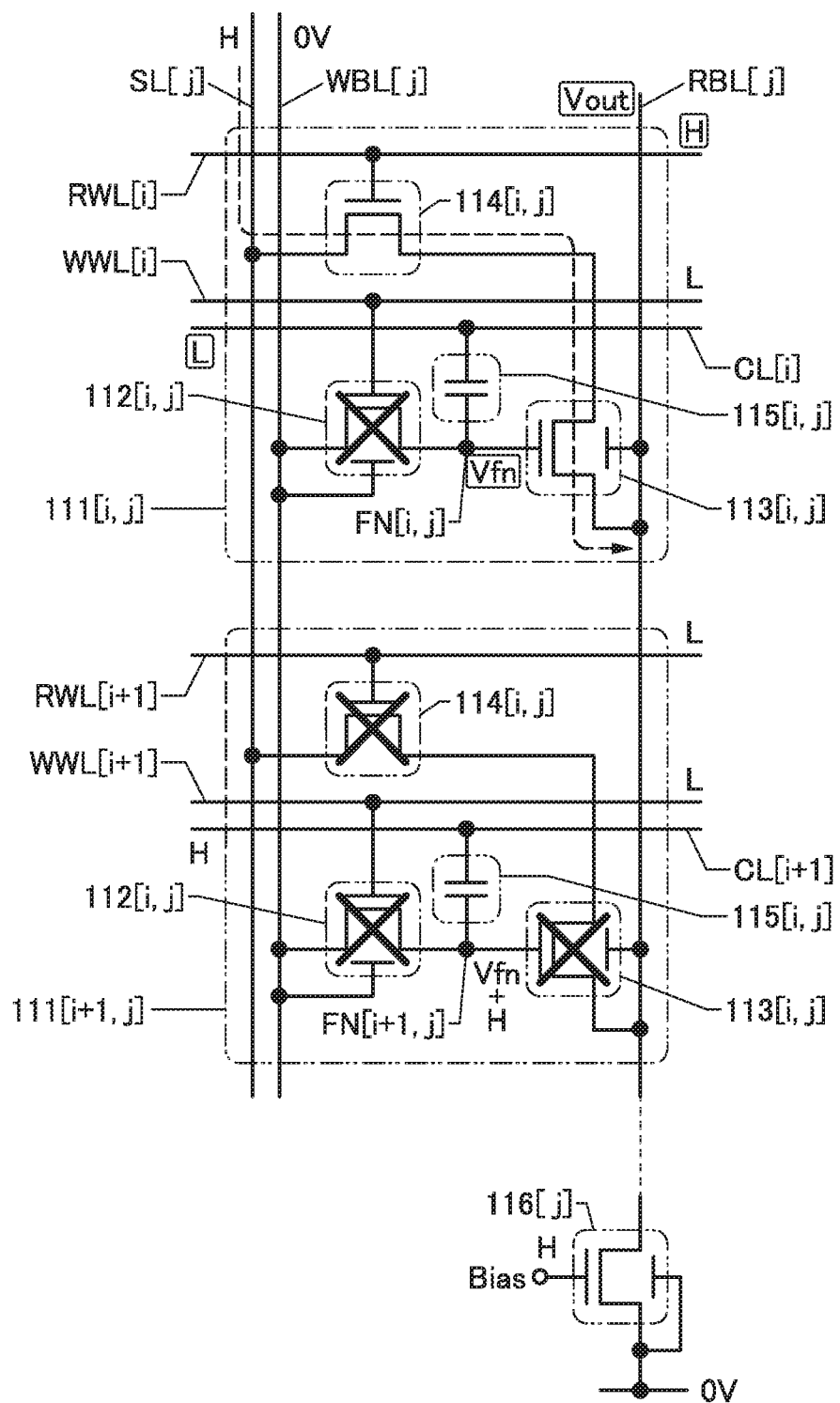
FIG. 26 A drawing illustrating a read operation.

[Period R1' (see FIG. 26)]

In a period R1', the potential H is supplied to the wiring RWL[i] and the potential L is supplied to the wiring CL[i]. Then, the transistor 114[i,j] of the memory element 111[i,j] is brought to be an on state, and current flows from the wiring SL[j] to the wiring RBL[j] through the transistor 114[i,j] and the transistor 113[i,j]. The potential of the data retaining portion FN[i, j] becomes the potential $V_{fn}$.

At this time, since the transistor 113[i,j] and the transistor 116[j] form a source follower, the potential $V_{out}$ of the wiring RBL[j] is set to a potential corresponding to the potential of the data retaining portion FN[i,j]. The data stored (retained) in the memory element 111[i,j] can be known (read) through measuring the potential $V_{out}$.

Note that although the potential of the wiring CL [i] is changed from the potential H to the potential L in the period R1', data can be read while the potential of the CL[i] is kept at the potential H in the period R1'.

Figure 27:
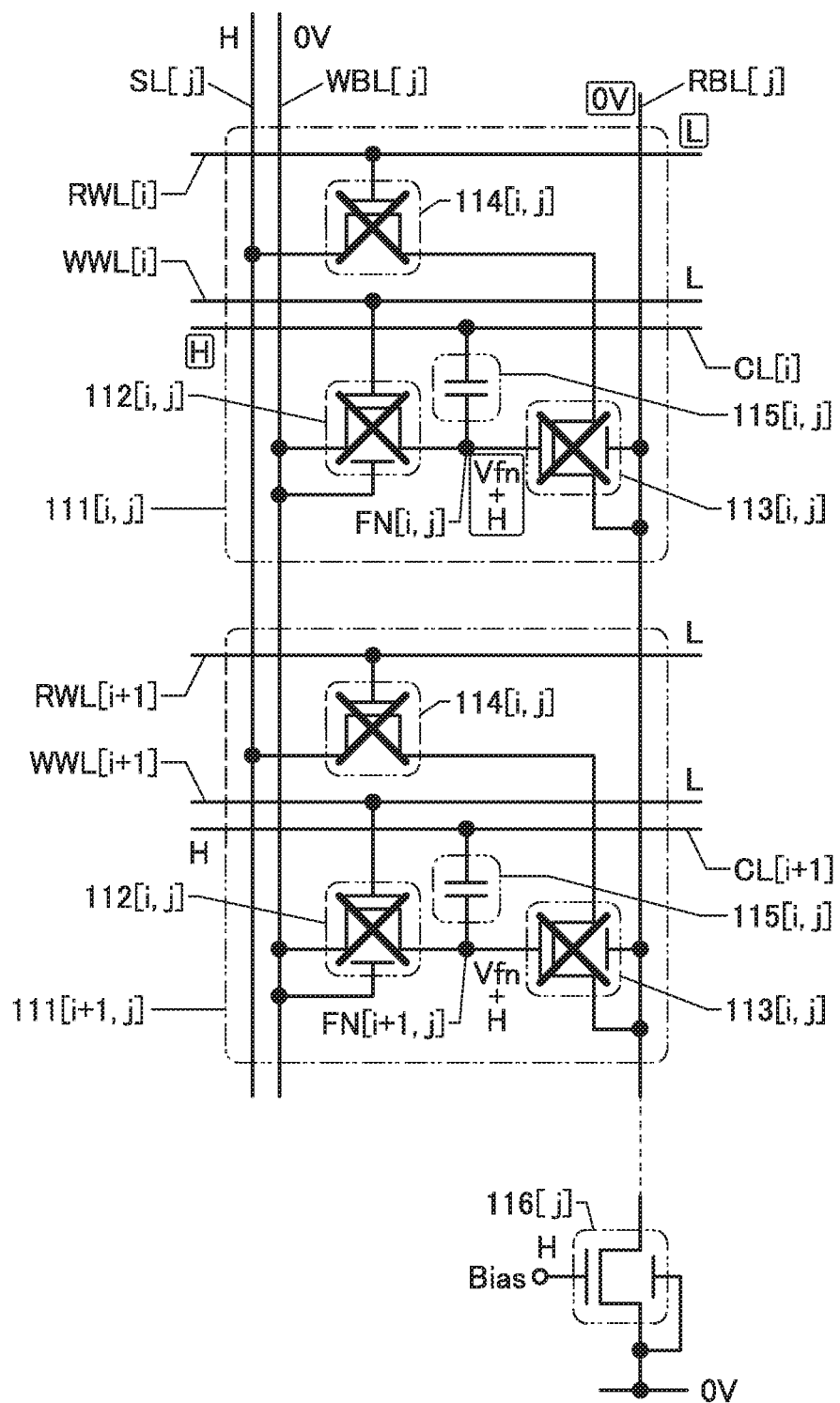
FIG. 27 A drawing illustrating a read operation.

[Period R2' (see FIG. 27)]

In a period R2', the potential L is supplied to the wiring RWL [i] and the potential H is supplied to the wiring CL [i]. Then, the transistor 114 [i,j] of the memory element 111 [i,j] is brought to be an off state, and current supply from the wiring SL [j] to the wiring RBL [j] is stopped. The potential of the wiring RBL [j] becomes 0 V since the transistor 116 [j] is in an on state. The potential of the data retaining portion FN [i,j] becomes the potential $V_{fn}$+the potential H.

[Period R3', period R4']

A period R3' to a period R4' is a period during which data is read from the memory element 111[i+1, j]. For data reading from the memory element 111[i+1,j], "i" in the description of the period R1' and the period R2' can be replaced with "i+1".

This embodiment can be implemented in an appropriate combination with any of the configurations described in the other embodiments and the like.

Embodiment 3

In this embodiment, a transistor 200 will be described as an example of a transistor that can be used in the semiconductor device of one embodiment of the present invention.

Structure Example of Transistor

Figure 28A:
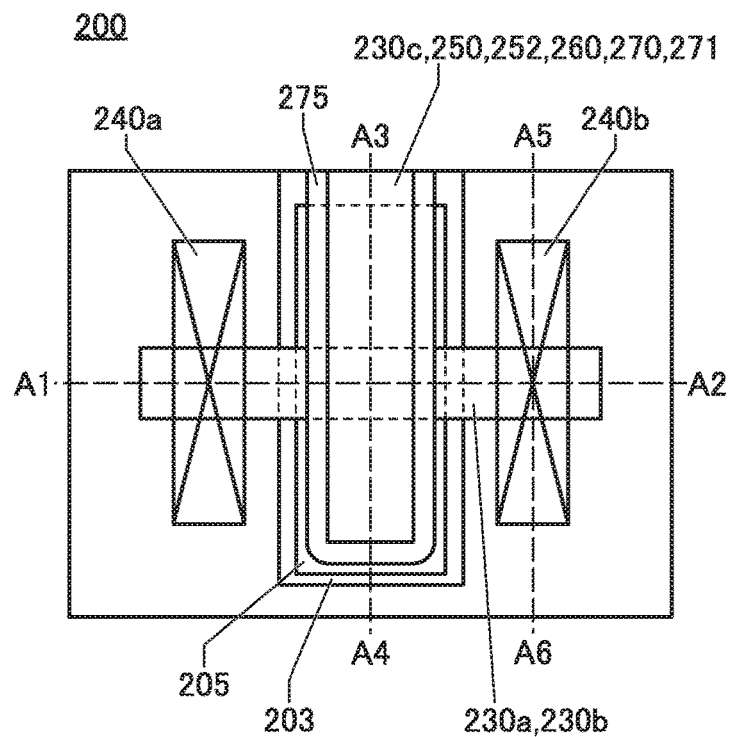
FIG. 28 Drawings illustrating a transistor.
Figure 28C:
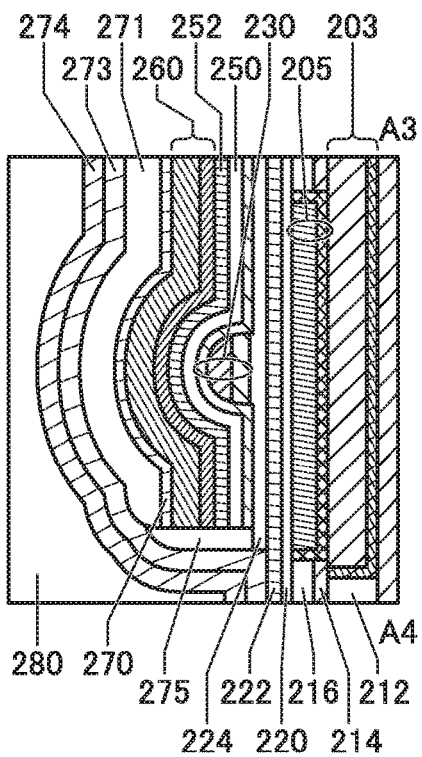
Figure 28B:
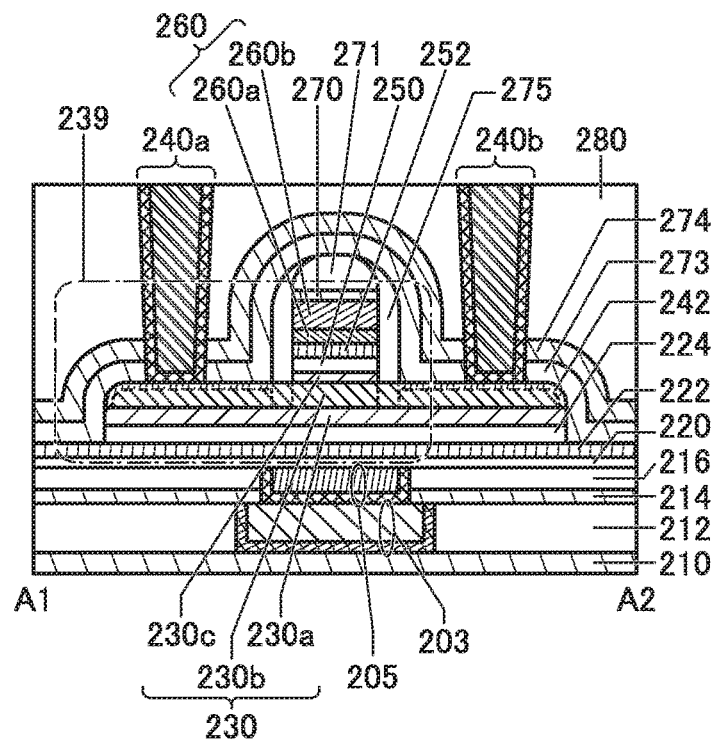
Figure 28D:
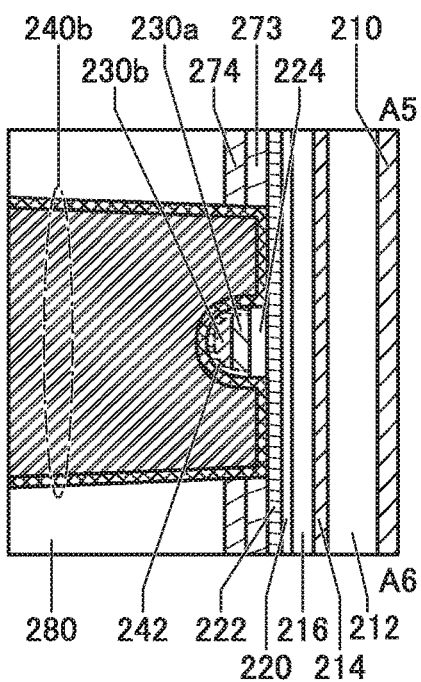

FIG. 28(A) is a top view of the transistor 200 and around the transistor 200. FIG. 28(B) is a cross-sectional view taken along a dashed-dotted line A1-A2 in FIG. 28(A), which corresponds to a cross-sectional view in the channel length direction of the transistor 200. FIG. 28(C) is a cross-sectional view taken along a dashed-dotted line A3-A4 in FIG. 28(A), which corresponds to a cross-sectional view in the channel width direction of the transistor 200. FIG. 28(D) is a cross-sectional view taken along a dashed-dotted line A5-A6 in FIG. 28(A), which corresponds to a cross-sectional view of a source region or a drain region of the transistor 200. Note that for simplification of the drawing, some components are not illustrated in the top view in FIG. 28(A).

FIG. 28(A), FIG. 28(B), FIG. 28(C), and FIG. 28(D) can be regarded as a top view and cross-sectional views of the semiconductor device including the transistor 200. The semiconductor device including the transistor 200 described in this embodiment includes the transistor 200 and an insulator 210, an insulator 212, and an insulator 280 that function as interlayer insulating films. The semiconductor device also includes a conductor 203 functioning as a wiring and a conductor 240a and a conductor 240b functioning as plugs; the conductor 203, the conductor 240a, and the conductor 240b are electrically connected to the transistor 200.

The conductor 203 includes a first conductor and a second conductor. The first conductor is formed in contact with an inner wall of an opening provided in the insulator 212, and the second conductor is provided inward from the first conductor. The top surfaces of the conductor 203 and the insulator 212 can be substantially level with each other. Although the conductor 203 has a two-layer stacked structure consisting of the first conductor and the second conductor in this embodiment, the present invention is not limited thereto. For example, the conductor 203 may have a single-layer structure or a stacked-layer structure of three or more layers. Note that in the case where a structure body has a stacked-layer structure, the layers may be distinguished by ordinal numbers corresponding to the formation order in this embodiment.

The conductor 240a and the conductor 240b are each formed in contact with an inner wall of an opening provided in the insulator 280. The top surface of the conductors 240 can be set at substantially the same level as the top surface of the insulator 280. Although the conductor 240a and the conductor 240b are described as a two-layer stacked structure in this embodiment, the present invention is not limited thereto. For example, the conductor 240a and the conductor 240b may have a single-layer structure or a stacked-layer structure of three or more layers.

As illustrated in FIG. 28, the transistor 200 includes an insulator 214 and an insulator 216 positioned over a substrate (not illustrated), a conductor 205 positioned to be embedded in the insulator 214 and the insulator 216, an insulator 220 positioned over the insulator 216 and the conductor 205, an insulator 222 positioned over the insulator 220, an insulator 224 positioned over the insulator 222, an oxide 230 (an oxide 230a, an oxide 230b, and an oxide 230c) positioned over the insulator 224, an insulator 250 positioned over the oxide 230, a metal oxide 252 positioned over the insulator 250, a conductor 260 (a conductor 260a and a conductor 260b) positioned over the metal oxide 252, an insulator 270 positioned over the conductor 260, an insulator 271 positioned over the insulator 270, an insulator 275 positioned in contact with at least the side surfaces of the oxide 230c, the insulator 250, the metal oxide 252, and the conductor 260, a layer 242 positioned over the oxide 230, an insulator 273 positioned over the layer 242, and an insulator 274 positioned over the insulator 273.

Although the oxide 230 is described as having a three-layer stacked structure of the oxide 230a, the oxide 230b, and the oxide 230c, the present invention is not limited thereto. For example, the oxide 230 may have a single-layer structure of the oxide 230b, a two-layer stacked structure of the oxide 230b and the oxide 230a, a two-layer stacked structure of the oxide 230b and the oxide 230c, or a stacked-layer structure of four or more layers. Moreover, although the conductor 260 is described as having a two-layer stacked structure of the conductor 260a and the conductor 260b in this embodiment, the present invention is not limited thereto. The conductor 260 may have a single-layer structure or a stacked-layer structure of three or more layers.

In the transistor 200, the oxide 230 (the oxide 230a, the oxide 230b, and the oxide 230c), which includes a region where a channel is formed (also referred to as a channel formation region) is preferably formed using a metal oxide functioning as an oxide semiconductor (hereinafter also referred to as an oxide semiconductor).

The transistor 200 including an oxide semiconductor in its channel formation region has an extremely low leakage current in an non-conducting state; thus, a semiconductor device with low power consumption can be provided. An oxide semiconductor can be deposited by a sputtering method or the like, and thus can be used for the transistor 200 constituting a highly integrated semiconductor device.

For example, as the oxide 230, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used. Furthermore, for the oxide 230, an In—Ga oxide or an In—Zn oxide may be used.

In addition to the constituent element of the oxide semiconductor, the oxide semiconductor contains a metal element such as aluminum, ruthenium, titanium, tantalum, chromium, or tungsten, whereby the oxide semiconductor forms a metal compound to have reduced resistance. Note that aluminum, titanium, tantalum, tungsten, or the like is preferably used.

To add the metal element to the oxide semiconductor, for example, a metal film containing the metal element, a nitride film containing the metal element, or an oxide film containing the metal element is provided over the oxide semiconductor. By providing the film, some oxygen in the interface of the film and the oxide semiconductor or in the oxide semiconductor in the vicinity of the interface may be absorbed into the film or the like and an oxygen vacancy may be formed, so that the resistance in the vicinity of the interface may be reduced.

After the metal film, the nitride film containing the metal element, or the oxide film containing the metal element is provided over the oxide semiconductor, heat treatment is preferably performed in an atmosphere containing nitrogen. By performing the heat treatment in an atmosphere containing nitrogen, the metal element in the metal film, the nitride film containing the metal element, or the oxide film containing the metal element diffuses into the oxide semiconductor, or the metal element in the oxide semiconductor diffuses into the film, whereby the oxide semiconductor forms a metal compound with the film to have reduced resistance. When the oxide semiconductor and the metal element form a metal compound, the metal element added to the oxide semiconductor becomes relatively stable; therefore, a highly reliable semiconductor device can be provided.

At the interface between the oxide semiconductor and the metal film, the nitride film containing the metal element, or the oxide film containing the metal element, another layer may be formed. Note that the another layer includes a metal compound containing a component of the metal film, the nitride film containing the metal element, or the oxide film containing the metal element and a component of the oxide semiconductor. For example, as the another layer, a layer where the metal element of the oxide semiconductor and the metal element added are alloyed may be formed. Being alloyed, the metal element becomes relatively stable, so that a highly reliable semiconductor device can be provided.

In the case where hydrogen in the oxide semiconductor diffuses into a low-resistance region of the oxide semiconductor and enters an oxygen vacancy in the low-resistance region, the hydrogen becomes relatively stable. It is known that hydrogen in the oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor or a region where the metal compound is formed tends to be further reduced, and the oxide semiconductor whose resistance is not reduced tends to be highly purified (reduction of impurities such as water or hydrogen) and the resistance tends to be increased.

The oxide semiconductor has an increased carrier density when it contains an impurity element such as hydrogen or nitrogen. Hydrogen in the oxide semiconductor reacts with oxygen, which is bonded to a metal atom, to be water, and thus forms an oxygen vacancy in some cases. Entry of hydrogen into the oxygen vacancy increases carrier density. Furthermore, in some cases, part of hydrogen is bonded to oxygen, which is bonded to a metal atom, whereby an electron serving as a carrier is generated. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be formed in the oxide semiconductor. In other words, when the resistance of the oxide 230 is selectively reduced, a region functioning as a semiconductor having a low carrier density and low-resistance regions functioning as the source region or the drain region can be formed in the island-shaped oxide 230.

Figure 29:
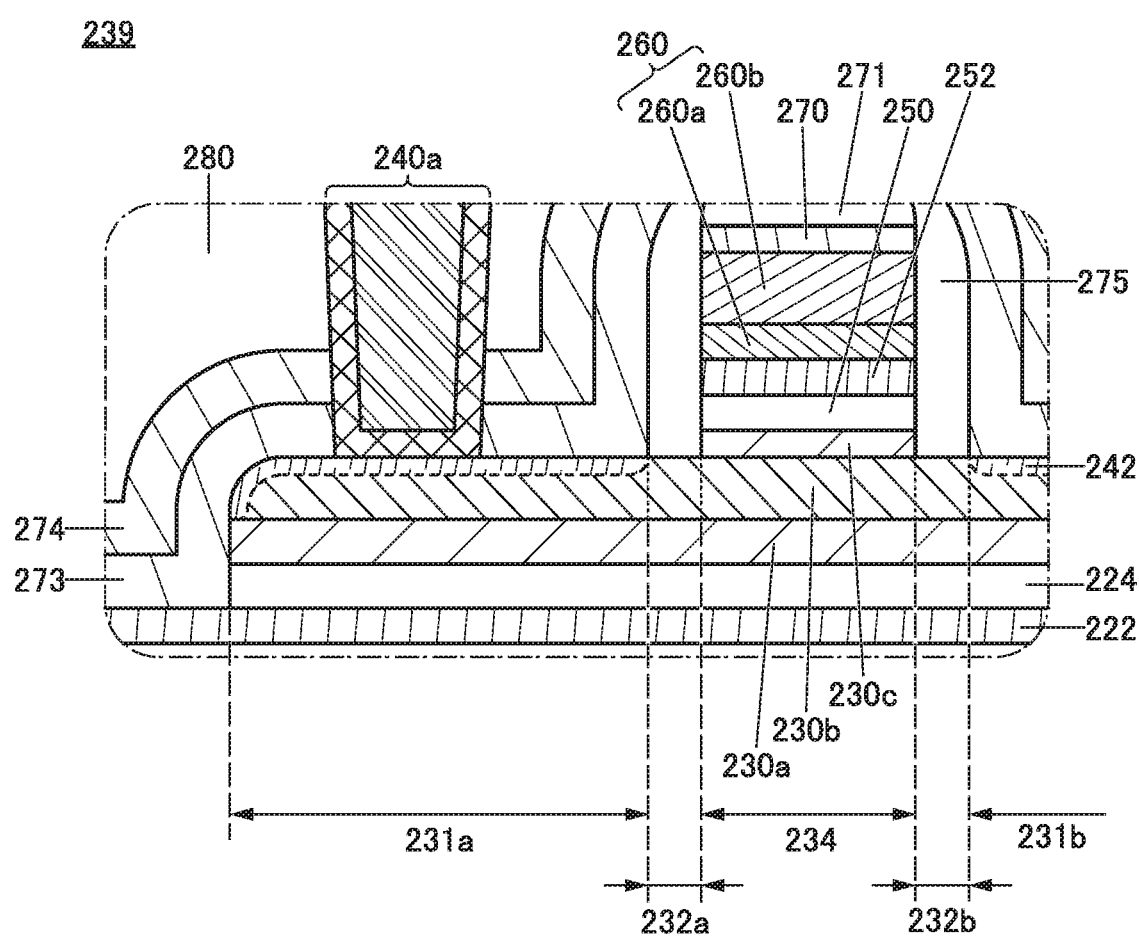
FIG. 29 A drawing illustrating a transistor.

FIG. 29 is an enlarged view illustrating a region 239 including the oxide 230b whose resistance is selectively reduced, which is surrounded by a dashed-dotted line in FIG. 28(B).

As illustrated in FIG. 29, the oxide 230 includes a region 234 functioning as a channel formation region of the transistor, a region 231 (a region 231a and a region 231b) functioning as a source region and a drain region, and a region 232 (a region 232a and a region 232b) provided between the region 234 and the region 231.

The region 231 functioning as the source region or the drain region has a low oxygen concentration and reduced resistance. The region 234 functioning as the channel formation region is a high-resistance region having a higher oxygen concentration and a lower carrier density than the region 231 functioning as the source region or the drain region. The region 232 has a higher oxygen concentration and a lower carrier density than the region 231 functioning as the source region or the drain region and has a lower oxygen concentration and a higher carrier density than the region 234 functioning as the channel formation region.

The concentration of at least one of a metal element and an impurity element such as hydrogen and nitrogen in the region 231 is preferably higher than that in each of the region 232 and the region 234.

For example, in addition to the oxide 230, the region 231 preferably contains one or more of metal elements selected from aluminum, ruthenium, titanium, tantalum, tungsten, chromium, and the like.

In order to form the region 231, for example, a layer 242 containing the metal element may be formed in contact with the region 231 of the oxide 230. Note that as the layer 242, the metal film, the oxide film containing the metal elements, or the nitride film containing the metal elements can be used. In that case, the another layer may be formed at the interface between the layer 242 and the oxide 230. Note that in FIG. 28 and FIG. 29, the another layer is a layer including a metal compound having an element of the layer 242 and an element of the oxide 230. For example, as the another layer, a layer in which the metal element of the oxide 230 and the metal element added are alloyed may be formed.

Addition of the metal element to the oxide 230 can form a metal compound in the oxide 230 and the resistance of the region 231 can be reduced. Note that the metal compound is not necessarily formed in the oxide 230. For example, a metal compound may be formed in the layer 242. Alternatively, the metal compound may be formed on the surface of the oxide 230, on the surface of the layer 242, or in the another layer formed at the interface between the layer 242 and the oxide 230.

Thus, the region 231 may include the low-resistance region of the layer 242 or the low-resistance region of the another layer formed between the layer 242 and the oxide 230. In other words, in this specification and the like, a region functioning as a source region or a drain region is the region 231.

The region 232 includes a region overlapping with the insulator 275. The concentration of at least one of metal elements such as aluminum, ruthenium, titanium, tantalum, tungsten, and chromium and impurity elements such as hydrogen and nitrogen in the region 232 is preferably higher than that in the region 234. For example, when the layer 242 of the metal film, the oxide film containing the metal element, or the nitride film containing the metal element is provided in contact with the region 231 of the oxide 230, the element in the layer 242 and the element in the oxide semiconductor may form a metal compound. The metal compound attracts hydrogen contained in the oxide 230 in some cases. Thus, the hydrogen concentration of the region 232 in the vicinity of the region 231 may be increased.

One or both of the region 232a and the region 232b may have a region overlapping with the conductor 260.

Although the region 234, the region 231, and the region 232 are formed in the oxide 230b in FIG. 29, the present invention is not limited thereto. For example, these regions may be formed in the layer 242, in the another layer formed between the layer 242 and the oxide 230, in the oxide 230a, and in the oxide 230c. Although the boundaries between the regions are illustrated as being substantially perpendicular to the top surface of the oxide 230 in FIG. 29, this embodiment is not limited thereto. For example, the region 232 may project to the conductor 260 side in the vicinity of the surface of the oxide 230b, and the region 232 may recede to the conductor 240a or 240b side in the vicinity of the bottom surface of the oxide 230b.

In the oxide 230, the boundaries between the regions are difficult to be clearly observed in some cases. The concentration of a metal element and impurity elements such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

In order to selectively reduce the resistance of the oxide 230, at least one of metal elements that increase conductivity such as aluminum, ruthenium, titanium, tantalum, tungsten, and chromium and an impurity is added to a desired region. As the impurity, an element that forms an oxygen vacancy, an element trapped by an oxygen vacancy, or the like may be used. Examples of the element include hydrogen, boron, carbon, nitrogen, fluorine, phosphorus, sulfur, chlorine, and a rare gas. Typical examples of the rare gas element are helium, neon, argon, krypton, and xenon.

When the content of the metal element that increases conductivity, the element that forms an oxygen vacancy, and the element trapped by an oxygen vacancy in the region 231 is increased, the carrier density is increased and the resistance can be reduced.

In order to reduce the resistance of the region 231, for example, the layer 242 is formed in contact with the region 231 of the oxide 230. As the layer 242, the metal film, the oxide film containing the metal element, the nitride film containing the metal element, or the like can be used.

When the oxide 230 and the layer 242 are in contact with each other, an element of the layer 242 and an element of the oxide 230 form a metal compound, whereby the region 231 are formed and the resistance decreases. Oxygen in the oxide 230 positioned at or in the vicinity of the interface between the oxide 230 and the layer 242 is partly absorbed in the layer 242; thus, an oxygen vacancy is formed in the oxide 230 and the region 231 with a reduced resistance is formed, in some cases.

Heat treatment is preferably performed in an atmosphere containing nitrogen in the state where the oxide 230 is in contact with the layer 242. With the heat treatment, the metal element which is an element of the layer 242 is diffused from the layer 242 into the oxide 230, the metal element which is an element of the oxide 230 is diffused into the layer 242, and the oxide 230 and the layer 242 form a metal compound to have low resistance. Note that the metal element of the oxide 230 may be alloyed with the metal element of the layer 242. When the metal element of the oxide 230 and the metal element of the layer 242 are alloyed, the metal elements become comparatively stable; thus a highly reliable semiconductor device can be provided.

In the case where hydrogen in the oxide 230 diffuses into the region 231 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by the heat treatment, the resistance of the region 231 is further reduced, and the region 234 is highly purified (reduction of impurities such as water or hydrogen) and the resistance of the region 234 is further increased.

In contrast, since regions (the region 234 and the region 232) of the oxide 230 overlapping with the conductor 260 and the insulator 275 are covered by the conductor 260 and the insulator 275, addition of a metal element to the regions is prevented. Furthermore, oxygen atoms in the oxide 230 are prevented from being absorbed into the layer 242 in the region 234 and the region 232 of the oxide 230.

An oxygen vacancy is sometimes formed in the region 231 and the region 232 due to absorption of oxygen in the region 231 of the oxide 230 and the region 232 of the oxide 230 adjacent to the region 231 into the layer 242. Entry of hydrogen in the oxide 230 to the oxygen vacancy increases the carrier density of the region 231 and the region 232. Therefore, the resistance of the region 231 and the region 232 of the oxide 230 becomes low.

In the case where the layer 242 has a property of absorbing hydrogen, hydrogen in the oxide 230 is absorbed into the layer. Thus, hydrogen, which is an impurity in the oxide 230, can be reduced. The layer 242 may be removed with hydrogen absorbed from the oxide 230 in a later step.

The layer 242 is not necessarily removed. For example, in the case where the layer 242 is oxidized to be an insulator and has high resistance through oxygen absorbed from the oxide 230, the layer 242 can remain. In this case, the layer 242 may function as an interlayer film.

For example, in the case where a region having conductivity remains in the layer 242, heat treatment in an oxidization atmosphere oxidizes the layer 242, whereby the layer 242 becomes a high-resistant insulator. The layer 242 that remains as an insulator can function as an interlayer film. In the case where the structure is employed, the layer 242 is formed to have a thickness that can be made to be an insulator in a later step. For example, the layer 242 may be formed to have a thickness of greater than or equal to 0.5 nm and less than or equal to 5 nm, preferably greater than or equal to 1 nm and less than or equal to 2 nm.

A transistor formed using an oxide semiconductor is likely to have its electrical characteristics changed by impurities and oxygen vacancies in a channel formation region of the oxide semiconductor, which may affect the reliability. Moreover, if the channel formation region of the oxide semiconductor includes oxygen vacancies, the transistor tends to have normally-on characteristics. Thus, oxygen vacancies in the region 234 where a channel is formed are preferably reduced as much as possible.

As illustrated in FIG. 29, the insulator 275 containing excess oxygen is preferably provided in contact with the insulator 250, the region 232 of the oxide 230b, and the oxide 230c. Note that "excess oxygen" is oxygen released from an insulator, a conductor, or the like through heat treatment. When an insulator containing excess oxygen is used as the insulator 275, oxygen contained in the insulator 275 diffuses into the region 234 of the oxide 230, so that oxygen vacancies in the region 234 of the oxide 230 can be reduced.

In part of the insulator 275, an excess oxygen region may be provided. In order to provide an excess oxygen region in the insulator 275, an oxide is preferably formed by a sputtering method for the insulator 273 in contact with the insulator 275. The oxide formed by a sputtering method can be an insulator containing few impurities such as water or hydrogen. Deposition by a sputtering method is preferably performed with use of a facing-target sputtering apparatus, for example. The facing-target sputtering apparatus is preferably used because deposition can be performed without exposing a deposition surface to a high electric field region between facing targets; the film-formation surface is less likely to be damaged due to plasma; thus, deposition damage on the oxide 230 during the deposition of the insulator to be the insulator 273 can be small. A deposition method using the facing-target sputtering apparatus can be referred to as VDSP (Vapor Deposition SP, a registered trademark).

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference $E_2 - E_0$ and collide with the target, whereby the sputtered particles are ejected from the target. These sputtered particles are attached on a deposition surface and deposited thereover; as a result, a film is deposited. Some ions recoil by the target and might pass through the deposited film as recoil ions, and be taken into the insulator 275 in contact with the deposition surface. The ions in the plasma are accelerated by a potential difference $E_2 - E_1$ and collide with the deposition surface. At this time, some ions reach the inside of the insulator 275. The ions are taken into the insulator 275 so that a region into which the ions are taken is formed in the insulator 275. That is, an excess oxygen region is formed in the insulator 275 in the case where the ions contain oxygen.

Introduction of oxygen into the insulator 275 can form an excess oxygen region in the insulator 275. The excess oxygen included in the insulator 275 is supplied to the region 234 of the oxide 230 and can compensate for oxygen vacancies in the oxide 230.

For the insulator 275, silicon oxide, silicon oxynitride, silicon nitride oxide, or porous silicon oxide is preferably used. An excess oxygen region is likely to be formed in a material such as silicon oxynitride. In contrast, an excess oxygen region is less likely to be formed in the oxide 230 than in the aforementioned material such as silicon oxynitride even when an oxide film formed by a sputtering method is formed over the oxide 230. Therefore, provision of the insulator 275 including an excess oxygen region in the periphery of the region 234 of the oxide 230 makes it possible to supply oxygen to the region 234 of the oxide 230 effectively.

For the insulator 273, aluminum oxide is preferably used. When heat treatment is performed in a state where aluminum oxide is adjacent to the oxide 230, the aluminum oxide may extract hydrogen in the oxide 230. Note that when the layer 242 is formed between the oxide 230 and the aluminum oxide, hydrogen in the layer 242 is absorbed into the aluminum oxide and the layer 242 with reduced hydrogen may absorb hydrogen in the oxide 230. Thus, hydrogen concentration of the oxide 230 can be lowered.

When the above-described structures or the above-described steps are combined, the resistance of the oxide 230 can be selectively reduced.

In formation of a low-resistance region in the oxide 230, the resistance of the oxide 230 is lowered in a self-aligned manner with use of the conductor 260 functioning as a gate electrode as a mask. Therefore, when the plurality of transistors 200 are formed simultaneously, variations in electrical characteristics of the transistors can be reduced. The channel length of the transistor 200 depends on the width of the conductor 260; the transistor 200 can be miniaturized when the conductor 260 with the minimum feature width is used.

Thus, by appropriately selecting the areas of the regions, a transistor having electrical characteristics appropriate for the circuit design can be easily provided.

An oxide semiconductor can be formed by a sputtering method or the like, and thus can be used for a transistor constituting a highly integrated semiconductor device. A transistor including an oxide semiconductor in a channel formation region has an extremely low leakage current (off-state current) in an non-conducting state; thus, a semiconductor device with low power consumption can be provided.

Accordingly, a semiconductor device including a transistor with a high on-state current can be provided. Alternatively, a semiconductor device including a transistor with a low off-state current can be provided. Alternatively, a semiconductor device that has small variation in electrical characteristics, stable electrical characteristics, and high reliability can be provided.

Next, a detailed configuration of the semiconductor device including the transistor 200 is described.

As illustrated in FIG. 28(A) and FIG. 28(C), the conductor 203 extends in the channel width direction and functions as a wiring for supplying a potential to the conductor 205. The conductor 203 is preferably provided to be embedded in the insulator 212.

The conductor 205 is positioned to overlap with the oxide 230 and the conductor 260. Moreover, the conductor 205 may be provided over and in contact with the conductor 203. Furthermore, the conductor 205 is preferably provided to be embedded in the insulator 214 and the insulator 216.

The conductor 260 sometimes functions as a first gate (also referred to as a top gate) electrode. The conductor 205 may function as a second gate (also referred to as a bottom gate or a back gate) electrode. In that case, the threshold voltage of the transistor 200 can be controlled by changing a potential applied to the conductor 205 independently of a potential applied to the conductor 260. In particular, the threshold voltage of the transistor 200 can be higher than 0 V and the off-state current can be reduced by applying a negative potential to the conductor 205. Thus, a drain current when a potential applied to the conductor 260 is 0 V can be smaller in the case where a negative potential is applied to the conductor 205 than in the case where the negative potential is not applied to the conductor 205.

When the conductor 205 is provided over the conductor 203, the distance between the conductor 203 and the conductor 260 functioning as the first gate electrode and the wiring can be set as appropriate. That is, the insulator 214 and the insulator 216 and the like are provided between the conductor 203 and the conductor 260, whereby a parasitic capacitance between the conductor 203 and the conductor 260 can be reduced, and the withstand voltage between the conductor 203 and the conductor 260 can be increased.

The reduction in the parasitic capacitance between the conductor 203 and the conductor 260 can improve the switching speed of the transistor 200, so that the transistor 200 can have high frequency characteristics. The increase in the withstand voltage between the conductor 203 and the conductor 260 can improve the reliability of the transistor 200. Therefore, the insulator 214 and the insulator 216 are preferably thick. Note that the extending direction of the conductor 203 is not limited thereto; for example, the conductor 203 may extend in the channel length direction of the transistor 200.

The conductor 205 is provided to overlap with the oxide 230 and the conductor 260. The conductor 205 is preferably larger than the region 234 of the oxide 230. As illustrated in FIGS. 28(A) and 28(C), it is preferable that the conductor 205 extend beyond the end portion of the region 234 of the oxide 230 that intersects with the channel width direction. That is, the conductor 205 and the conductor 260 preferably overlap with each other with the insulator positioned therebetween in the side surface of the oxide 230 in the channel width direction.

With the above structure, in the case where potentials are applied to the conductor 260 and the conductor 205, an electric field generated from the conductor 260 and an electric field generated from the conductor 205 are connected, so that the channel formation region in the oxide 230 can be covered.

That is, the channel formation region in the region 234 can be electrically surrounded by the electric field of the conductor 260 functioning as the first gate electrode and the electric field of the conductor 205 functioning as the second gate electrode. In this specification, the transistor structure in which the channel formation region is electrically surrounded by the electric fields of the first gate electrode and the second gate electrode is referred to as a surrounded channel (S-channel) structure.

In the conductor 205, a first conductor is formed in contact with an inner wall of an opening of the insulator 214 and the insulator 216 and a second conductor is formed inside the first conductor. The top surfaces of the first conductor and the second conductor can be substantially level with the top surface of the insulator 216. Although the first conductor of the conductor 205 and the second conductor of the conductor 205 are stacked in the transistor 200, the present invention is not limited thereto. For example, the conductor 205 may have a single-layer structure or a stacked-layer structure of three or more layers.

The first conductor of the conductor 205 or the conductor 203 is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the first conductor of the conductor 205 or the conductor 203 is preferably formed using a conductive material having a function of inhibiting diffusion of oxygen (e.g., at least one of oxygen atoms, oxygen molecules, and the like). Note that in this specification, a function of inhibiting diffusion of impurities or oxygen means a function of inhibiting diffusion of any one or all of the above impurities and the above oxygen.

When the first conductor of the conductor 205 or the conductor 203 has a function of inhibiting diffusion of oxygen, the conductivity of the second conductor of the conductor 205 or the conductor 203 can be prevented from being lowered because of oxidization. As a conductive material having a function of inhibiting diffusion of oxygen, for example, tantalum, tantalum nitride, ruthenium, ruthenium oxide is preferably used. Thus, the first conductor of the conductor 205 or the conductor 203 may be a single layer or a stacked layer of the above conductive materials. Thus, impurities such as water or hydrogen can be inhibited from being diffused into the transistor 200 side through the conductor 203 and the conductor 205.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked layer of any of the above conductive materials and titanium or titanium nitride.

The second conductor of the conductor 203 functions as a wiring and thus is preferably a conductor having higher conductivity than the second conductor of the conductor 205. For example, a conductive material containing copper or aluminum as its main component can be used. The second conductor of the conductor 203 may have a stacked-layer structure, for example, a stacked layer of any of the above conductive materials and titanium or titanium nitride.

It is preferable to use copper for the conductor 203. Copper is preferably used for the wiring and the like because of its low resistance. However, copper is easily diffused; copper may reduce the electrical characteristics of the transistor 200 when diffused into the oxide 230. In view of the above, for example, the insulator 214 is formed using a material such as aluminum oxide or hafnium oxide through which copper is hardly allowed to pass, whereby diffusion of copper can be inhibited.

The conductor 205, the insulator 214, and the insulator 216 are not necessarily provided. In this case, part of the conductor 203 can function as the second gate electrode.

The insulator 210 and the insulator 214 preferably function as a barrier insulating film for inhibiting impurities such as water or hydrogen from entering the transistor 200 from the substrate side. Thus, the insulator 210 and the insulator 214 are preferably formed using an insulating material having a function of inhibiting diffusion of impurities (through which the impurities are unlikely to pass) such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the insulator 210 and the insulator 214 are preferably formed using an insulating material having a function of inhibiting diffusion of oxygen (e.g., at least one of oxygen atoms, oxygen molecules, and the like) (through which oxygen is unlikely to pass).

For example, it is preferable that aluminum oxide or the like be used for the insulator 210 and that silicon nitride or the like be used for the insulator 214. Through this, impurities such as water or hydrogen can be inhibited from being diffused into the transistor 200 side from the substrate side of the insulator 210 and the insulator 214. In addition, oxygen contained in the insulator 224 and the like can be inhibited from being diffused across the insulator 210 and the insulator 214 to the substrate side.

Furthermore, with the structure in which the conductor 205 is stacked over the conductor 203, the insulator 214 can be provided between the conductor 203 and the conductor 205. Here, even when a metal that is easily diffused, such as copper, is used as the second conductor of the conductor 203, silicon nitride or the like provided as the insulator 214 can inhibit diffusion of the metal to a layer positioned above the insulator 214.

The dielectric constant of the insulator 212, the insulator 216, and the insulator 280 functioning as interlayer films is preferably lower than that of the insulator 210 or the insulator 214. When a material with a low dielectric constant is used for an interlayer film, the parasitic capacitance generated between wirings can be reduced.

For example, the insulator 212, the insulator 216, and the insulator 280 can have a single-layer structure or a stacked-layer structure using an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST). In addition, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. A layer of silicon oxide, silicon oxynitride, or silicon nitride may be stacked over the insulators.

The insulator 220, the insulator 222, and the insulator 224 function as a gate insulator.

For the insulator 224 in contact with the oxide 230, an insulator containing more oxygen than that in the stoichiometric composition is preferably used. That is, an excess oxygen region is preferably formed in the insulator 224. When such an insulator containing excess oxygen is provided in contact with the oxide 230, an oxygen vacancy in the oxide 230 can be reduced, whereby the reliability of the transistor 200 can be improved.

As the insulator including an excess oxygen region, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C.

In the case where the insulator 224 includes an excess oxygen region, it is preferable that the insulator 222 have a function of inhibiting diffusion of at least one of oxygen (oxygen atoms, oxygen molecules, and the like) (the oxygen is not likely to pass).

When the insulator 222 has a function of inhibiting diffusion of oxygen, oxygen in the excess oxygen region of the insulator 224 is not diffused into the insulator 220 side and thus can be supplied to the oxide 230 efficiently. Moreover, the conductor 205 can be inhibited from reacting with oxygen in the excess oxygen region of the insulator 224.

The insulator 222 preferably has a single-layer structure or a stacked-layer structure using an insulator containing a so-called high-k material such as aluminum oxide, hafnium oxide, tantalum oxide, zirconium oxide, lead zirconate titanate (PZT), strontium titanate ($SrTiO_3$), or (Ba,Sr)$TiO_3$ (BST), for example. With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

In particular, an insulator containing an oxide of one or both of aluminum and hafnium, which is an insulating material having a function of inhibiting diffusion of impurities, oxygen, and the like (the oxygen is not likely to pass) is preferably used. For the insulator containing an oxide of one or both of aluminum and hafnium, aluminum oxide, hafnium oxide, an oxide containing aluminum and hafnium (hafnium aluminate), or the like is preferably used. The insulator 222 formed from such a material functions as a layer that inhibits release of oxygen from the oxide 230 and entry of impurities such as hydrogen from the periphery of the transistor 200 into the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. A layer of silicon oxide, silicon oxynitride, or silicon nitride may be stacked over the insulator.

It is preferable that the insulator 220 be thermally stable. For example, as silicon oxide and silicon oxynitride have thermal stability, combination of an insulator with a high-k material and the insulator 220 allows the stacked-layer structure to be thermally stable and have a high dielectric constant.

Note that the insulator 220, the insulator 222, and the insulator 224 may each have a stacked-layer structure of two or more layers. In that case, the stacked layers are not necessarily formed from the same material and may be formed from different materials.

The oxide 230 includes the oxide 230a, the oxide 230b over the oxide 230a, and the oxide 230c over the oxide 230b. When the oxide 230a is provided below the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

The oxide 230 preferably has a stacked-layer structure of oxides whose atomic ratio of metal elements is different. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide which can be used as the oxide 230a or the oxide 230b.

The energy of the conduction band minimum of the oxide 230a and the oxide 230c is preferably higher than that of the oxide 230b. In other words, the electron affinity of the oxide 230a and the oxide 230c is preferably smaller than that of the oxide 230b.

The energy level of the conduction band minimum is gradually varied at a junction portion of the oxide 230a, the oxide 230b, and the oxide 230c. In other words, the energy level of the conduction band minimum at a junction portion of each of the oxide 230a, the oxide 230b, and the oxide 230c is continuously varied or continuously connected. To obtain this, the density of defect states in a mixed layer formed at an interface between the oxide 230a and the oxide 230b, and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, when the oxide 230b is an In—Ga—Zn oxide, it is preferable to use an In—Ga—Zn oxide, a Ga—Zn oxide, gallium oxide, or the like as the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current.

When the transistor 200 is brought to be an on state, the region 231a or the region 231b functions as the source region or the drain region. On the other hand, at least part of the region 234 functions as a channel formation region. When the region 232 is provided between the region 231 and the region 234, the transistor 200 can have a high on-state current and a low leakage current (off-state current) in an off state.

When the region 232 is provided in the transistor 200, high-resistance regions are not formed between the region 231 functioning as the source region and the drain region and the region 234 where a channel is formed, so that the on-state current and the mobility of the transistor can be increased. When the first gate electrode (the conductor 260) does not overlap with the source region and the drain region in the channel length direction owing to the region 232, formation of unnecessary capacitance between them can be suppressed. Leakage current in an off state can be reduced owing to the region 232.

Thus, through appropriate selection of the areas of the regions, a transistor having electrical characteristics necessary for a circuit design can be easily provided.

The oxide 230 is preferably formed using a metal oxide functioning as an oxide semiconductor (hereinafter also referred to as an oxide semiconductor). For example, the metal oxide to be the region 234 preferably has a band gap of 2 eV or more, preferably 2.5 eV or more. With the use of a metal oxide having such a wide band gap, the off-state current of the transistor can be reduced.

A transistor including an oxide semiconductor has an extremely low leakage current in an off state; thus, a semiconductor device with low power consumption can be provided. An oxide semiconductor can be formed by a sputtering method or the like, and thus can be used for a transistor constituting a highly integrated semiconductor device.

The insulator 250 can function as a gate insulator. The insulator 250 is preferably positioned in contact with the top surface of the oxide 230c. The insulator 250 is preferably formed using an insulator containing excess oxygen. For example, it is preferable to use an insulator whose amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C.

Specifically, silicon oxide including excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator including excess oxygen is provided in contact with the top surface of the oxide 230c as the insulator 250, oxygen can be effectively supplied from the insulator 250 to the region 234 of the oxide 230b. As in the insulator 224, the concentration of impurities such as water or hydrogen in the insulator 250 is preferably lowered. The thickness of the insulator 250 is preferably greater than or equal to 1 nm and less than or equal to 20 nm.

Furthermore, in order to supply excess oxygen of the insulator 250 to the oxide 230 effectively, the metal oxide 252 may be provided. Therefore, the metal oxide 252 preferably inhibits diffusion of oxygen from the insulator 250. Provision of the metal oxide 252 that inhibits diffusion of oxygen inhibits diffusion of excess oxygen from the insulator 250 to the conductor 260. That is, reduction in the amount of excess oxygen that is supplied to the oxide 230 can be inhibited. Moreover, oxidization of the conductor 260 due to excess oxygen can be suppressed.

Note that the metal oxide 252 may function as part of the first gate. For example, an oxide semiconductor that can be used as the oxide 230 can be used as the metal oxide 252. In this case, when the conductor 260 is formed by a sputtering method, the metal oxide 252 can have a reduced electric resistance to be a conductor. Such a conductor can be referred to as an oxide conductor (OC) electrode.

Note that the metal oxide 252 functions as a part of the gate insulator in some cases. Therefore, when silicon oxide, silicon oxynitride, or the like is used for the insulator 250, a metal oxide that is a high-k material with a high dielectric constant is preferably used as the metal oxide 252. Such a stacked-layer structure can be thermally stable and can have a high dielectric constant. Thus, a gate potential that is applied during operation of the transistor can be reduced while the physical thickness of the gate insulator is kept. In addition, the equivalent oxide thickness (EOT) of an insulator functioning as the gate insulator can be reduced.

The metal oxide 252 in the transistor 200 is shown as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200 can be increased without a reduction in the influence of the electric field generated from the conductor 260. With the metal oxide 252 functioning as a gate insulator, the distance between the conductor 260 and the oxide 230 is kept by the physical thicknesses of the insulator 250 and the metal oxide 252, so that leakage current between the conductor 260 and the oxide 230 can be reduced. Thus, with the stacked-layer structure of the insulator 250 and the metal oxide 252, the physical distance between the conductor 260 and the oxide 230 and the intensity of electric field applied from the conductor 260 to the oxide 230 can be easily adjusted as appropriate.

Specifically, the oxide semiconductor that can be used for the oxide 230 can also be used for the metal oxide 252 when the resistance thereof is reduced. Alternatively, a metal oxide containing one or more of hafnium, aluminum, gallium, yttrium, zirconium, tungsten, titanium, tantalum, nickel, germanium, magnesium, and the like can be used as the metal oxide 252.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Thus, it is preferable as it is less likely to be crystallized by heat treatment in a later step. Note that the metal oxide 252 is not an essential structure. Design is appropriately determined in consideration of required transistor characteristics.

The conductor 260 functioning as the first gate electrode includes the conductor 260a and the conductor 260b over the conductor 260a. Like the first conductor of the conductor 205, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization due to excess oxygen in the insulator 250 and the metal oxide 252. As a conductive material having a function of inhibiting diffusion of oxygen, for example, tantalum, tantalum nitride, ruthenium, ruthenium oxide, or the like is preferably used.

Furthermore, the conductor 260b is preferably formed using a conductive material including tungsten, copper, or aluminum as its main component. The conductor 260 functions as a wiring and thus is preferably a conductor having high conductivity. For example, a conductive material containing tungsten, copper, or aluminum as its main component can be used. The conductor 260b may have a stacked-layer structure, for example, a stacked layer of any of the above conductive materials and titanium or titanium nitride.

In the case where the conductor 205 extends beyond the end portions of the oxide 230 that intersect with the channel width direction as illustrated in FIG. 28(C), the conductor 260 preferably overlaps with the conductor 205 with the insulator 250 positioned therebetween in the region. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that the channel formation region in the oxide 230 can be covered.

That is, the channel formation region in the region 234 can be electrically surrounded by the electric field of the conductor 260 functioning as the first gate electrode and the electric field of the conductor 205 functioning as the second gate electrode.

Furthermore, the insulator 270 functioning as a barrier film may be positioned over the conductor 260b. The insulator 270 is preferably formed using an insulating material having a function of inhibiting the passage of oxygen and impurities such as water or hydrogen. For example, aluminum oxide or hafnium oxide is preferably used. Thus, oxidization of the conductor 260 due to oxygen from above the insulator 270 can be inhibited. Moreover, entry of impurities such as water or hydrogen from above the insulator 270 into the oxide 230 through the conductor 260 and the insulator 250 can be inhibited.

Furthermore, the insulator 271 functioning as a hard mask is preferably positioned over the insulator 270. By providing the insulator 271, the conductor 260 can be processed to have the side surface that is substantially perpendicular; specifically, an angle formed by the side surface of the conductor 260 and a surface of the substrate can be greater than or equal to 75° and less than or equal to 100°, preferably greater than or equal to 80° and less than or equal to 95°. When the conductor 260 is processed into such a shape, the insulator 275 that is subsequently formed can be formed into a desired shape.

The insulator 271 may be formed using an insulating material having a function of inhibiting the passage of oxygen and impurities such as water or hydrogen so that the insulator 271 also functions as a barrier film. In this case, the insulator 270 is not necessarily provided.

The insulator 275 functioning as a buffer layer is provided in contact with the side surface of the oxide 230c, the side surface of the insulator 250, the side surface of the metal oxide 252, the side surface of the conductor 260, and the side surface of the insulator 270.

For example, the insulator 275 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess oxygen region can be formed easily in a later step, are preferable.

The insulator 275 preferably includes an excess oxygen region. When an insulator from which oxygen is released by heating is provided in contact with the oxide 230c and the insulator 250 as the insulator 275, oxygen can be effectively supplied from the insulator 250 to the region 234 of the oxide 230b. The concentration of impurities such as water or hydrogen in the film of the insulator 275 is preferably lowered.

The insulator 273 is provided at least over the region 231 of the oxide 230 and over the insulator 275. When the insulator 273 is formed by a sputtering method, the insulator 275 can include an excess oxygen region. Therefore, oxygen can be supplied from the excess oxygen region to the oxide 230. By providing the insulator 273 over the region 231 of the oxide 230, hydrogen in the oxide 230 can be extracted to the insulator 273.

For example, a metal oxide containing one or more of hafnium, aluminum, gallium, yttrium, zirconium, tungsten, titanium, tantalum, nickel, germanium, magnesium, and the like can be used as the insulator 273.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen.

The insulator 280 functioning as an interlayer film is preferably provided over the insulator 274. As in the insulator 224 or the like, the concentration of impurities such as water or hydrogen in the film of the insulator 280 is preferably lowered.

The conductor 240a is in contact with the region 231a functioning as one of a source region and a drain region of the transistor 200, and the conductor 240b is in contact with the region 231b functioning as the other of the source region and the drain region of the transistor 200. Thus, the conductor 240a can function as one of the source electrode and the drain electrode, and the conductor 240b can function as the other of the source electrode and the drain electrode.

As illustrated in FIG. 28(D), the conductor 240b preferably overlaps with the side surface of the oxide 230. The same applies to the conductor 240a. It is particularly preferable that the conductor 240a and the conductor 240b overlap with one or both of the side surface of the oxide 230 on the A5 side and the side surface of the oxide 230 on the A6 side, which intersect with the channel width direction of the oxide 230. Alternatively, the conductor 240a and the conductor 240b may overlap with the side surface of the oxide 230 on the A1 side (the A2 side), which intersects with the channel length direction of the oxide 230. Thus, with the structure in which the conductor 240a and the conductor 240b overlap with the region 231 to be the source region or the drain region and the side surface of the oxide 230, the contact area of a contact portion between the conductor 240a and the transistor 200 and the conductor 240b and the transistor 200 can be increased without increasing the projected area of the contact portion, so that the contact resistance between the conductor 240a and the transistor 200 and the conductor 240b and the transistor 200 can be reduced. Thus, miniaturization of the source electrode and the drain electrode of the transistor can be achieved and, in addition, the on-state current can be increased.

The conductor 240a and the conductor 240b are each preferably formed using a conductive material containing tungsten, copper, or aluminum as its main component. The conductor 240a and the conductor 240b may have a stacked-layer structure.

When an opening is formed in the insulator 280, the insulator 274, and the insulator 273, for example, the low-resistance region in the region 231 of the oxide 230 is removed and the oxide 230 whose resistance is not lowered is exposed in some cases. In this case, a conductor used for a conductor of the conductor 240 in contact with the oxide 230 (hereinafter also referred to as a first conductor of the conductor 240) may be formed using a metal film, a nitride film containing a metal element, or an oxide film containing a metal element. When the oxide 230 with the resistance not lowered is in contact with the first conductor of the conductor 240, an oxygen vacancy is formed in the metal compound or the oxide 230, whereby the resistance of the region 231 of the oxide 230 is reduced. The reduction in the resistance of the oxide 230 that is in contact with the first conductor of the conductor 240 can reduce contact resistance between the oxide 230 and the conductor 240. Therefore, the first conductor of the conductor 240 preferably contains a metal element such as aluminum, ruthenium, titanium, tantalum, or tungsten.

In the case where the conductor 240 has a stacked-layer structure, a conductive material having a function of inhibiting the passage of impurities such as water or hydrogen is preferably used for a conductor in contact with the insulator 280, the insulator 274, and the insulator 273, as the first conductor of the conductor 205, for example. For example, tantalum, tantalum nitride, titanium, titanium nitride, ruthenium, ruthenium oxide, or the like is preferably used. The conductive material having a function of inhibiting the passage of impurities such as water or hydrogen may have a single-layer structure or a stacked-layer structure. With use of the conductive material, impurities such as water or hydrogen can be inhibited from entering the oxide 230 through the conductor 240a and the conductor 240b from a layer above the insulator 280.

Although not illustrated, a conductor functioning as a wiring may be provided in contact with the top surfaces of the conductor 240a and the conductor 240b. The conductor functioning as a wiring is preferably formed using a conductive material containing tungsten, copper, or aluminum as its main component. The conductor may have a stacked-layer structure, for example, a stacked layer of any of the above conductive materials and titanium or titanium nitride. Note that as the conductor 203 or the like, the conductor may be formed to be embedded in an opening provided in an insulator.

<Material Constituting Semiconductor Device>

Materials that can be used for a semiconductor device including the transistor 200 are described below.

[Substrate]

As a substrate over which a semiconductor device is formed, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is given, for example. As the semiconductor substrate, a semiconductor substrate of silicon, germanium, or the like or a compound semiconductor substrate containing silicon carbide, silicon germanium, gallium arsenide, indium phosphide, zinc oxide, or gallium oxide as a material is given, for example. In addition, a semiconductor substrate in which an insulator region is included in the above semiconductor substrate, for example, an SOI (Silicon On Insulator) substrate or the like is given. As the conductor substrate, a graphite substrate, a metal substrate, an alloy substrate, a conductive resin substrate, or the like is given. A substrate including a metal nitride, a substrate including a metal oxide, or the like is given. Furthermore, an insulator substrate provided with a conductor or a semiconductor, a semiconductor substrate provided with a conductor or an insulator, a conductor substrate provided with a semiconductor or an insulator, or the like is given. Alternatively, any of these substrates provided with an element may be used. As the element provided over the substrate, a capacitor, a resistor, a switching element, a light-emitting element, a memory element, or the like is given.

A flexible substrate may be used as the substrate. Note that as a method for providing a transistor over a flexible substrate, there is also a method in which a transistor is formed over a non-flexible substrate and then is separated from the non-flexible substrate and transferred to the substrate that is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate due to dropping or the like can be reduced. That is, a durable semiconductor device can be provided.

As the substrate that is a flexible substrate, for example, a metal, an alloy, a resin, glass, or fiber thereof can be used. Note that as the substrate, a sheet, a film, a foil, or the like that contains a fiber may be used. The substrate that is a flexible substrate preferably has a lower coefficient of linear expansion because deformation due to an environment is suppressed. As the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, or the like), polyimide, polycarbonate, and acrylic resin. In particular, aramid is suitable for the substrate that is a flexible substrate because of its low coefficient of linear expansion.

[Insulator]

An insulating oxide, an insulating nitride, an insulating oxynitride, an insulating nitride oxide, an insulating metal oxide, an insulating metal oxynitride, and an insulating metal nitride oxide are given as an insulator.

With miniaturization and high integration of a transistor, for example, a problem of leakage current or the like may arise because a gate insulator becomes thin. When a high-k material is used for the insulator functioning as a gate insulator, the voltage when the transistor is operated can be reduced while the physical thickness of the gate insulator is kept. By contrast, when a material having a low dielectric constant is used for the insulator functioning as an interlayer film, the parasitic capacitance generated between wirings can be reduced. Thus, a material is preferably selected depending on the function of an insulator.

As an insulator having a high dielectric constant, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As an insulator having low dielectric constant, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low dielectric constant can be obtained by combining silicon oxide or silicon oxynitride with a resin, for example. Examples of the resin include polyester, polyolefin, polyamide (e.g., nylon or aramid), polyimide, polycarbonate, and acrylic resin. A stacked-layer structure which is thermally stable and has a high dielectric constant can be obtained by combining silicon oxide and silicon oxynitride with an insulator having high dielectric constant.

The transistor using an oxide semiconductor is surrounded by an insulator which has a function of suppressing the passage of oxygen and impurities such as hydrogen, whereby the electrical characteristics of the transistor can be stable.

As an insulator which has a function of suppressing the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of suppressing the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one kind or two or more selected from hafnium, aluminum, gallium, yttrium, zirconium, tungsten, titanium, tantalum, nickel, germanium, magnesium, and the like can be used as the insulator 273.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have a high barrier property. Therefore, the amount of added hydrogen and nitrogen can be adjusted appropriately by adjusting the thickness of hafnium oxide.

For example, the insulator 224 and the insulator 250 functioning as part of the gate insulator are each preferably an insulator including an excess oxygen region. When a structure in which silicon oxide or silicon oxynitride including an excess oxygen region is in contact with the oxide 230 is employed, oxygen vacancies in the oxide 230 can be compensated for.

An insulator containing an oxide of one kind or a plurality of kinds of aluminum, hafnium, and gallium can be used for the insulator 222 functioning as part of the gate insulator, for example. In particular, it is preferable to use aluminum oxide, hafnium oxide, an oxide containing aluminum and hafnium (hafnium aluminate), or the like as an insulator containing an oxide of one or both of aluminum and hafnium.

For the insulator 220, silicon oxide or silicon oxynitride, which is thermally stable, is preferably formed, for example. When the gate insulator has a stacked-layer structure of a thermally stable film and a film with a high dielectric constant, the equivalent oxide thickness (EOT) of the gate insulator can be reduced while the physical thickness of the gate insulator is kept.

With the above stacked-layer structure, on-state current can be increased without reduction in the influence of the electric field applied from the gate electrode. Since the distance between the gate electrode and the channel formation region is kept by the physical thickness of the gate insulator, leakage current between the gate electrode and the channel formation region can be inhibited.

The insulator 212, the insulator 216, the insulator 271, the insulator 275, and the insulator 280 preferably include an insulator with a low dielectric constant. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (e.g., nylon or aramid), polyimide, polycarbonate, and acrylic resin.

As the insulator 210, the insulator 214, the insulator 270, and the insulator 273, an insulator having a function of inhibiting the passage of oxygen and impurities such as hydrogen may be used. For the insulator 270 and the insulator 273, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

[Conductor]

As a conductor, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon including an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

When an oxide is used for the channel formation region of the transistor, a stacked-layer structure obtained by combining a material containing any of the above-described metal elements and a conductive material containing oxygen is preferably used for the conductor functioning as the gate electrode. In this case, the conductive material containing oxygen is preferably formed on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be captured in some cases. Alternatively, hydrogen entering from an external insulator or the like can be captured in some cases.

As the conductor 260, the conductor 203, the conductor 205, and the conductor 240, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon including an impurity element such as phosphorus, or silicide such as nickel silicide may be used.

[Metal Oxide]

As the metal oxide 230, a metal oxide functioning as an oxide semiconductor (hereinafter, referred to as an oxide semiconductor) is preferably used. A metal oxide that can be used for the oxide 230 of one embodiment of the present invention will be described below.

The metal oxide preferably contains at least indium or zinc. In particular, indium and zinc are preferably contained. Aluminum, gallium, yttrium, tin, or the like is preferably contained in addition to them. One kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is In-M-Zn oxide, which contains indium, an element M, and zinc, is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium, and the like. Note that a plurality of the above-described elements is combined as the element M in some cases.

In this specification and the like, a metal oxide containing nitrogen is also referred to as a metal oxide in some cases. Moreover, a metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

In this specification and the like, CAAC (c-axis aligned crystal) and CAC (Cloud-Aligned Composite) is sometimes stated. Note that CAAC refers to an example of a crystal structure, and CAC refers to an example of a function or a material composition.

A CAC-OS or a CAC-metal oxide has a conducting function in part of the material and an insulating function in part of the material, and has a function of a semiconductor as the whole material. Note that in the case where the CAC-OS or the CAC-metal oxide is used in an active layer of a transistor, the conducting function is a function that allows electrons serving as carriers (or holes) to flow, and the insulating function is a function that does not allow electrons serving as carriers to flow. By the complementary action of the conducting function and the insulating function, a switching function (on/off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. When carriers flow in this composition, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be called a matrix composite or a metal matrix composite.

[Structure of Metal Oxide]

Oxide semiconductors (metal oxides) are classified into a single-crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has a c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

Although the shape of the nanocrystal is basically a hexagon, the shape is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) is difficult to be observed even in the vicinity of a distortion in the CAAC-OS. That is, formation of a grain boundary is inhibited due to the distortion of lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer.

Furthermore, when indium of the In layer is replaced with the element M, the layer can also be referred to as an (In, M) layer.

The CAAC-OS is a metal oxide with high crystallinity. On the other hand, a clear crystal grain boundary is difficult to be observed in the CAAC-OS; thus, a reduction in electron mobility due to the crystal grain boundary is less likely to be caused. Furthermore, entry of impurities, formation of defects, or the like might decrease the crystallinity of a metal oxide; thus it can also be said that the CAAC-OS is a metal oxide having small amounts of impurities and defects (e.g., oxygen vacancies). Thus, a metal oxide including the CAAC-OS is physically stable. Therefore, a metal oxide including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation of the whole film is not observed. Accordingly, the nc-OS cannot be distinguished from an a-like OS or an amorphous oxide semiconductor by some analysis methods in some cases.

The a-like OS is a metal oxide having a structure between that of the nc-OS and that of the amorphous oxide semiconductor. The a-like OS contains a void or a low-density region. That is, the a-like OS has low crystallinity as compared with the nc-OS and the CAAC-OS.

An oxide semiconductor (metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Metal Oxide>

Next, the case where the metal oxide is used for a channel formation region of a transistor will be described.

When the metal oxide is used for a channel formation region of a transistor, the transistor can have high field-effect mobility. In addition, the transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charge trapped by the trap states in the metal oxide takes a long time to be released and behaves like fixed charge in some cases. Thus, a transistor having a metal oxide with high density of trap states in a channel formation region has unstable electrical characteristics in some cases.

Thus, it is effective to reduce the concentration of impurities in the metal oxide to make the electrical characteristics of the transistor stable. In addition, in order to reduce the concentration of impurities in the metal oxide, the concentration of impurities in an adjacent film is also preferably reduced. As an impurity, hydrogen, nitrogen, an alkali metal, an alkaline earth metal, iron, nickel, and silicon can be given.

[Impurities]

Here, the influence of each impurity in the metal oxide will be described.

When silicon or carbon that is one of the Group 14 elements is contained in the metal oxide, defect states are formed in the metal oxide. Thus, the concentration of silicon or carbon in the metal oxide and the concentration of silicon or carbon around an interface with the metal oxide (the concentration measured by secondary ion mass spectrometry (SIMS)) is set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using, in a channel formation region, a metal oxide containing an alkali metal or alkaline earth metal is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide measured by SIMS is set to be lower than or equal to $1\times10^{18}$ atoms/cm$^3$, preferably lower than or equal to $2\times10^{16}$ atoms/cm$^3$.

Furthermore, when the metal oxide contains nitrogen, the metal oxide easily becomes n-type because of generation of electrons serving as carriers and an increase in carrier density. As a result, a transistor in which a metal oxide containing nitrogen is used in a channel formation region is likely to have normally-on characteristics. Thus, nitrogen in the channel formation region in the metal oxide is preferably reduced as much as possible. For example, the concentration of nitrogen in the metal oxide, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atom/cm$^3$, still further preferably lower than or equal to $5\times10^{17}$ atoms/cm$^3$.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using, in a channel formation region, a metal oxide that includes hydrogen is likely to have normally-on characteristics. Therefore, hydrogen in the metal oxide is preferably reduced as much as possible. Specifically, the hydrogen concentration of the metal oxide, which is measured by SIMS, is set to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide whose impurities are sufficiently reduced is used for a channel formation region in a transistor, stable electrical characteristics can be provided.

This embodiment can be implemented in an appropriate combination with any of the configurations described in the other embodiments and the like.

Embodiment 4

In this embodiment, examples in which the semiconductor device, the memory device and the like described in the above embodiment are used in an electronic component and examples in which the semiconductor device, the memory device, and the like described in the above embodiment are used in an electronic device including the electronic component are described with reference to FIG. 30 and FIG. 31.

<Electronic Component>

First, an example in which the semiconductor device, the memory device, and the like described in the above embodiment are used in an electronic component is described with reference to FIG. 30(A). Note that an electronic component is also referred to as a semiconductor package or an IC package. Various standards and names corresponding to a terminal extraction direction and a terminal shape are given to the electronic components. Thus, examples of the electronic component are described in this embodiment.

An electronic component is completed by integrating detachable components on a printed circuit board through an assembly process (post-process).

Figure 30A:
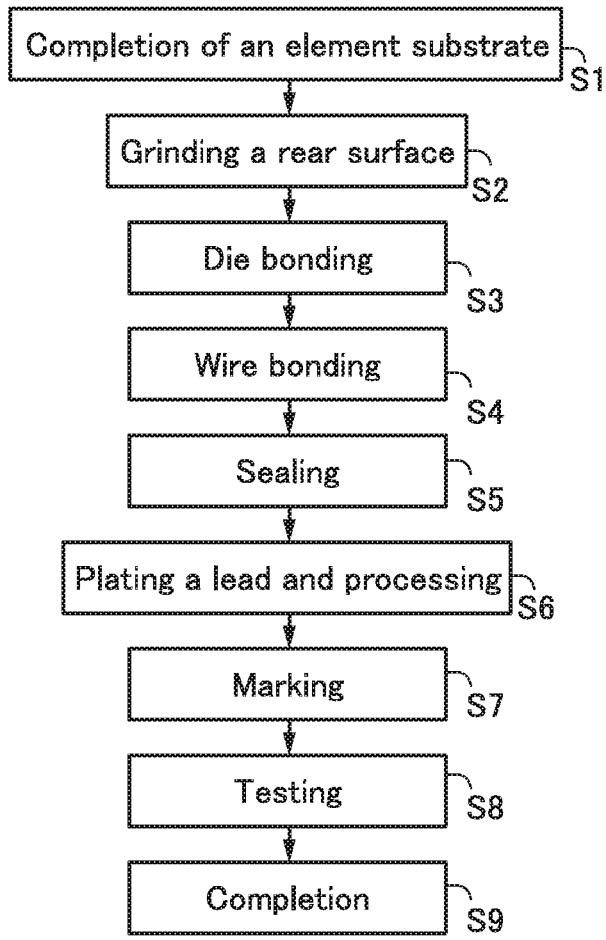
FIG. 30 A flow chart and a perspective view illustrating an electronic component.

The post-process can be completed through steps shown in FIG. 30(A). Specifically, after an element substrate including, for example, a semiconductor device and/or a memory device obtained in the pre-process is completed (Step S1), a rear surface of the substrate is ground (Step S2). The substrate is thinned in this step to reduce warpage or the like of the substrate caused in the pre-process and to reduce the size of the component itself.

After the rear surface of the substrate is ground, a dicing step is performed to divide the substrate into a plurality of chips. Then, a "die bonding step" is performed in which the divided chips are picked up separately, mounted and bonded to a lead frame (Step S3). To bond chips with a lead frame in the die bonding step, a method such as bonding with resin or bonding with a tape is selected as appropriate depending on products. Note that in the die bonding process, chips may be mounted on and bonded to an interposer.

Note that in this embodiment, when an element is formed on one surface of a substrate, the one surface of the substrate is referred to as a front surface and the other surface of the substrate (a surface on which the element is not formed) is referred to as a rear surface.

Next, a "wire bonding step" is performed to electrically connect a lead of the lead frame and an electrode on the chip through a metal fine line (wire) (Step S4). A silver line or a gold line can be used as the metal fine line. Furthermore, ball bonding or wedge bonding can be used as the wire bonding.

A wire-bonded chip is subjected to a "molding step" of sealing with epoxy resin or the like (Step S5). By the molding step, the inside of the electronic component is filled with resin, thereby reducing damage to the circuit portion and the wire embedded in the electronic component caused by external mechanical force as well as reducing deterioration of characteristics due to moisture or dust.

Next, a lead of the lead frame is subjected to plating process. Then, the lead is cut and processed into a shape (Step S6). With the plating process, corrosion of the lead can be prevented, and soldering for mounting the electronic component on a printed circuit board later can be performed with more certainty.

Next, a "marking step" in which printing (marking) is performed on a surface of the package is conducted (Step S7). After a final testing step (Step S8), the electronic component is completed (Step S9).

The aforementioned electronic component includes such as the semiconductor device and/or the memory device described in the above embodiments. Thus, a highly reliable electronic component can be obtained. Moreover, an electronic component with large storage capacitance per unit area can be obtained. Therefore, a smaller and lighter electronic component can be obtained with the same storage capacitance.

Figure 30B:
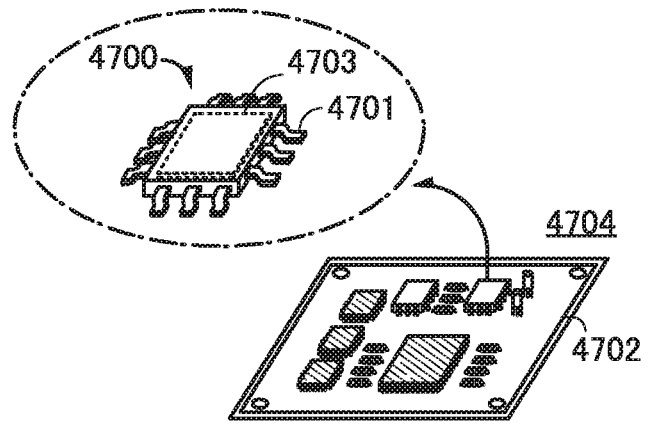

FIG. 30(B) is a schematic perspective view of the completed electronic component. FIG. 30(B) shows a schematic perspective view of a QFP (Quad Flat Package) as an example of the electronic component. An electronic component 4700 in FIG. 30(B) includes a lead 4701 and a circuit portion 4703. The electronic component 4700 in FIG. 30(B) is mounted on a printed circuit board 4702, for example. A plurality of electronic components 4700 that are combined and electrically connected to each other over the printed board 4702 can be equipped in an electronic device. A completed circuit board 4704 is provided inside an electronic device or the like.

<Electronic Device>

Next, electronic devices including the aforementioned electronic component are described.

With one embodiment of the present invention, an electronic device with large-storage capacitance per area can be obtained. Therefore, a smaller and lighter electronic component can be obtained with the same storage capacitance.

A semiconductor device of one embodiment of the present invention can be used for a display device, a personal computer, or an image reproducing device provided with recording media (typically, devices that reproduce the content of recording media such as digital versatile discs (DVDs) and have displays for displaying the reproduced images). Other examples of electronic devices that the semiconductor device of one embodiment of the present invention can be used are mobile phones, game consoles including portable game consoles, portable information terminals, e-book readers, video cameras, cameras such as digital still cameras, goggle-type displays (head mounted displays), navigation systems, audio reproducing devices (e.g., car audio units and digital audio players), copiers, facsimiles, printers, multifunction printers, automated teller machines (ATM), vending machines, and medical devices. Specific examples of these electronic devices are illustrated in FIG. 31.

Figure 31A:
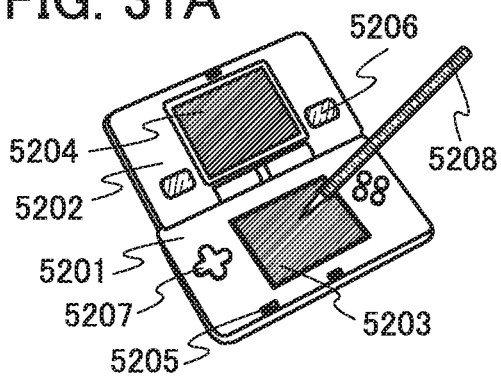
FIG. 31 Drawings illustrating electronic devices.

FIG. 31(A) illustrates the portable game console including a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits of a portable game console. Note that although the portable game console illustrated in FIG. 31(A) has the two display portions 5203 and 5204, the number of display portions included in the portable game console is not limited thereto.

Figure 31B:
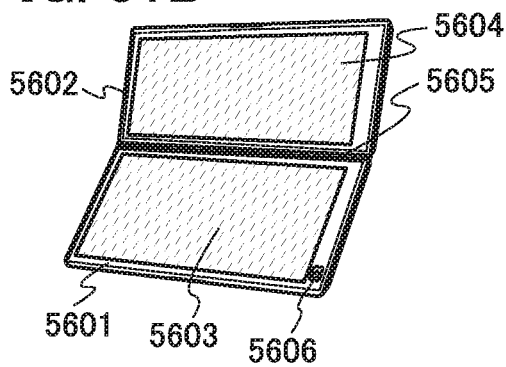

FIG. 31(B) illustrates the portable information terminal includes a first housing 5601, a second housing 5602, a first display portion 5603, a second display portion 5604, a joint 5605, an operation key 5606, and the like. The semiconductor device of one embodiment of the present invention can be used for a variety of integrated circuits of a portable information terminal. The first display portion 5603 is provided in the first housing 5601, and the second display portion 5604 is provided in the second housing 5602. Furthermore, the first housing 5601 and the second housing 5602 are connected to each other with the joint 5605, and the angle between the first housing 5601 and the second housing 5602 can be changed with the joint 5605. Images on the first display portion 5603 may be changed in accordance with the angle at the joint 5605 between the first housing 5601 and the second housing 5602. Moreover, a display device to which a function of a position input device is added may be used as at least one of the first display portion 5603 and the second display portion 5604. Note that the function of the position input device can be added through providing a touch panel to a display device. Alternatively, the function of the position input device can be added through providing a photoelectric conversion element called a photosensor in a pixel portion of a display device.

Figure 31C:
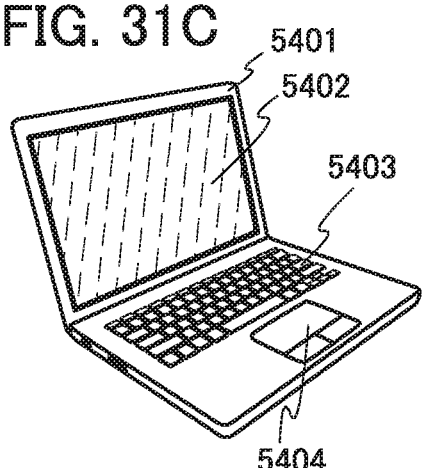

FIG. 31(C) illustrates a laptop personal computer including a housing 5401, a display portion 5402, a keyboard 5403, a pointing device 5404, and the like. The semiconductor device of one embodiment of the present invention can be used for a variety of integrated circuits of the laptop personal computer.

Figure 31D:
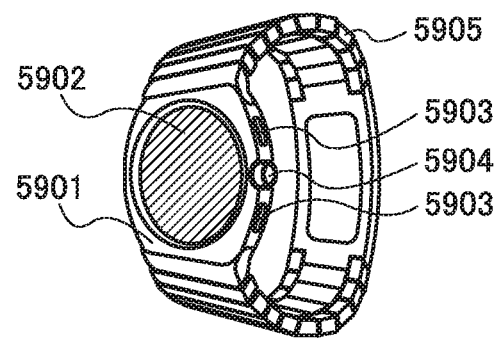

FIG. 31(D) illustrates a smart watch, which is one kind of wearable terminals, including a housing 5901, a display portion 5902, operation buttons 5903, an operator 5904, a band 5905, and the like. The semiconductor device of one embodiment of the present invention can be used for a variety of integrated circuits of a smart watch. A display device to which the function of the position input device may be used for the display portion 5902. The function of the position input device can be added through providing a touch panel to a display device. Alternatively, the function of the position input device can be added through providing a photoelectric conversion element called a photosensor in a pixel portion of a display device. As the operation buttons 5903, any of a power switch for activating the smart watch, a button for operating an application of the smart watch, a volume control button, a switch for turning on or off the display portion 5902, and the like can be provided. Although the number of the operation buttons 5903 is two in the smart watch in FIG. 31(D), the number of the operation buttons included in the smart watch is not limited thereto. The operator 5904 functions as a crown used for setting the time on the smart watch. The operator 5904 may be used as an input interface for operating an application of the smart watch as well as the crown for time adjustment. The smart watch illustrated in FIG. 31(D) includes the operator 5904; however, without being limited thereto, the smart watch does not necessarily include the operator 5904.

Figure 31E:
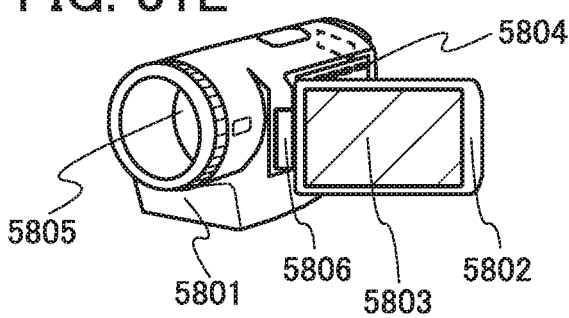

FIG. 31(E) illustrates the video camera including a first housing 5801, a second housing 5802, a display portion 5803, operation keys 5804, a lens 5805, a joint 5806, and the like. The semiconductor device of one embodiment of the present invention can be used for a variety of integrated circuits of a video camera. The operation keys 5804 and the lens 5805 are provided in the first housing 5801, and the display portion 5803 is provided in the second housing 5802. Furthermore, the first housing 5801 and the second housing 5802 are connected to each other with the joint 5806, and the angle between the first housing 5801 and the second housing 5802 can be changed with the joint 5806. Images on the display portion 5803 may be changed in accordance with the angle at the joint 5806 between the first housing 5801 and the second housing 5802.

Figure 31F:
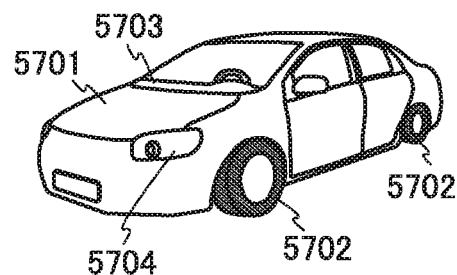

FIG. 31(F) illustrates a passenger car including a car body 5701, wheels 5702, a dashboard 5703, lights 5704, and the like. The semiconductor device of one embodiment of the present invention can be used for a variety of integrated circuits of a car.

Figure 31G:
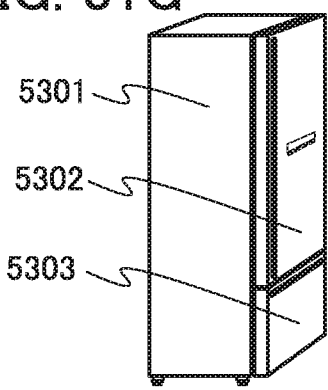

FIG. 31(G) illustrates an electric refrigerator-freezer including a housing 5301, a refrigerator door 5302, a freezer door 5303, and the like. The semiconductor device of one embodiment of the present invention can be used for a variety of integrated circuits of an electric refrigerator-freezer.

Figure 31H:
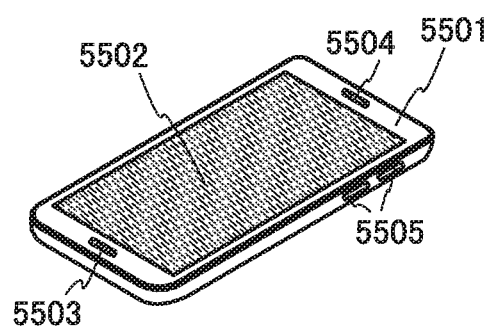

FIG. 31(H) illustrates the mobile phone having a function of an information terminal including a housing 5501, a display portion 5502, a microphone 5503, a speaker 5504, and operation buttons 5505. The semiconductor device of one embodiment of the present invention can be used for a variety of integrated circuits of a portable information terminal. A display device with a function of the position input device may be used for the display portion 5502. Note that a function of the position input device can be added through providing a touch panel in a display device. Alternatively, a function of the position input device can be added through providing a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided. Although the number of the operation buttons 5505 is two in the mobile phone in FIG. 31(H), the number of the operation buttons included in the mobile phone is not limited thereto. Although not illustrated, the mobile phone illustrated in FIG. 31(H) may include a camera. Although not illustrated, the mobile phone illustrated in FIG. 31(H) may include a light-emitting device used for a flashlight or a lighting purpose. Although not illustrated, the mobile phone in FIG. 31(H) may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, infrared rays, or the like) in the housing 5501. In particular, the direction of the mobile phone (the direction of the mobile phone with respect to the vertical direction) shown in FIG. 31(H) is detected through providing a sensing device which includes a sensor for sensing inclinations, such as a gyroscope sensor or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes transistors, for example. As the transistors, any of the transistors described in the other embodiments can be used, for example.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (a registered trademark), an interferometric modulation (IMOD) element, a MEMS shutter display element, an optical-interference-type MEMS display element, or a piezoelectric ceramic display), quantum dots, and the like. Other than the above, the display element, the display device, the light-emitting element, or the light-emitting device may include a display media whose contrast, luminance, reflectivity, transmittance, or the like changes by electrical or magnetic effect. An example of a display device having EL elements includes an EL display. Examples of a display device including an electron emitter include a field emission display (FED), an SED-type flat panel display (SED: Surface-conduction Electron-emitter Display), and the like. Examples of a display device using a liquid crystal element include a liquid crystal display (a transmissive liquid crystal display, a transflective liquid crystal display, a reflective liquid crystal display, a direct-view liquid crystal display, or a projection liquid crystal display). Examples of display devices using electronic ink, electronic liquid powder (a registered trademark), or electrophoretic elements include electronic paper and the like. Examples of display devices containing quantum dots in each pixel include a quantum dot display. Note that quantum dots may be provided not as display elements but as part of a backlight. The use of quantum dots enables display with high color purity. Note that in the case of achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as SRAM can be provided under the reflective electrodes. Thus, the power consumption can be further reduced. Note that in the case where an LED chip is used, graphene or graphite may be provided under an electrode or a nitride semiconductor of the LED chip. Graphene or graphite may be a multilayer film in which a plurality of layers are stacked. Providing graphene or graphite in the above manner facilitates formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between graphene or graphite and the n-type GaN semiconductor layer including crystals. The GaN semiconductor layers included in the LED chip may be formed by MOCVD. Note that when graphene is provided, the GaN semiconductor layers included in the LED chip can also be formed by a sputtering method. In the case of a display element including microelectromechanical systems (MEMS), a drying agent may be provided in a space where the display element is sealed (e.g., between an element substrate over which the display element is placed and a counter substrate provided opposite to the element substrate). Providing a drying agent can prevent MEMS and the like from becoming difficult to move or deteriorating easily because of moisture.

This embodiment can be implemented in an appropriate combination with any of the configurations described in the other embodiments and the like.

REFERENCE NUMERALS

100: Memory device; 101: Memory portion; 102: Driver circuit portion; 103: Driver circuit portion; 104: Driver circuit portion; 105: Driver circuit portion; 111: Memory element; 112: Transistor; 113: Transistor; 114: Transistor; 115: Capacitor; 116; Transistor

The invention claimed is:

1. A memory device comprising:
a driver circuit; and
a memory element, the memory element comprising:
    a first transistor;
    a second transistor;
    a third transistor; and
    a capacitor,
wherein a gate of the first transistor is electrically connected to a first wiring,
wherein a back gate of the first transistor is electrically connected to a second wiring,
wherein one of a source and a drain of the first transistor is electrically connected to the second wiring,
wherein the other of the source and the drain of the first transistor is electrically connected to one electrode of the capacitor,
wherein the other electrode of the capacitor is electrically connected to a third wiring,
wherein a gate of the second transistor is electrically connected to the one electrode of the capacitor,
wherein a back gate of the second transistor is electrically connected to a fourth wiring,
wherein one of a source and a drain of the second transistor is electrically connected to the fourth wiring,
wherein the other of the source and the drain of the second transistor is electrically connected to one of a source and a drain of the third transistor,
wherein the other of the source and the drain of the third transistor is electrically connected to a fifth wiring, and
wherein a gate of the third transistor is electrically connected to a sixth wiring.

2. The semiconductor device according to claim 1, wherein a semiconductor layer of the first transistor includes oxide semiconductor.

3. The memory device according to claim 1, wherein the semiconductor device and the driver circuit overlap with each other.

4. The memory device according to claim 1, wherein the memory element has a function of storing multi-level data.

5. A memory device comprising:
a driver circuit; and
a memory element, the memory element comprising:
    a first transistor;
    a second transistor;
    a third transistor; and
    a capacitor,
wherein a gate of the first transistor is electrically connected to a first wiring,
wherein a back gate of the first transistor is electrically connected to a second wiring,
wherein one of a source and a drain of the first transistor is electrically connected to the second wiring,
wherein the other of the source and the drain of the first transistor is electrically connected to one electrode of the capacitor,
wherein the other electrode of the capacitor is electrically connected to a third wiring,
wherein a gate of the second transistor is electrically connected to the one electrode of the capacitor,
wherein a back gate of the second transistor is electrically connected to a fourth wiring, wherein one of a source and a drain of the second transistor is electrically connected to the fourth wiring,
wherein the other of the source and the drain of the second transistor is electrically connected to one of a source and a drain of the third transistor,
wherein the other of the source and the drain of the third transistor is electrically connected to a fifth wiring,
wherein a gate of the third transistor is electrically connected to a sixth wiring, and
wherein the gate of the third transistor is electrically connected to a back gate of the third transistor.

6. The semiconductor device according to claim 5,
wherein a semiconductor layer of the first transistor includes oxide semiconductor.

7. The memory device according to claim 5,
wherein the semiconductor device and the driver circuit overlap with each other.

8. The memory device according to claim 5,
wherein the memory element has a function of storing multi-level data.

9. A memory device comprising:
a driver circuit; and
a memory element, the memory element comprising:
a first transistor;
a second transistor;
a third transistor; and
a capacitor,
wherein a gate of the first transistor is electrically connected to a first wiring,
wherein a back gate of the first transistor is electrically connected to a second wiring,
wherein one of a source and a drain of the first transistor is electrically connected to the second wiring,
wherein the other of the source and the drain of the first transistor is electrically connected to one electrode of the capacitor,
wherein the other electrode of the capacitor is electrically connected to a third wiring,
wherein a gate of the second transistor is electrically connected to the one electrode of the capacitor,
wherein a back gate of the second transistor is electrically connected to a fourth wiring,
wherein one of a source and a drain of the second transistor is electrically connected to the fourth wiring,
wherein the other of the source and the drain of the second transistor is electrically connected to one of a source and a drain of the third transistor,
wherein the other of the source and the drain of the third transistor is electrically connected to a fifth wiring,
wherein a gate of the third transistor is electrically connected to a sixth wiring, and
wherein a semiconductor layer of the first transistor comprises indium and zinc.

10. The memory device according to claim 9,
wherein the semiconductor device and the driver circuit overlap with each other.

* * * * *